United States Patent [19]
Legault et al.

[11] Patent Number: 5,882,720
[45] Date of Patent: Mar. 16, 1999

[54] MONITORING DEPOSITED PADS

[75] Inventors: Marc A. Legault, Johnston; Richard F. Amaral, Harrisville, both of R.I.

[73] Assignee: MPM Corporation, Franklin, Mass.

[21] Appl. No.: 908,770

[22] Filed: Aug. 8, 1997

Related U.S. Application Data

[63] Continuation of Ser. No. 595,485, Feb. 1, 1996, abandoned.

[51] Int. Cl.$^6$ ....................................................... B05B 5/12
[52] U.S. Cl. ............................... 427/8; 356/237; 356/376; 427/10; 427/96; 228/8; 228/102; 228/105
[58] Field of Search ................................ 228/8, 102, 105, 228/248.1; 356/237, 376; 427/8, 10, 96

[56] References Cited

U.S. PATENT DOCUMENTS

| | | | |
|---|---|---|---|
| 4,688,939 | 8/1987 | Ray | ......................................... 356/237 |
| 5,495,337 | 2/1996 | Goshorn et al. | ..................... 356/237 X |
| 5,509,597 | 4/1996 | Lafuriore | ......................... 228/248.1 X |
| 5,586,715 | 12/1996 | Schwiebert et al. | ................ 437/183 X |

*Primary Examiner*—Michael Lusignan
*Attorney, Agent, or Firm*—Mintz, Levin, Cohn, Ferris, Glovsky and Popeo, P.C.

[57] ABSTRACT

Automatically monitoring pads of material deposited on a surface of a workpiece using an inspection system that senses a deposited pad of material and determines pad height values at a plurality of locations across the pad, and a shape classifier that receives the pad height values as inputs and outputs a plurality of three-dimensional shape attributes related to pad deposit conditions.

38 Claims, 3 Drawing Sheets

MONITORING DEPOSITED PADS

This application is a continuation application Ser. No. 08/595,485, filed Feb. 1, 1996, now abandone.d

BACKGROUND OF THE INVENTION

The invention relates to flowable material dispensers and more particularly to depositing solder in a desired pattern on the surface of a workpiece.

Solder pads are often deposited in a desired pattern on a circuit board using a stencil printing system. Screens can be used in place of stencils, and solder printing systems have also been used to apply a pattern of adhesive pads to circuit boards. Typically a line of solder paste is dispensed onto the upper surface of the stencil, and a squeegee blade is used to spread the solder paste across the stencil and cause it to fill up the openings in the stencil and contact a circuit board positioned directly under the stencil. The circuit board is then lowered from the stencil, the board carrying solder pads in the desired pattern on its upper surface.

Cameras can be used to automatically inspect the deposited solder pads and provide information used to determine whether the pads are acceptable and whether process conditions should be changed. e.g., Chung, C-W, et al. "Closed Loop Process Control for Solder Paste Stencil Printing," pp. 485–491, describes viewing solder pads with a paste inspection system that determines such things as solder deposit area, solder deposit volume, average height of the solder paste deposit, border violation of the solder paste deposit, and the x and y position of the solder paste deposit. Chung describes the ability to use this information by a knowledge base/inference engine to control process parameters such as print speed, separation speed, print gap, squeegee pressure, paste dispense rate, and clean screen rate. Bryant, S., et al., "Neural Network Machine Vision for SMT Solder Paste Inspection," pp. 510–516, describes using an on-line inspection system to provide immediate feedback to an operator on solder paste quality for implementing a control loop. Bryant describes using a CCD camera to view solder pads and determine "image metrics," including such things as pad width, pad length, pad edge deviation, pad edge straightness, pad corner roundness, pad area, pad grayscale histogram, and pad grayscale image. The image metrics are used as the inputs to a neural network that grades the quality of a deposited solder pad on a scale from 0 to 9.

More recently it has been proposed to deposit solder pads by ejecting solder droplets from an ejector and directing the droplets to desired positions on a workpiece under the ejector.

SUMMARY OF THE INVENTION

In one aspect, the invention features in general, automatically monitoring pads of material deposited on a surface of a workpiece using an inspection system and a shape classifier. The inspection system views a deposited pad of material and determines pad height values at a plurality of locations across the pad. The shape classifier receives the pad height values as inputs and outputs a plurality of three-dimensional shape attributes related to pad deposit conditions. The classification of shape attributes provides information that is useful in adjusting and fine tuning the material deposit conditions so as to achieve desired pad conditions on subsequent boards.

In preferred embodiments, the shape classifier implements a neural network with input nodes that receive the pad height values and output nodes that output the three-dimensional shape attributes. The height values are grid points of an X–Y matrix on the surface of the workpiece. The three-dimensional shape attributes include scoop, slope, dog ears, and pump. The three-dimensional shape attributes are characterized as numerical values that each indicate the extent to which the shape of the pad exhibits an attribute.

The solder can be deposited by apparatus that includes a workpiece carrier that moves a workpiece into and out of a pad deposition position, a stencil or screen having openings in the desired pattern, and a squeegee that moves across the upper surface of the stencil or screen.

Preferably a print condition processor (e.g., implemented by an inference engine) receives the three-dimensional shape attributes and generates process control signals to change conditions of depositing solder pads based upon the three-dimensional shape attributes. The inspection system can also provide pad scan information (e.g., on pad coverage, bridging, alignment and volume) to the print condition processor, and the print condition processor can generate process control signals to change conditions of depositing pads based upon the pad scan information. E.g., if the sensed volume value is high, and the shape attribute is mostly dog-ear, squeegee pressure can be increased. If the sensed volume value is high, and the shape attribute is mostly pump, viscosity can be increased. If the sensed volume value is low, and the shape attribute is mostly slope, paste deposit can be increased, and viscosity can be decreased. If the sensed volume value is low, and the shape attribute is mostly scoop, squeegee pressure can be decreased.

Other advantages and features of the invention will be apparent from the following description of a preferred embodiment thereof and from the claims.

DESCRIPTION OF THE PREFERRED EMBODIMENT

Figure 1:
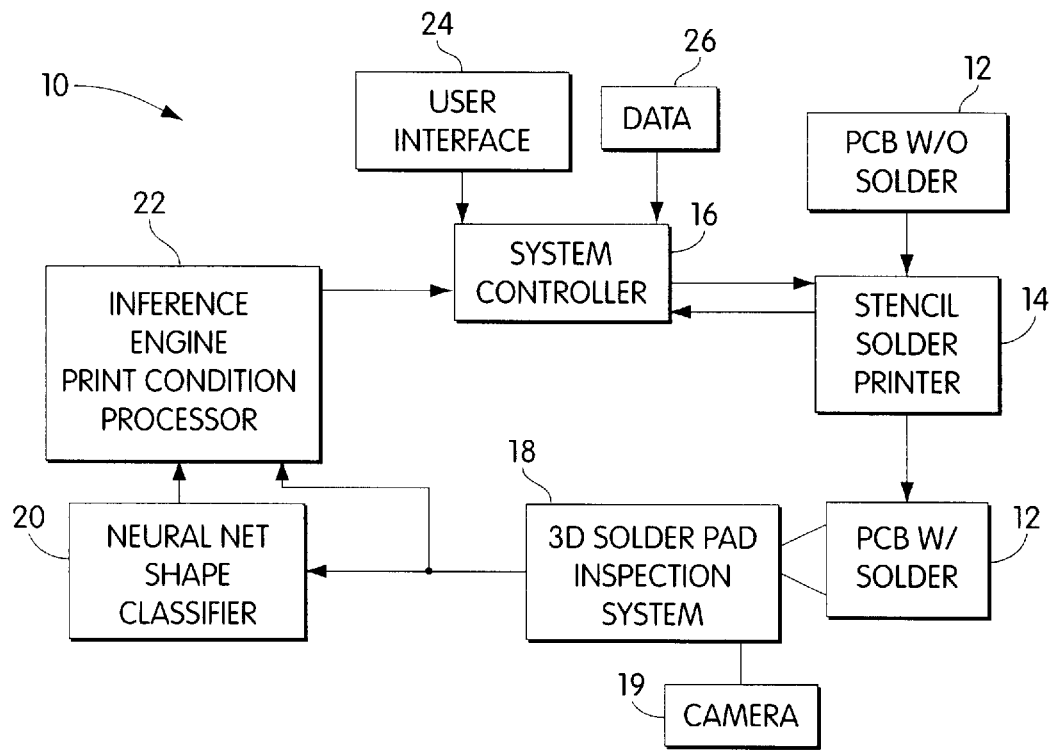
FIG. 1 is a block diagram of a control system for printing pads of solder through a stencil in a desired pattern on a circuit board according to the invention.
Figure 2:
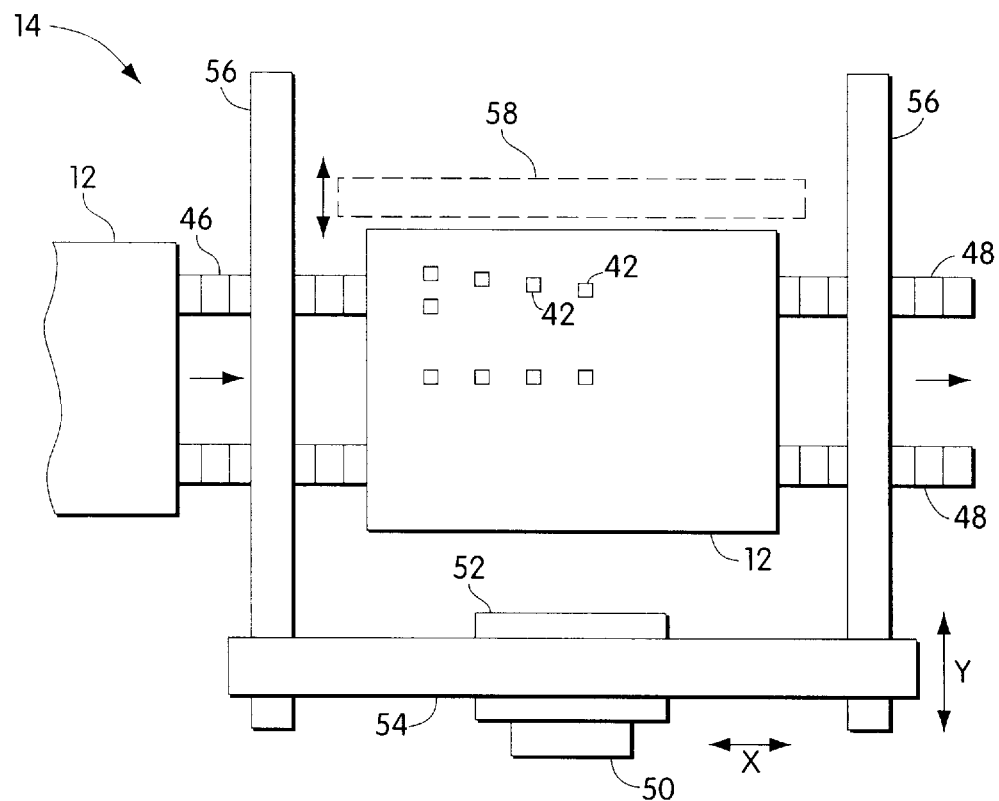
FIG. 2 is a plan view of some of the components of a stencil solder printer controlled by the FIG. 1 control system.

Referring to FIG. 1, there is shown control system 10 for controlling the deposition of solder pads on printed circuit boards (PCBs) 12 at stencil solder printer 14, shown in more detail in FIG. 2. System 10 includes system controller 16, which provides control signals to various components and actuators (not shown) in printer 14 and receives process information from various switches and sensors (not shown) in printer 14. Three-dimensional inspection system 18 (available under the SVS 8100 trade designation from View Engineering, 1650 N. Voyager, Simi Valley, Calif. 93063) includes track mechanisms to receive printed boards, a device 19 for capturing an image, such as a charged couple device (CCD) or a photosensitive device, to scan solder pads deposited on a printed circuit board PCB 12, and a computer to process image information. System 18 uses a laser (or other focussed beam) directed to the board surface at an angle to determine solder height. Inspection system 18 provides height (i.e., thickness) values at grid points of an X–Y matrix to shape classifier 20. Using the height values, shape classifier 20 outputs three-dimensional shape attributes related to pad deposit conditions to print condition processor 22.

Inspection system 18 also processes the data collected and generates pad scan information, which includes solder coverage, bridging, alignment and volume to print condition processor 22. There is a lack of coverage when a desired solder pad location is mostly or totally devoid of paste. Bridging, which is paste connecting adjacent solder pads, is typically caused by poor gasketing due to substrate quality or paste quality. Alignment is alignment of the solder pads with PCB 12; given the fact that the stencil solder printer 14 has a better alignment resolution than the scanning device of inspection system 18, only gross misalignment is considered. Volume relates to the volume of the solder pad.

Processor 22 uses the values of the shape attributes received from classifier 22 and the pad scan information received from inspection system 18 in determining whether the process conditions for printing at stencil solder printer 14 should be changed. This information is then sent to system controller 16. System controller 16 is also connected to user interface 24 (including a CRT, keyboard mouse) for providing information to and receiving commands from a user, and receives data related to the particular PCBs 12 to be printed from various data sources 26. System controller 16, shape classifier 20, and print condition processor 22 are all implemented on, for example, a common Pentium AST 100 mega Hz personal computer.

Referring to FIG. 2, some of the components of printer 14 are shown. The printer is an improvement of the type of printer described in Freeman U.S. Reissue Pat. No. 34,615 and commercially available under the Ultraprint 3000 trade designation from MPM Corporation, Franklin, Mass. both of which are hereby incorporated by reference. Printer 14 includes track feed mechanism 46 to supply the PCBs 12 to a central area where the boards are supported from below (by components not shown). Track mechanism 48 is used to remove processed boards. The printer also includes camera 50 carried on carriage 52, which is movable in an X direction along rail 54, which is a linear X-axis of motion. Rail 54 in turn is movable in a Y direction along tracks 56, which is a linear Y-axis of motion. Printer 14 also includes squeegee 58, positioned above PCB 12 and shown in phantom in FIG. 2.

Controller 16 receives inputs from and provides control signals to a wide variety of solder print control mechanisms on printer 14. These include the track mechanisms 46, 48 and squeegee 58 shown on FIG. 2 and other sensors and actuators not shown on FIG. 2. Controller 16 also controls X–Y movement of rail 54 and tracks 56, and can also provides alarm signals to an alarm and diverter signals to a board diverter (located down line of track mechanism 48) when a processed board 12 fails to meet user specified standards for printing solder as determined by print condition processor 22.

During a production run, boards 12 are automatically moved into position by track feed mechanism 46, engaged by underboard support components (not shown) and raised into position directly under a stencil (not shown) with openings corresponding to the position for solder deposits 42. Squeegee 58 then moves across the upper surface of the stencil pushing solder in front of it on the stencil surface, and solder is forced through the openings into contact with the surface of board 12. It is desired to have solder deposits completely fill the volume defined by the stencil openings. Process control parameters that affect the ability to meet this goal include squeegee velocity, downward pressure on the squeegee, "snap-off" (the distance of the board below the stencil), "downstop" (the distance under the stencil to which the squeegee would move if not prevented from doing so by the stencil), snap-off speed (speed of lowering of PCB 12 from the stencil), and paste rheology.

The processed PCB 12 is then removed by track mechanism 48 and transported to inspection system 18, and the next board 12 is moved into position in printer 14.

Figure 3:
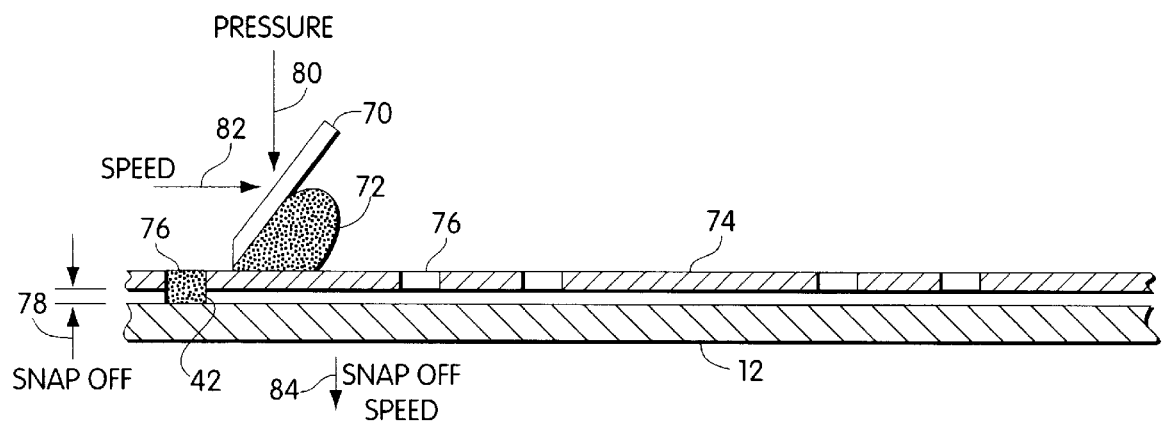
FIG. 3 is an illustration of some of the solder printing parameters controlled by the FIG. 1 system on the FIG. 2 printer.
Figure 4:
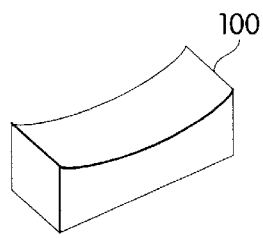
FIG. 4 is a perspective view of a deposited solder pad that exhibits a scoop three-dimensional shape attribute.
Figure 5:
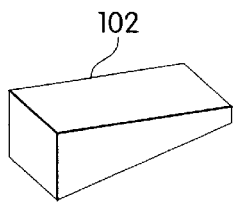
FIG. 5 is a perspective view of a deposited solder pad that exhibits a slope three-dimensional shape attribute.
Figure 6:
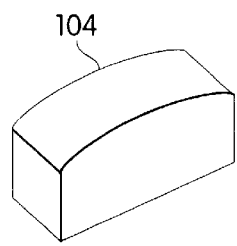
FIG. 6 is a perspective view of a deposited solder pad that exhibits a pump three-dimensional shape attribute.
Figure 7:
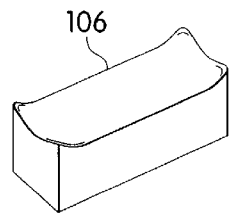
FIG. 7 is a perspective view of a deposited solder pad that exhibits a dog ear three-dimensional shape attribute.

Referring to FIG. 3, squeegee blade 70 is shown spreading the solder paste 72 across stencil 74 and causing the solder paste to fill up the holes 76 in stencil 74 and to contact PCB 12 thereunder. The solder tends to roll in front of the blade, which desirably causes mixing and shearing of the solder so as to attain desired viscosity to facilitate filling of the holes in the screen or stencil. The viscosity of the solder paste is also affected by the exposure to the atmosphere and by the temperature. The pressure on squeegee blade 70 (arrow 80), the speed of squeegee blade 70 (arrow 82), the extent of the snap-off (gap 78, if any) between PCB 12 and stencil 74, and the speed at which PCB 12 is lowered from stencil 74 (arrow 84) are control parameters that can be varied to affect the quality of the solder deposits achieved.

FIGS. 4–7 show solder pads 100, 102, 104, 106 deposited by printer 14. Each pad exhibits one of the four three-dimensional shape attributes characterized by shape classifier 20. Pad 100 exhibits a high degree of scoop. Pad 102 exhibits a high degree of slope. Pad 104 exhibits a high degree of pump. Pad 106 exhibits a high degree of dog ear.

3D solder pad inspection system 18 outputs a file with height information used by shape classifier 20 and pad scan information used directly by print condition processor 22. The height information is used by shape classifier 20 to identify the shape of the pads.

Shape classifier 20 is implemented by a backpropagation artificial neural network along with some preprocessing functions. The preprocessing involves transforming a matrix representing a particular pad's topographical data (which matrix may, for example, be 40×40, 5×10 or 10×10 depending upon the pad shape and size) to a fixed 20×20 matrix. In preprocessing, when data are compressed it is done by a method that minimizes loss of data, and when data are expanded the data values are essentially repeated. The fixed matrix is then propagated through the neural network. The network has 400 input nodes (input height array of 20×20), 20 hidden nodes, and four output nodes (one each for each of the shape attributes: scoop, slope, pump, and dog ear). The hidden nodes have a sigmoid transfer function (squashing function, $1.0/(1.0+\exp(-x))$), and the output nodes have a linear transfer function m=1 (y=mx+b). The neural network's learning rate is not greater than 0.01; its momentum is 0.0, and the mean squared error is 0.001. Appendix A is listing for the artificial neural network, and Appendix B is a file of weight values used in the neural network as called for in file apcsgen.h under the statement "void r_wts(FILE*, node_type*, int, int)." In Appendix B the first 8020 numbers are weights between the 400 input nodes and a bias node and the twenty hidden nodes, and the remaining 84 numbers are weights between the twenty hidden nodes and a bias node to the output nodes. At the output nodes, scoop, pump, and dog ear values are on a scale from 0.0 to 1.0, and slope values are on a scale from −1.0 to +1.0. The numerical value indicates the extent to which the pad exhibits the given shape.

Print condition processor 22 is implemented by an inference engine (in particular a commercially available knowledge-based expert system available under the Eclipse trade designation from Haley Enterprises, Inc., 413 Orchard St., Sewickley, Pa.) employing a knowledge base of a table of symptom/remedy pairs based upon observed process problems and possible solutions.

Each symptom is defined by a set of conditions in a functional unit of the programming language; if the conditions are met, the function indicates the existence of the symptom.

Each remedy to correct for improper pad formation is implemented as a set of operations and state variables. The operations consist of one or more actions to be taken depending upon the context of the state variable. As actions are taken, the state variables are updated.

The inference engine processes the symptom/remedy table beginning with the most critical symptoms and continues processing until a particular symptom is found to be true. When a symptom is true, its associated remedy is applied. If no symptoms are found to be true, either the process is assumed to be stable or a default message is displayed, indicating possible problems beyond the system's control capability, e.g., a worn stencil that might have oversize apertures leading to bridging. In some instances, the remedies depend upon the past history; e.g., if a problem persists on a subsequent board after taking a corrective action, the indicated corrective action can be changed.

The symptoms that are analyzed are lack of coverage (area), bridging, alignment, volume and shape. Lack of coverage is checked first. Bridging is checked whether or not there is good coverage.

Figure 8:
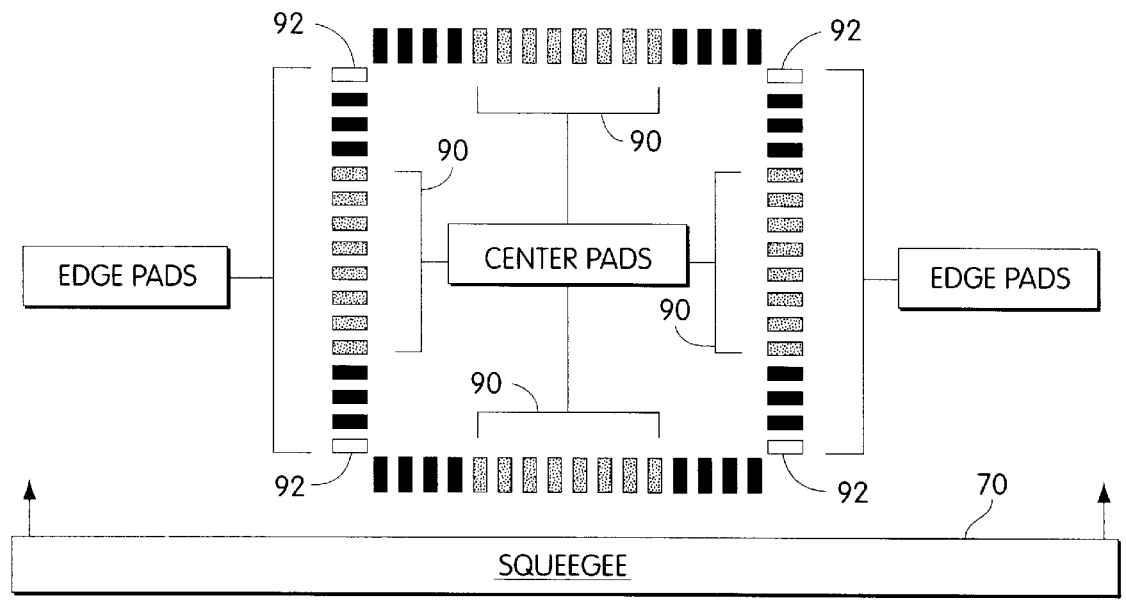
FIGS. 8 and 9 are diagrams illustrating pad definitions used in if/then rules for a print condition processor of the FIG. 1 system.
Figure 9:
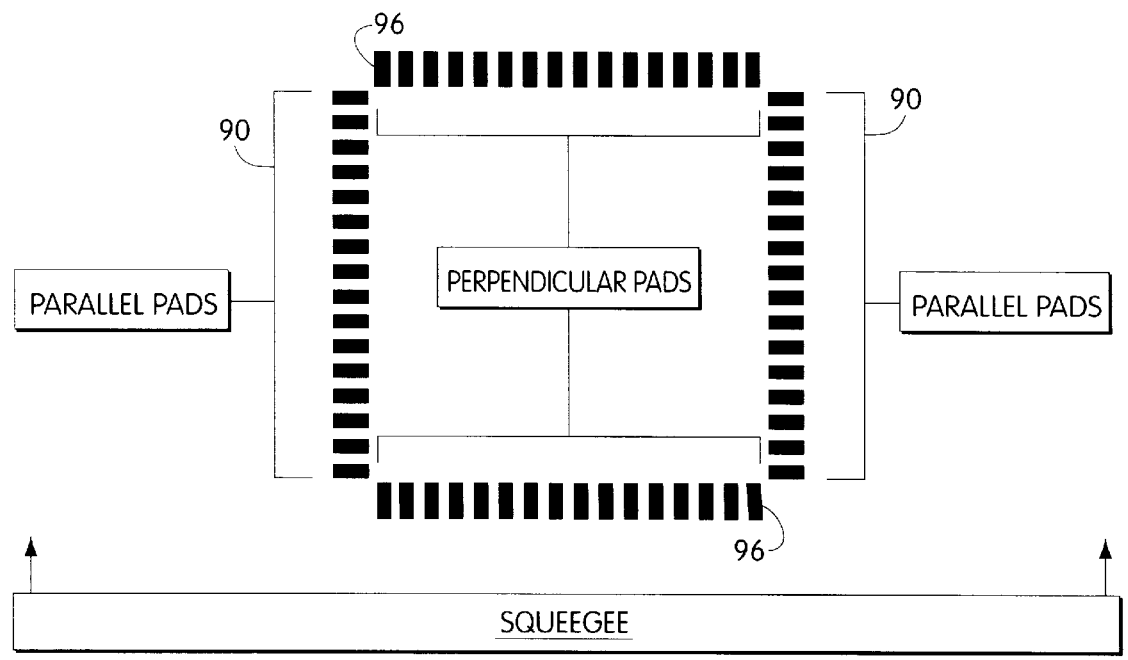

The symptom/remedy pairs are presented below as if/then rule statements under the Lack of Coverage, Bridging, Alignment, and Volume headings. The if/then statements are the knowledge base used in the expert system. The shape attributes come into play under certain volume conditions. These rules describe what actions are taken (the remedies) after "then" in the rule, based on an observation (the symptom) between "if" and "then" in the rule. FIGS. 8 and 9 illustrate the meanings of center pads 90, edge pads 92, parallel pads 94, and perpendicular pads 96, in the rules for edge leaded surface mount devices; these drawings, and the rules that employ the terms defined thereon, do not apply to ball grid arrays (BGAs).

Lack of Coverage

If greater than 1% of pads lack coverage, especially in one area, then there is a paste problem.

If less than 1% of pads lack coverage and these pads are at the edges of devices perpendicular to the squeegee, then there is a paste problem.

If less than 1% of pads lack coverage, and these pads are at the center of devices, then there are clogged apertures.

If there are clogged apertures, then wipe stencil.

If there is a paste problem, and paste has been sitting for more than 3 minutes, then knead paste.

If there is a paste problem, and paste has been sitting for less than 3 minutes, then increase paste deposit.

Bridging

If bridges are present on less than 5% of pads, then wipe stencil.

If bridges are present on more than 5% of pads, and pads are parallel to the squeegee blade, then wipe stencil, decrease downstop, and go to off contact printing (i.e. increase the distance between the stencil and the board).

If bridges are present on more than 5% of pads, and pads are both parallel and perpendicular to the squeegee blade, and no previous action, then wipe stencil, decrease squeegee pressure.

If bridges are present on more than 5% pads, and pads are both parallel and perpendicular to the squeegee blade, and previous action was decrease squeegee pressure, then wipe stencil, increase squeegee pressure, decrease squeegee speed.

If bridges are present on more than 5% of pads and pads are both parallel and perpendicular to the squeegee blade and previous action was decrease squeegee speed then wipe stencil, increase squeegee speed, decrease downstop.

If bridges are present on more than 5% of pads and pads are both parallel and perpendicular to the squeegee blade and previous action was decrease downstop then wipe stencil, increase downstop, decrease snapoff.

If bridges are present on more than 5% of pads and pads are both parallel and perpendicular to the squeegee blade and previous action was decrease snapoff then increase snapoff, wipe stencil, advise to check flatness (i.e. check hot air leveling, check substrate surface finish, check legends), and rotate board 90°.

Alignment

If alignment error detected and Fine Pitch mode (a mode where the board is aligned twice) is disabled then enable Fine Pitch mode for 2 print cycles then deactivate again (Fine Pitch mode is deactivated to increase throughput).

If alignment error detected and Fine Pitch mode is enabled then advise of alignment error and suggest setting up manual offsets.

Volume

If device type is ceramic ball grid array (BGA) and device volume is greater than VolumeCeramicBGATolerance% then volume is high.

If device type is plastic BGA and device volume is greater than VolumePlasticBGATolerance% then volume is high.

If device type is non-BGA and device volume is greater than VolumeTolerance% then volume is high.

If device type is ceramic BGA and device volume is less than VolumeCeramicBGATolerance% then volume is low.

If device type is plastic BGA and device volume is less than VolumePlasticBGATolerance% then volume is low.

If device type is non-BGA and device volume is less than VolumeTolerance% then volume is low.

If volume is high and shape is mostly dog-ear then increase squeegee pressure.

If volume is high and shape is mostly pump then increase viscosity.

If volume is low and shape is mostly scoop then decrease squeegee pressure.

If volume is low and shape is mostly slope then increase paste deposit, decrease viscosity.

In the above rules, the shape is "mostly" one of the four shapes when its corresponding value has the highest absolute value. If two or more shapes have the highest absolute value, the first of these shapes encountered in the rules is used.

The following Correction Rules describe how the actions identified above for the "then" statements, are carried out.

The "then" statements are used to generate "process control signals" to change the conditions of depositing pads. In some cases, the conditions are automatically changed; in others, a message is displayed for an operator to make a manual adjustment.

Correction Rules

If wipe stencil then wipe with solvent and vacuum.

If knead paste then activate knead cycle.

If increase paste deposit and last paste dispense was more than 20 print cycles ago then dispense paste.

If increase paste deposit and last paste dispense was less than 20 print cycles ago then temporarily increase squeegee pressure by 10% until 3 acceptable boards have been produced.

If increase squeegee pressure then raise squeegee pressure by 10% of its current setting.

If decrease squeegee pressure then lower squeegee pressure by 10% of its current setting.

If increase squeegee speed then raise squeegee speed by 0.2 in/sec, as long as the squeegee speed is below an upper limit.

If decrease squeegee speed then lower squeegee speed by 0.2 in/sec.

If decrease downstop and downstop is greater than or equal to 0.070" then reduce downstop by 0.010".

If decrease snapoff then reduce snapoff by 0.010".

If increase viscosity and the machine includes an environmental control unit then decrease temperature.

If increase viscosity and squeegee speed change allowed then decrease squeegee speed.

If increase viscosity then decrease squeegee pressure.

If decrease viscosity and the machine includes an environmental control unit then increase temperature.

If decrease viscosity then increase squeegee pressure.

If increase temperature and current temperature equals last temperature change then raise temperature by 3° F.

If decrease temperature and current temperature equals last temperature then lower temperature by 3° F.

Other embodiments are within the scope of the following claims.

For example, 3D solder pad inspection system 18, neural net shape classifier 20 and inference engine print condition processor 22 can be employed with other techniques for depositing solder pads such as solder jet printing systems.

An x-ray or acoustic imaging machine can be used to capture an image in inspection system 18.

```
//////////////////////////////////////////////////////,..///////////////
// File  : genfile.h                                         APPENDIX A
//
// Description: Header file to genfile.cpp
//
// Header:
//
// Date  : 12/22/95
//
// Author:
///////////////////////////////////////////////////////////////////////
//                        MPM Corp.
//                        16 Forge park
//                        Franklin, Ma 02038
//                        (508) 520-6999
//
//                        Copyright (c) 1995, 1996.
///////////////////////////////////////////////////////////////////////
#ifndef GENFILE_H
define GENFILE_H BOOL read_bool(FILE *fp);
short int read_short(FILE *fp);
float read_float(FILE *fp);
double read_double(FILE *fp);
void read_str(FILE *fp, char *str, int str_size);

#endif
```

```
/////////////////////////////,,,////////////////////////////   ;//////////////
//  File  : memal.h
//
//  Description : Header file to memal.cpp
//
//  Header:
//
//  Date  : 12/22/95
//
//  Author:
//////////////////////////////////////////////////////////////////////////////
//                          MPM Corp.
//                          16 Forge park
//                          Franklin, Ma 02038
//                          (508) 520-6999
//
//                          Copyright (c) 1995, 1996.
//////////////////////////////////////////////////////////////////////////////
#ifndef MEMAL_H
define MEMAL_H float **fmatrix(int,int);
void free_fmatrix(float **,int);

int **imatrix(int,int);
void free_imatrix(int **,int);

int *ivector(int);
void free_ivector(int *);

char *cvector(int);
void free_cvector(char *);

char **cmatrix(int, int);
void free_cmatrix(char **, int);

float *fvector(int);
void free_fvector(float *);

#endif
```

- 17 -

```
////////////////////////////,,///////////////////////////  ///////////////
// File  : nn.h
//
// Description: Definition of the neural network class
//
// Header:
//
// Date  : 12/22/95
//
// Author:
//////////////////////////////////////////////////////////////////////////
//                        MPM Corp.
//                        16 Forge park
//                        Franklin, Ma 02038
//                        (508) 520-6999
//
//                        Copyright (c) 1995, 1996.
//////////////////////////////////////////////////////////////////////////
#ifndef NN_H
define NN_H define INS 400      // Number of INPUTS
define NODES 20     // Number of HIDDEN nodes
define OUTS 4       // Number of OUTPUTS typedef struct Tag_node_type
    {
    float *weight;
    float *temp;
    float output;
    float net;
    float delta;
    } node_type;

#define WEIGHTSET_DIR ".\\"
#define TRAINSET_DIR  ".\\"
#define PAD_DATA_PATH ".\\"
#define RESULTS_PATH  ".\\"

// Default Data Set file names (without extensions)
#define DEFAULT_DATAIN_NAME   "Data"
#define DEFAULT_DATAOUT_NAME  "DataOut"

// Default Weights file names (without extensions)
#define DEFAULT_WEIGHTS_IN_NAME   "Rand"
#define DEFAULT_WEIGHTS_OUT_NAME  "NnOut"

// Data file extensions
#define TRAIN_EXT       ".trn"
#define MPM_FORMAT_EXT  ".pad"
#define WEIGHT_EXT      ".wts"

// Number of outputs (see OUTS above)
#define NUM_DEFECTS OUTS
```

- 18 -

```
typedef int pad_record_type;

typedef struct Tag_data_set
    {
    pad_record_type pad_id;
    float *output;
    float *input;
    } data_set;

typedef struct Tag_mpm_pad_data
    {
    pad_record_type pad_id;
    int training_flag;
    int xlen;
    int ylen;
    int num_defects;

float *output;
    float **h;
    } mpm_pad_data;

typedef enum Tag_nn_mode_type
    {
    ONE_PASS_TRAIN, CONVERGE_TRAIN, PROPOGATE
    } nn_mode_type;

typedef struct Tag_nn_config_data
    {
    float epsilon;   // Convergence error   (typical 0.001)
    int limit;       // Maximum iterations (typical 100,000)
    float rho;       // Learning rate (max 0.01)
    float alpha;     // Momentum (0.0)
    } nn_config_data;

void  init_io(FILE *, data_set *, int);
float f_squash(float);
float b_squash(float);
void  init_netwk(FILE *, node_type *, node_type *);
void  f_prop(float *, node_type *, node_type *);
void  b_prop(float *, float *, node_type *, node_type *, float, float);
FILE  *train_samp(void);
BOOL  nn(nn_config_data *conf, nn_mode_type mode, FILE *iwfp, FILE *owfp,
         FILE *flist, int num_files,CEdit *m );

#endif
```

- 19 -

```
///////////////////////////////////////////////////////////////////////////
//  File   : nndlg.h
//
//  Description: Neural network header file (class description)
//
//  Header:
//
//  Date   : 12/23/95
//
//  Author:
///////////////////////////////////////////////////////////////////////////
//                          MPM Corp.
//                          16 Forge park
//                          Franklin, Ma 02038
//                          (508) 520-6999
//
//                          Copyright (c) 1995, 1996.
///////////////////////////////////////////////////////////////////////////
#ifndef NNDLG_H
define NNDLG_H include "nn.h"      // to define nn_config_data data type, struct Tag_nn_config_data
include "analydoc.h"
#include "analyvw.h"
#include "resource.h"

#define UM_UPDATE_MSE    (WM_USER + 10)

class NeuralNetDlg : public CDialog
{
// Construction
public:
    NeuralNetDlg(CWnd* pParent = NULL);   // standard constructor CAnalystDoc* GetDocument();

// Dialog Data
    //{{AFX_DATA(NeuralNetDlg)
    enum { IDD = IDD_NEURAL_NET };
    CEdit   m_TParamMse;
    CString m_InputDatasetFilename;
    CString m_OutputDatasetFilename;
    long    m_ParamIterationMax;
    CString m_InputWeightsFilename;
    CString m_OutputWeightsFilename;
    float   m_ParamError;
    float   m_ParamLearnRate;
    float   m_ParamMomentumRate;
    //}}AFX_DATA void CalcWindowRect(LPRECT lpClientRect, UINT nAdjustType) ;
    void NNCallBack(float *);

// Overrides
    // ClassWizard generated virtual function overrides
    //{{AFX_VIRTUAL(NeuralNetDlg)
    protected:
    virtual void DoDataExchange(CDataExchange* pDX);    // DDX/DDV support
    //}}AFX_VIRTUAL
```

- 20 -

```
// Implementation
protected:
    afx_msg LRESULT OnUpdateTparaMse(WPARAM wParam, LPARAM lParam);

// Generated message map functions
    //{{AFX_MSG(NeuralNetDlg)
    afx_msg void OnPropButton();
    afx_msg void OnSimButton();
    afx_msg void OnTrainButton();
    //}}AFX_MSG
    DECLARE_MESSAGE_MAP()

private:
    nn_config_data ConfigData;

};

#ifndef _DEBUG  // debug version in Analyvw.cpp
inline CAnalystDoc* NeuralNetDlg::GetDocument()
   { return (CAnalystDoc*)m_pDocument; }
endif endif
```

- 21 -

```
//////////////////////////////////////////////////////////////////////
// File   : sobel.h
//
// Description: Header for for sobel.cpp
//
// Header:
//
// Date   : 12/22/95
//
// Author:
//////////////////////////////////////////////////////////////////////
//                         MPM Corp.
//                         16 Forge park
//                         Franklin, Ma 02038
//                         (508) 520-6999
//
//                         Copyright (c) 1995, 1996.
//////////////////////////////////////////////////////////////////////
#ifndef SOBEL_H
define SOBEL_H define THRESH 15.0
define X_BOUND 1
define Y_BOUND 1 void sobel(float , float ,int,int);
int *mark_pos(float **, int, int);
int *crop_marks(int **,int);

#endif
```

```
///////////////////////,,//////////////////////,  //////////////
// File   : process.cpp
//
// Description: Processes the data before it enters the neural network.
//
// Header: process.h
//
// Date   : 12/22/95
//
// Author:
////////////////////////////////////////////////////////////////////
//                          MPM Corp.
//                          16 Forge park
//                          Franklin, Ma 02038
//                          (508) 520-6999
//
//                          Copyright (c) 1995, 1996.
////////////////////////////////////////////////////////////////////
#include "stdafx.h"
#include <stdlib.h>
include <math.h> include "apcsgen.h"
include "sobel.h"
#include "expand.h"
#include "memal.h"
#include "apcsgen.h"
include "process.h"

////////////////////////////////////////////////////////////////////////
// This function processes the "raw" pad height data to be feed into the
// neural network. Only files with extensions .TRN will be processed for
// training or proprogating.
BOOL process(FILE *ifp, const char *Filename )
{
    FILE *tfp;
    mpm_pad_data data;
    int i, number_of_pads, pad_count = 0;
    BOOL rvalue = TRUE;

if( (number_of_pads=r_mpm_h(ifp)) != 0 )
    {

CString FullPathName = Filename;
        FullPathName += TRAIN_EXT;

if( (tfp=fopen(FullPathName, "w")) != NULL)
        {
            // This creates space at the top of the file for
            // the number of pads in the file.
            fprintf(tfp,"\n");
            fprintf(tfp,"\n");

for(i = 0; i < number_of_pads; i++)
            {
                r_mpm_pre(ifp, &data);// ERROR HANDLING
```

- 23 -

```
                data.output = fvector(data.num_defects);// ERROR HANDLING data.h = fmatrix(data.xlen, data.ylen);//ERROR HANDLING r_mpm_form(ifp, &data);

if ( preproc(tfp, data) )   // NEED TO DETECT WHEN A PAD IS NOT FOUND ??
                        pad_count++ ;

free_fmatrix(data.h,data.xlen);
            free_fvector(data.output);
            }

// Record the number of pads in the file at the top
        rewind(tfp);
        fprintf(tfp,"%d",pad_count);
        fclose(tfp);
        }
        else
        {
            rvalue = FALSE;
        }

}
    else
    {
        rvalue = FALSE;
    } return( rvalue ) ;
}

///////////////////////////////////////////////////////////////////////////
//
BOOL preproc(FILE *fp, mpm_pad_data pad)  // TWB 08/01/95 added BOOL return
{
    int i, j;

float **ch, **ex_ch, **edge;
    int *edge_limits;
    int x, y;

edge = fmatrix(pad.xlen, pad.ylen);
    sobel(edge, pad.h, pad.xlen, pad.ylen);

edge_limits=mark_pos(edge, pad.xlen, pad.ylen);
    free_fmatrix(edge, (pad.xlen));

if ( edge_limits )
    { x = (edge_limits[2]-edge_limits[0]+1);
       y = (edge_limits[3]-edge_limits[1]+1);

ch = fmatrix(x, y);

- 24 -
```

```
        for(i = 0; i< x; i++)
        {
            for(j=0;j< y;j++)
            {
                ch[i][j] = pad.h[(i+edge_limits[0])][(j+edge_limits[1])];
            }
        } free(edge_limits);

ex_ch = expand(ch, NEW_X_LENGTH, x, NEW_Y_LENGTH, y);
        free_fmatrix(ch, x);
        w_nn_d(fp, pad.pad_id, pad.output, ex_ch, NEW_X_LENGTH, NEW_Y_LENGTH, pad.num_defec
ts);
        free_fmatrix(ex_ch, NEW_X_LENGTH);
    } return ( edge_limits != NULL ) ;
}
```

```
///////////////////////////////,//////////////////////////////, //////////////
// File    : sobel.cpp
//
// Description: Edge detection of the pad within the rectangular window is done here
//              using the sobel magnitude operator.
//
// Header: sobel.h
//
// Date    : 12/23/95
//
// Author:
///////////////////////////////////////////////////////////////////////////////
//                          MPM Corp.
//                          16 Forge park
//                          Franklin, Ma 02038
//                          (508) 520-6999
//
//                          Copyright (c) 1995, 1996.
///////////////////////////////////////////////////////////////////////////////
#include "stdafx.h"
include <math.h> include "sobel.h"
include "memal.h"

///////////////////////////////////////////////////////////////////////////////
//
void sobel(float **temp, float **h, int x, int y)
{
int i,j,sx,ex,sy,ey;
float gx,gy;

sx=1;
sy=1;
ex=(x-1);
ey=(y-1);

for(i=0;i<x;i++)
    {
    for(j=0;j<y;j++)
        {
        temp[i][j]=0.0f;
        }
    } for(i=sx;i<ex;i++)
    {
    for(j=sy;j<ey;j++)
        {
        gx=(h[i+1][j-1]+2*h[i+1][j]+h[i+1][j+1])
                - (h[i-1][j-1]+2*h[i-1][j]+h[i-1][j+1]);
        gy=(h[i-1][j+1]+2*h[i][j+1]+h[i+1][j+1])
                - (h[i-1][j-1]+2*h[i][j-1]+h[i+1][j-1]);

temp[i][j]=(float)pow((gx*gx+gy*gy),0.5);
        }
    }
}
```

```
//////////////////////////////////////////////////////////////////////
//
int *mark_pos(float **d,int x,int y)
{
int i,j,k=0;
int **c;
int *limits;

c=imatrix((x*y),2);

for(i=0;i<x;i++)
    {
    for(j=0;j<y;j++)
        {
        if(d[i][j]>THRESH)
            {
            c[k][0]=i;
            c[k][1]=j;
            k++;
            }
        }
    } if ( k < 4 ) limits = NULL ;
else         limits = crop_marks(c,k) ;
//...
free_imatrix(c,(x*y));
return limits;
}

//////////////////////////////////////////////////////////////////////
//
int *crop_marks(int **p,int x)
{
int i;
int maxx=0,maxy=0,minx=1000,miny=1000, *crop;

crop = ivector(4);
for(i=0;i<x;i++)
        {
        if(p[i][0]>=maxx) maxx=p[i][0];
        if(p[i][1]>=maxy) maxy=p[i][1];
        if(p[i][0]<=minx) minx=p[i][0];
        if(p[i][1]<=miny) miny=p[i][1];
        } crop[0]=minx-X_BOUND;       /* x starting point */
crop[1]=miny-Y_BOUND;       /* y starting point */
crop[2]=maxx+X_BOUND;       /* x end point */
crop[3]=maxy+Y_BOUND;       /* y end point */ return crop;
}
```

```
///////////////////////////////////////////////////////////////
//  File  : expand.cpp
//
//  Header: expand.h
//
//  Date  : 12/22/95
//
//  Author:
///////////////////////////////////////////////////////////////
//                      MPM Corp.
//                      16 Forge park
//                      Franklin, Ma 02038
//                      (508) 520-6999
//
//                      Copyright (c) 1995, 1996.
///////////////////////////////////////////////////////////////
#include "stdafx.h"
include <malloc.h>
include <math.h> include "memal.h"
include "expand.h"

///////////////////////////////////////////////////////////////
//              Receives an ox by oy matrix, original matrix, and either
//              expands or contracts it into a nx by ny matrix. Returns
//              a pointer to new_matrix.
//
//              ox: original x length (number of rows)
//              oy: original y length (number of columns)
//              nx: new x length
//              ny: new y length
//
//              ovxi: original vector x index
//              ovyi: original vector y length
//              nvxi: new vector x length
//              nvyi: new vector y length
//
//              cc: column counter
//              rc: row counter
float **expand(float **original_matrix, int nx, int ox, int ny, int oy)
{
float **new_matrix, **temp_matrix;
float x_interval, y_interval, slope, position, base_index;
int rc, cc, nvxi, nvyi, ovxi=1, ovyi=1;

static int counter = 0;
counter++;

temp_matrix = fmatrix(nx, oy);  /* expanded rows only */
new_matrix = fmatrix(nx, ny);   /* expanded columns and rows */ x_interval = (float) (ox-1)/ (float) (nx-1);
y_interval = (float) (oy-1)/ (float) (ny-1);

/* first expanding the rows of original matrix into temp_matrix */
for(cc = 0; cc < oy; cc++)   /* do one column at a time */
{
    ovxi = 0;
```

- 28 -

```
    temp_matrix[ovxi][cc] = original_matrix[ovxi][cc]; /* start with same point */ slope = original_matrix[ovxi+1][cc] - original_matrix[ovxi][cc]; /* first possible slope */ for(nvxi = 1; nvxi < nx; nvxi++)
        {
        position = nvxi*x_interval;    /* determine where the point is relative   */
                                       /* to the original matrix index
    */ if( position > (ovxi+1) )   /* check to see if past next index position */
            {
            ovxi = (int) position; /* truncate position to proper index */
            base_index = (float)fmod( position, ovxi ); /* determine the remainder */ if( (ovxi+1) < ox )    //RFA: Added 09/15/95 to solve memory bounds problem
                slope = original_matrix[ovxi+1][cc] -  original_matrix[ovxi][cc];
            else
                slope = 1.0f;

temp_matrix[nvxi][cc] = slope * base_index + original_matrix[ovxi][cc];
            }
        else{
            temp_matrix[nvxi][cc] = x_interval * slope + temp_matrix[nvxi-1][cc];
            }

}   /* closes row counter */
    }   /* closes column counter */ for(rc = 0; rc < nx; rc++)   /* now expand the rows in temp_matrix to new_matrix */
{
    ovyi = 0;

new_matrix[rc][ovyi] = temp_matrix[rc][ovyi];
    slope = temp_matrix[rc][ovyi+1] - temp_matrix[rc][ovyi];

for(nvyi = 1; nvyi < ny; nvyi++)
        {
        position = y_interval * nvyi;

if( position > (ovyi+1) )
            {
            ovyi = (int) position; /* truncate position to proper index */
            base_index = (float)fmod( position, ovyi ); /* determine the remainder */ if( (ovyi+1) < oy )    //RFA: Added 09/15/95 to solve memory bounds problem
                slope = temp_matrix[rc][ovyi+1] - temp_matrix[rc][ovyi];
            else
                slope = 1.0f;

new_matrix[rc][nvyi] = slope * base_index + temp_matrix[rc][ovyi];
            }
        else{
            new_matrix[rc][nvyi] = y_interval * slope + new_matrix[rc][nvyi-1];
            }
```

```
        } /* closes column counter */
} /* closes row counter */ free_fmatrix(temp_matrix, nx );
    return new_matrix;
}
```

```
/////////////////////////////////////////////////////////////////////////
//   File   : apcsgen.cpp
//
//   Description: Contains common functions used by the neural network class
//
//   Header: apcsgen.h
//
//   Date   : 12/22/95
//
//   Author:
/////////////////////////////////////////////////////////////////////////
//                          MPM Corp.
//                          16 Forge park
//                          Franklin, Ma 02038
//                          (508) 520-6999
//
//                          Copyright (c) 1995, 1996.
/////////////////////////////////////////////////////////////////////////
#include "stdafx.h"

#include "mema1.h"
#include "apcsgen.h"
include "process.h"

extern float read_float(FILE *);

/////////////////////////////////////////////////////////////////////////
//
void w_rand_wts(FILE *fp)
{
    int i=0;

while(i < ((NODES*(INS+1)) + (OUTS*(NODES+1)))){
        i++;
        fprintf(fp, "%f\n",(float)rand()/(float)(1000*MAX_RAND));
        }
    fclose(fp);
}

/////////////////////////////////////////////////////////////////////////
//
void c_rand_wts(void)
{
    FILE *fp;
    char filename[MAX_PATH_LENGTH];

strcpy(filename,WEIGHTSET_DIR);
    strcat(filename,DEFAULT_WEIGHTS_IN_NAME);
    strcat(filename,WEIGHT_EXT);

if( ( fp=fopen(filename,"w") )==NULL){
        printf("can't open file\n");
        exit(1);
    } w_rand_wts(fp);
}

/////////////////////////////////////////////////////////////////////////
//
```

- 31 -

```
void r_wts(FILE *fp, node_type *nodes, int max_nodes, int num_wts)
{
    int i, node_ctr = 0;

while(node_ctr < max_nodes){
        for(i = 0; i < num_wts; i++){
            fscanf(fp, "%f", &(nodes[node_ctr].weight[i]));
            }
        node_ctr++;
        }
}

////////////////////////////////////////////////////////////////////////////
//
void save_wts(FILE *fp, node_type *nodes, int max_nodes, int num_wts)
{
    int i, node_ctr = 0;

while(node_ctr < max_nodes){
        for(i = 0; i < num_wts; i++){
            fprintf(fp, "%f\n",nodes[node_ctr].weight[i] );
            }
        node_ctr++;
        }
}

////////////////////////////////////////////////////////////////////////////
//
void wb_rand_wts(FILE *fp)
{
    int i=0;
    float *ptr;
    ptr = (float *) malloc(sizeof(float));
    while(i < ((NODES*(INS+1)) + (OUTS*(NODES+1)))){
        i++;
        *ptr = (float)rand()/(float)MAX_RAND;
        fwrite(ptr,sizeof(*ptr),1,fp);
        }
    fclose(fp);
}

////////////////////////////////////////////////////////////////////////////
//
void cb_rand_wts(void)
{
    FILE *fp;
    char filename[MAX_PATH_LENGTH];

strcpy(filename,WEIGHTSET_DIR);
    strcpy(filename,WEIGHT_EXT);
    strcat(filename,"apcs");

if( ( fp=fopen(filename,"w") )==NULL){
        printf("can't open file\n");
        exit(1);
    } wb_rand_wts(fp);
}
```

```
///////////////////////////////////////////////////////////////////////
//
void rb_wts(FILE *fp, node_type *nodes, int max_nodes, int num_wts)
{
    int node_ctr = 0;

while(node_ctr < max_nodes){
        fread( (nodes++)->weight, sizeof(*((nodes++)->weight)), num_wts, fp);
        node_ctr++;
        }
    fclose(fp);
}

///////////////////////////////////////////////////////////////////////
//
void saveb_wts(FILE *fp, node_type *nodes, int max_nodes, int num_wts)
{
    int node_ctr = 0;

while(node_ctr < max_nodes){
        fwrite( (nodes++)->weight, sizeof(*((nodes++)->weight)), num_wts, fp);
        node_ctr++;
        }
    fclose(fp);
}

///////////////////////////////////////////////////////////////////////
//
int read_binary_float(float *ptr, FILE *fp)
{
    return(fread(ptr, sizeof(*ptr), 1, fp));
}

///////////////////////////////////////////////////////////////////////
//
void w_mpm_form(FILE *fp, mpm_pad_data data)
{
    int i, rc, cc;

fprintf(fp, ";\n;\n;\n;\tpad identification number:\n");
    fprintf(fp, "\t%d\n", data.pad_id);
    fprintf(fp, ";\ttraining flag, (1 = train, 0 = propigate only):\n");
    fprintf(fp, "\t%d\n", data.training_flag);
    fprintf(fp, ";\tnumber of rows\tnumber of columns:\n");
    fprintf(fp, "\t%d\t%d\n", data.xlen, data.ylen);
    fprintf(fp, ";\tnumber of types of defects:\n");
    fprintf(fp, "\t%d\n", data.num_defects);
    fprintf(fp, ";\tdogear\tpump\tscoop\tslope:\n");

for(i = 0; i < (data.num_defects); i++){
        fprintf(fp, "\t%5.3f", data.output[i] );
        }
    fprintf(fp, "\n");

fprintf(fp, ";\tx (row) data by y (column) data\n");
    for(rc = 0; rc < data.xlen; rc++){
        for(cc = 0; cc < data.ylen; cc++){
            fprintf(fp, "\t%5.3f", data.h[rc][cc]);
            }
        fprintf(fp, "\n");
```

- 33 -

```
        }
}
///////////////////////////////////////////////////////////////////////
//
void r_mpm_pre(FILE *fp, mpm_pad_data *data)
{
    (data->pad_id) = (int) read_float(fp);
    (data->training_flag) = (int) read_float(fp);
    (data->xlen) = (int) read_float(fp);
    (data->ylen) = (int) read_float(fp);
    (data->num_defects) = (int) read_float(fp);
}

///////////////////////////////////////////////////////////////////////
//
void r_mpm_form(FILE *fp, mpm_pad_data *data)
{
    int i, rc, cc;

for(i = 0; i < (data->num_defects); i++){
        data->output[i] =  read_float(fp);
    } for(rc = 0; rc < data->xlen; rc++){
        for(cc = 0; cc < data->ylen; cc++){
            data->h[rc][cc] = read_float(fp);
        }
    }
}

///////////////////////////////////////////////////////////////////////
//
int r_mpm_h(FILE *fp)
{
    char buf[256] ;
    fgets (buf, 255, fp) ;    // Discard source field for now return( (int)read_float(fp));
}

///////////////////////////////////////////////////////////////////////
//
void w_mpm_h(FILE *fp, int number)
{
    fprintf(fp, "; \n");
    fprintf(fp, "; MPM FORMAT PAD DATA FILE\n");
    fprintf(fp, "; \n");
    fprintf(fp, "; \n");
    fprintf(fp, "; number of prints to follow:\n");
    fprintf(fp, "\t%d\n",number);
    fprintf(fp, "; \n");
}

///////////////////////////////////////////////////////////////////////
//
void wb_nn_d(FILE *fp, pad_record_type id, float *out, float **in, int x, int y, int o)
{
    fwrite( &id, sizeof(pad_record_type), 1, fp);
    fwrite( out, sizeof(*out), o, fp);
```

- 34 -

```c
    fwrite( in, sizeof(**in), x*y, fp);
}
////////////////////////////////////////////////////////////////////////////
//
void wb_nn_h(FILE *fp, int num)
{
    fwrite(&num, sizeof(num), 1, fp);
}
////////////////////////////////////////////////////////////////////////////
//
void rb_nn_d(FILE *fp, data_set *data)
{
    fread( &(data->pad_id), sizeof(data->pad_id), 1, fp);
    fread( data->output, sizeof(*(data->output)), OUTS, fp);
    fread( data->input, sizeof(*(data->input)), INS, fp);
}

////////////////////////////////////////////////////////////////////////////
//
int rb_nn_h(FILE *fp)
{
    int x;
    fread( &x, sizeof(x), 1, fp);
    return x;
}
////////////////////////////////////////////////////////////////////////////
//
void w_nn_d(FILE *fp, pad_record_type id, float *out, float **in, int x, int y, int o)
{
    int i, j;
    fprintf(fp,"%d\n",id);

for(i = 0; i < o; i++){
        fprintf(fp,"%f\n",out[i]);
        } for(i = 0; i < x; i++){
        for(j = 0; j < y; j++){
            fprintf(fp,"%f\n",in[i][j]);
            }
        }
}
////////////////////////////////////////////////////////////////////////////
//
void w_nn_h(FILE *fp, int num)
{
    fprintf(fp, "%d\n",num);
}

////////////////////////////////////////////////////////////////////////////
//
void r_nn_d(FILE *fp, data_set *data, int x, int o)
{
    int i;
    float test;
```

```
        fscanf(fp,"%d",&(data->pad_id));
    //printf(fp,"%d\n",data->pad_id);
        fscanf(fp,"%f",&test);
        printf("%f\n",test);
        exit(0);
        for(i = 0; i < o; i++){
            fscanf(fp,"%f",&(data->output[i]) );
            } for(i=0; i<x; i++){
            fscanf(fp,"%f", &(data->input[i]) );
            }
}

////////////////////////////////////////////////////////////////////////////////
//
int r_nn_h(FILE *fp)
{
    int x;
    fscanf(fp, "%d", &x);
    return x;
}

////////////////////////////////////////////////////////////////////////////////
//
void get_path(char * nname, char * name)
{
    char buf[MAX_PATH_LENGTH];

strcpy(buf, TRAINSET_DIR);
    strcat(buf, name);
    strcat(buf, TRAIN_EXT);
    strcpy(nname, buf);
}
```

```cpp
/////////////////////////////,;/////////////////////////////.    //////////////
// File  : genfile.cpp
//
// Description: Utility for reading ASCII text from a file.
//
// Header:
//
// Date  :
//
// Author:
////////////////////////////////////////////////////////////////////////////////
//                              MPM Corp.
//                              16 Forge park
//                              Franklin, Ma 02038
//                              (508) 520-6999
//
//                              Copyright (c) 1995, 1996.
////////////////////////////////////////////////////////////////////////////////
#include "stdafx.h"

#include "genfile.h"

static int file_item;

////////////////////////////////////////////////////////////////////////////////
//
BOOL read_bool(FILE *fp)
    {
    BOOL rvalue = 0;
    BOOL done = FALSE;
    char str[90], *sptr;

while(done == FALSE)
        {
        if(fgets(str, 80, fp) == NULL)
            {
            done = TRUE;
            }
        else
            {
            /* Search string for an equal sign */
            for(sptr = str; done==FALSE; ++sptr)
                {
                if(*sptr == '=')
                    {
                    rvalue = (BOOL)atof(++sptr);
                    done = TRUE;
                    }
                else if((*sptr == '\0') || (*sptr == ';'))
                    {
                    break;
                    }
                }
            }
        /* Read in another string if an equal sign is not found. */
        }
    return(rvalue);
    }
```

- 37 -

```
////////////////////////////////////////////////////////////////////////////
//
short int read_short(FILE *fp)
{
    int rvalue = 0;
    BOOL done = FALSE;
    char str[90], *sptr;

while(done == FALSE)
        {
        if(fgets(str, 80, fp) == NULL)
            {

}
        else
            {
            /* Search string for an equal sign */
            for(sptr = str; done==FALSE; ++sptr)
                {
                if(*sptr == '=')
                    {
                    rvalue = (short)atof(++sptr);
                    done = TRUE;
                    }
                else if((*sptr == '\0') || (*sptr == ';'))
                    {
                    break;
                    }
                }
            }
        /* Read in another string if an equal sign is not found. */
        }
    return(rvalue);
}

////////////////////////////////////////////////////////////////////////////
//
float read_float(FILE *fp)
{
    float rvalue = 0.0f;
    BOOL done = FALSE;
    static char str[500], *sptr;

static int newline = TRUE;

if(newline){
            fgets(str, 400, fp);
            sptr = str;
            } while(done == FALSE)
        {
            /* Search string for a tab */ if(*sptr == ';'){
                while(*(++sptr) != '\n');
```

- 38 -

```c
                }
            if(*sptr == '\t'){
                rvalue = (float)(atof(++sptr)+5E-7);
                done = TRUE;
                newline = FALSE;
                }
            else if(*sptr == '\n'){
                fgets(str, 400, fp);
                sptr = str;
                newline = TRUE;
                done = FALSE;
                }
            if(!newline) {
                sptr++;
                }
            }
    return(rvalue);
}

//////////////////////////////////////////////////////////////////////////////
//
double read_double(FILE *fp)
{
    double rvalue = 0.0;
    BOOL done = FALSE;
    char str[90], *sptr;

++file_item;
    while(done == FALSE)
        {
        if(fgets(str, 80, fp) == NULL)
            {
            }
        else
            {
            /* Search string for an equal sign */
            for(sptr = str; done==FALSE; ++sptr)
                {
                if(*sptr == '=')
                    {
                    rvalue = (double)(atof(++sptr));
                    done = TRUE;
                    }
                else if((*sptr == '\0') || (*sptr == ';'))
                    {
                    break;
                    }
                }
            }
        /* Read in another string if an equal sign is not found. */
        }
    return(rvalue);
}

//////////////////////////////////////////////////////////////////////////////
//
void read_str(FILE *fp, char *str, int str_size)
{
```

- 39 -

```
    int i=0;
    BOOL done = FALSE;
    char line[90], *sptr;

--str_size;     /* Indicate string size minus NULL terminator*/ while(done == FALSE)
        {
        if(fgets(line, 80, fp) == NULL)
            {
            // Error code goes here
            }
        else
            {
            /* Search string for an equal sign */
            for(sptr = line; done==FALSE; ++sptr)
                {
                if(*sptr == '=')
                    {
                    /* Find First alpha-numeric character*/
                    while(isalnum(*(++sptr)) == 0)
                        {
                        if(*sptr == '\0')   break;
                        } while(isspace(*sptr)==0 && *sptr!='\0'
                        && *sptr != ';')
                        {
                        if(*sptr == '|')
                            {
                            /* Change to a space */
                            *sptr = ' ';
                            }
                        *str++ = *sptr++;
                        if(++i >= str_size)   break;
                        }
                    done = TRUE;
                    }
                else if((*sptr == '\0') || (*sptr == ';'))
                    {
                    break;
                    }
                }
            }
        /* Read in another string if an equal sign is not found. */
        }
    *str = '\0';            /* Set NULL terminator */
    return;
}
```

```cpp
////////////////////////////////////////////////////////////////////////////
// File    : memal.cpp
//
// Description: General memory control functions
//
// Header: memal.h
//
// Date    : 12/23/95
//
// Author:
////////////////////////////////////////////////////////////////////////////
//                          MPM Corp.
//                          16 Forge park
//                          Franklin, Ma 02038
//                          (508) 520-6999
//
//                          Copyright (c) 1995, 1996.
////////////////////////////////////////////////////////////////////////////
#include "stdafx.h"
include <malloc.h> include "memal.h"

////////////////////////////////////////////////////////////////////////////
//
float **fmatrix(int nrh,int nch)
{
  int i,j;
  float **m;
  m=(float **)malloc((unsigned)(nrh)*sizeof(float*));
  if(!m) printf("allocation failure 1 in matrix()");

for(i=0;i<nrh;i++)
        {
        m[i]=(float *)malloc((unsigned)(nch)*sizeof(float));
        if(!m[i])printf("allocation failure 2 in matrix()");
        } for(i=0;i<nrh;i++)
        {
        for(j=0;j<nch;j++) // TWB 07/31/95 was for(j=0;j<nch;j++);
            {
            m[i][j]=0.0f; // TWB 07/31/95 was m[i][j]=(float)0.0;
            }
        }
return m;
}

////////////////////////////////////////////////////////////////////////////
//
void free_fmatrix(float **m,int nrh)
{
    int i;

for(i=(nrh-1);i>=0;i--)
        {
        free(m[i]); // TWB 07/31/95 was free((char *)(m[i]));
        }
    free(m); // TWB 07/31/95 was free((char *)(m));
```

- 41 -

```
}
////////////////////////////////////////////////////////////////////////
//
int **imatrix(int nrh,int nch)
{
  int i,j;
  int **m;
  m=(int **)malloc((unsigned)(nrh)*sizeof(int*));
  if(!m) printf("allocation failure 1 in matrix()");

for(i=0;i<nrh;i++)
        {
        m[i]=(int *)malloc((unsigned)(nch)*sizeof(int));
        if(!m[i])printf("allocation failure 2 in matrix()");
        } for(i=0;i<nrh;i++)
        {
        for(j=0;j<nch;j++)  // TWB 07/31/95 was for(j=0;j<nch;j++);
            {
            m[i][j]=0;
            }
        }
return m;
}

////////////////////////////////////////////////////////////////////////
//
void free_imatrix(int **m,int nrh)
{
    int i;

for(i=0;i<nrh;i++)
      {
      free(m[i]); // TWB 07/31/95 was free((char *)(m[i]));
      }
    free(m); // TWB 07/31/95 was free((char *)(m));
}

////////////////////////////////////////////////////////////////////////
//
int *ivector(int x)
{
int *v;

v=(int *)malloc((unsigned) x*sizeof(int));
return v;
}

////////////////////////////////////////////////////////////////////////
//
void free_ivector(int *x)
{
free(x); // TWB 07/31/95 was free((int *) x);
}

////////////////////////////////////////////////////////////////////////
//
char *cvector(int x)
```

```
{
char *v;

v=(char *)malloc((unsigned) x*sizeof(char));
return v;
}
///////////////////////////////////////////////////////////////////////////
//
void free_cvector(char *x)
{
free(x); // TWB 07/31/95 was free((char *) x);
}
///////////////////////////////////////////////////////////////////////////
//
float *fvector(int x)
{
float *v;

v=(float *)malloc((unsigned) x*sizeof(float));
return v;
}
///////////////////////////////////////////////////////////////////////////
//
void free_fvector(float *x)
{
free(x); // TWB 07/31/95 was free((char *) x);
}
///////////////////////////////////////////////////////////////////////////
//
char **cmatrix(int nrh,int nch)
{
  int i;
  char **m;
  m=(char **)malloc((unsigned)(nrh)*sizeof(char*));
  if(!m) printf("allocation failure 1 in matrix()");

for(i=0;i<nrh;i++)
      {
      m[i]=(char *)malloc((unsigned)(nch)*sizeof(char));
      if(!m[i])printf("allocation failure 2 in matrix()");
      } return m;
}
///////////////////////////////////////////////////////////////////////////
//
void free_cmatrix(char **m,int nrh)
{
   int i;

for(i=(nrh-1);i>=0;i--)
      {
      free(m[i]); // TWB 07/31/95 was free((char *)(m[i]));
      }
    free(m); // TWB 07/31/95 was free((char *)(m));
```

- 43 -

```
///////////////////////////,  ,///////////////////////////.   //////////////
//  File  : nn.cpp
//
//  Description:  Implementation of the Neural Network class
//
//  Header: nn.h
//
//  Date  : 12/22/95
//
//  Author:
////////////////////////////////////////////////////////////////////////////
//                          MPM Corp.
//                          16 Forge park
//                          Franklin, Ma 02038
//                          (508) 520-6999
//
//                          Copyright (c) 1995, 1996.
////////////////////////////////////////////////////////////////////////////
#include "stdafx.h"
include <math.h>
include <conio.h> include "apcsgen.h"
include "process.h"
#include "memal.h"
#include "nn.h"
//#include "nndlg.h"

static float mse = 1.0f;

////////////////////////////////////////////////////////////////////////////
//
BOOL nn(nn_config_data *conf, nn_mode_type mode, FILE *iwfp, FILE *owfp, FILE *flist,
        int num_files,CEdit *m )
{ int ctr =  0, iter=0, i, j, times;
    float *error;
    FILE *ofp, *cifp;
    data_set *set;
    node_type *out, *hid;
    char full_path[MAX_PATH_LENGTH];
    BOOL rvalue = TRUE;
    CString S;

// If no init weight file given, use default one
    if(iwfp == NULL)
    {
        strcpy(full_path, WEIGHTSET_DIR);
        strcat(full_path, DEFAULT_WEIGHTS_IN_NAME);
        strcat(full_path, WEIGHT_EXT);
        if( (iwfp = fopen(full_path, "r")) == NULL )
            rvalue = FALSE;
    }

//Make a default results pad file

- 44 -
```

```c
    strcpy(full_path,RESULT_PATH);
    strcat(full_path,"res.pad");

if( (ofp = fopen(full_path, "w")) == NULL){
        printf("cannot open results file\n");
        exit(0);
        } out = (node_type *)malloc(OUTS*sizeof(node_type));
    hid = (node_type *)malloc(NODES*sizeof(node_type));

error = fvector(OUTS);

cifp = flist;
    init_netwk(iwfp, hid, out);

switch(mode)
        {
        case ONE_PASS_TRAIN:

while(ctr < num_files){  /* keep going until the end of list */
                times = r_nn_h(cifp); /* how many sets in cifp */
                set = (data_set *)malloc(times*sizeof(data_set));

init_io(cifp, set, times); /* initialize all sets */ for(i=0; i<times; i++)   /*do for all sets */
                    {
                    f_prop((set+i)->input, hid, out);

for(j=0;j<OUTS;j++){
                        error[j] = (set+i)->output[j] - out[j].output;  /* determine the error */
                        mse += error[j]*error[j];
                        } b_prop(error, (set+i)->input, hid, out, conf->rho, conf->alpha);    /* back propagate the error */
                    } /*end of sets */
                cifp++; /*read in next file from list */
                ctr++;
                }
            free(set);
            break;

case CONVERGE_TRAIN:

while( mse > (conf->epsilon) && iter < 10000)       //(conf->limit)
            {
                mse = 0.0f;
                ctr = 0;
                rewind(cifp);

while( ctr < num_files )  /* keep going until the end of list */
                {
                    times = r_nn_h(cifp);    /* how many sets in cifp */
                    set = (data_set *)malloc(times*sizeof(data_set));

init_io(cifp, set, times); /* initialize all sets */
```

- 45 -

```
                        for(i=0; i<times; i++)   /*do for all sets in a file*/
                        {
                            f_prop((set+i)->input, hid, out);

for(j=0;j<OUTS;j++)
                            {
                                error[j] = (set+i)->output[j] - out[j].output;   /* determine the error */
                                mse += error[j]*error[j];
                            } b_prop(error, (set+i)->input, hid, out, conf->rho, conf->alpha);
                            /* back propagate the error */
                        } /*end of sets */ for(i=0;i<times;i++)
                        {
                            free((set+i)->input);
                            free((set+i)->output);
                        } free(set);
                        ctr++; /*read in next file from list */
                    }

// Display mean squared error
                    //NNView->SendMessage(UM_UPDATE_MSE);
                    //SendMessage(UM_UPDATE_MSE);

S.Format("%.2f", mse);
                    m->SetWindowText(S);
                    Sleep(2000);

iter++;
                }
                break;

case PROPOGATE:
                while(ctr < num_files){ /* keep going until the end of list */
                    times = r_nn_h(cifp); /* how many sets in cifp */ set = (data_set *)malloc(times*sizeof(data_set));

init_io(cifp, set, times); /* initialize all sets */ for(i=0; i<times; i++)   /*do for all sets */
                    {
                        f_prop((set+i)->input, hid, out);

fprintf(ofp, "%d\n",(set+i)->pad_id);

for(j=0;j<OUTS;j++){
                            error[j] = (set+i)->output[j] - out[j].output;   /* determine the error */
                            mse += error[j]*error[j];
                            fprintf(ofp, "%f\t",out[j].output);
                            printf( "%f\t",out[j].output);
                        }
```

```c
                fprintf(ofp,"\n");
                } /*end of sets */
            ctr++;
            cifp++; /*read in next file from list */
            fclose(ofp);
            }
        break;

default:
            break;
        } if ( owfp ) { // TWB 07/31/95 added this condition
        save_wts(owfp, hid, NODES, INS+1);
        save_wts(owfp, out, OUTS, NODES+1);
        fclose(owfp);
    } return( rvalue );
}

///////////////////////////////////////////////////////////////////////////////
// Function to initialize the network, based on the user specified
// weight file.
void init_netwk(FILE *fp, node_type *hnode, node_type *onode)
{
    int i;

for (i = 0; i < NODES; i++){
        (hnode+i)->weight = fvector(INS+1);
        (hnode+i)->temp = fvector(INS+1);
        } for (i = 0; i < OUTS; i++){
        (onode+i)->weight = fvector(NODES+1);
        (onode+i)->temp = fvector(NODES+1);
        } r_wts(fp, hnode, NODES, (INS+1));
    r_wts(fp, onode, OUTS, (NODES+1));

fclose(fp);
}

///////////////////////////////////////////////////////////////////////////////
// Forward propagates the input pattern, and returns the output
void f_prop(float *in_pat, node_type *hid, node_type *out)
{
    int i,j;

for(i=0;i<NODES;i++){
        (hid+i)->net = 0.0f;
        } for(i=0;i<OUTS;i++){
        (out+i)->net = 0.0f;
        } for(i=0;i<NODES;i++){
```

```
        for(j=0;j<INS;j++){
            (hid+i)->net += (in_pat[j]) * ((hid+i)->weight[j]);
            }
        (hid+i)->net += (hid+i)->weight[INS];
        (hid+i)->output = f_squash((hid+i)->net);
        } for(i=0;i<OUTS;i++){
        for(j=0;j<NODES;j++){
            (out+i)->net += (hid+j)->output*(out+i)->weight[j];
            }
        (out+i)->net += (out+i)->weight[NODES];
        (out+i)->output = (out+i)->net; /* linear output function */
        }
}

////////////////////////////////////////////////////////////////////////////
// Back propagates a signal
void b_prop(float *error_sig, float *in_pat, node_type *hid, node_type *out, float rho, fl
oat alpha)
{
int i,j;

for(i=0;i<OUTS;i++)
    {
    (out+i)->delta = error_sig[i];  /* linear output function */
//  printf("errors = %f\n",error_sig[i]);
    (out+i)->net = 0.0f;
    } for(i=0;i<OUTS;i++)
    {
    for(j=0;j<NODES;j++)
        {
        (out+i)->weight[j] += (rho*((out+i)->delta)*((hid+j)->output)+ alpha*(out+i)->temp
[j]);
        (out+i)->temp[j] = rho*((out+i)->delta)*((hid+j)->output);
        }
    (out+i)->weight[NODES] += (rho*((out+i)->delta) + alpha*(out+i)->temp[NODES]);
    (out+i)->temp[NODES] = rho*((out+i)->delta);
    } for(i=0;i<NODES;i++)
    {
    (hid+i)->delta = b_squash((hid+i)->net) * ( (out->delta) * (out->weight[i])
                    +((out+1)->delta) * ((out+1)->weight[i])+((out+2)->delta) * ((
out+2)->weight[i])
                    +((out+3)->delta) * ((out+3)->weight[i]) );
    (hid+i)->net =0.0f;
    } for(i=0;i<NODES;i++)
    {
    for(j=0;j<INS;j++)
        {
        (hid+i)->weight[j] += (rho*( (hid+i)->delta)*(in_pat[j]) + alpha*(hid+i)->temp[j])
;
        (hid+i)->temp[j]=rho*((hid+i)->delta) * (in_pat[j]) ;
        }
    (hid+i)->weight[INS] += (rho*((hid+i)->delta) + alpha*(hid+i)->temp[INS]);
```

- 48 -

```
    (hid+i)->temp[INS] = rh___((hid+i)->delta);
    }
}

////////////////////////////////////////////////////////////////////////////////
//
void init_io(FILE *fp, data_set *set, int num_sets)
{
    int pad_ctr = 0;
    int i;

while(pad_ctr < num_sets ){
        (set+pad_ctr)->output = fvector(OUTS);
        (set+pad_ctr)->input = fvector(INS);

fscanf(fp, "%d",&((set+pad_ctr)->pad_id));

for(i = 0; i < OUTS; i++){
            fscanf(fp,"%f",&( (set+pad_ctr)->output[i]) );
//          printf("out = %f\n",(set+pad_ctr)->output[i]);
            } for(i=0;i<INS;i++){
            fscanf(fp, "%f",&( (set+pad_ctr)->input[i]) );
            }
//      r_nn_d(fp, (set+pad_ctr), INS, OUTS);
        pad_ctr++;
        }
}

////////////////////////////////////////////////////////////////////////////////
// logistic function
float f_squash(float x)
{
    if(x>70) x=70.0f;
    else if(x<-70) x=-70.0f;

return(float)(1.0/(1.0+exp(-x)));
}

////////////////////////////////////////////////////////////////////////////////
// derivative of the logistic function
float b_squash(float x)
{
    if(x>70) x=70.0f;
    else if(x<-70) x=-70.0f;

return(float)( 1.0/(1.0+exp(-x)) * (1.0 - 1.0/(1.0+exp(-x))));
}

////////////////////////////////////////////////////////////////////////////////
//
float GetNNMse(void)
{
    return( mse );
```

- 49 -

```
///////////////////////,..////////////////////////,  /////////////
// File    : nndlg.cpp
//
// Description: Neural network dialog implementation file .
//
// Header: nndlg.h
//
// Date   : 12/26/95
//
// Author:
////////////////////////////////////////////////////////////////////
//                          MPM Corp.
//                          16 Forge park
//                          Franklin, Ma 02038
//                          (508) 520-6999
//
//                          Copyright (c) 1995, 1996.
////////////////////////////////////////////////////////////////////
#include "stdafx.h"

#include "apcs.h"
#include "nndlg.h"
#include "simdlg.h"
#include "analydoc.h"
#include "analyvw.h"
#include "process.h"    // for process()

#ifdef _DEBUG
#undef THIS_FILE
static char BASED_CODE THIS_FILE[] = __FILE__;
endif static UINT RunNN(LPVOID pParam);

////////////////////////////////////////////////////////////////////
// NeuralNetDlg dialog
NeuralNetDlg::NeuralNetDlg(CWnd* pParent /*=NULL*/)
    : CDialog(NeuralNetDlg::IDD, pParent)
{
    //{{AFX_DATA_INIT(NeuralNetDlg)
    m_InputDatasetFilename = _T(DEFAULT_DATAIN_NAME);
    m_OutputDatasetFilename = _T(DEFAULT_DATAOUT_NAME);
    m_ParamIterationMax = 100000;
    m_InputWeightsFilename = _T(DEFAULT_WEIGHTS_IN_NAME);
    m_OutputWeightsFilename = _T(DEFAULT_WEIGHTS_OUT_NAME);
    m_ParamError = 0.001f;
    m_ParamLearnRate = 0.01f;
    m_ParamMomentumRate = 0.0f;
    //}}AFX_DATA_INIT
}

////////////////////////////////////////////////////////////////////
//
void NeuralNetDlg::DoDataExchange(CDataExchange* pDX)
{
    CDialog::DoDataExchange(pDX);
```

```
    //{{AFX_DATA_MAP(NeuralNetDlg)
    DDX_Control(pDX, IDC_TPARA_MSE, m_TParamMse);
    DDX_Text(pDX, IDC_DATASET_IN, m_InputDatasetFilename);
    DDV_MaxChars(pDX, m_InputDatasetFilename, 8);
    DDX_Text(pDX, IDC_DATASET_OUT, m_OutputDatasetFilename);
    DDV_MaxChars(pDX, m_OutputDatasetFilename, 8);
    DDX_Text(pDX, IDC_PARA_ITER, m_ParamIterationMax);
    DDV_MinMaxLong(pDX, m_ParamIterationMax, 1, 99999999);
    DDX_Text(pDX, IDC_WEIGHTS_IN, m_InputWeightsFilename);
    DDX_Text(pDX, IDC_WEIGHTS_OUT, m_OutputWeightsFilename);
    DDX_Text(pDX, IDC_PARA_ERROR, m_ParamError);
    DDX_Text(pDX, IDC_PARA_LEARN, m_ParamLearnRate);
    DDX_Text(pDX, IDC_PARA_MOM, m_ParamMomentumRate);
    //}}AFX_DATA_MAP
}

BEGIN_MESSAGE_MAP(NeuralNetDlg, CDialog)
    ON_MESSAGE(UM_UPDATE_MSE, OnUpdateTparaMse)

//{{AFX_MSG_MAP(NeuralNetDlg)
    ON_BN_CLICKED(IDC_PROP_BUTTON, OnPropButton)
    ON_BN_CLICKED(IDC_SIM_BUTTON, OnSimButton)
    ON_BN_CLICKED(IDC_TRAIN_BUTTON, OnTrainButton)
    //}}AFX_MSG_MAP
END_MESSAGE_MAP()

/////////////////////////////////////////////////////////////////////////////
// NeuralNetDlg message handlers
void NeuralNetDlg::CalcWindowRect(LPRECT lpClientRect, UINT nAdjustType)
{
    // TODO: Add your specialized code here and/or call the base class CDialog::CalcWindowRect(lpClientRect, nAdjustType);
}

/////////////////////////////////////////////////////////////////////////////
//
void NeuralNetDlg::OnPropButton()
{
}

/////////////////////////////////////////////////////////////////////////////
//
void NeuralNetDlg::OnSimButton()
{
//   CSimDlg dlg;
//   dlg.DoModal();
}

/////////////////////////////////////////////////////////////////////////////
//
void NeuralNetDlg::OnTrainButton()
{
    FILE *pfInputDatasetFilename, *pfInputWeightsFilename, *pfOutputWeightsFilename;

// Dialog -> nndlg.cpp
    UpdateData(TRUE);
```

```
    // Build entire filename
    CString TempName = m_InputDatasetFilename;
    m_InputDatasetFilename += MPM_FORMAT_EXT ;
    m_InputWeightsFilename += WEIGHT_EXT;
    m_OutputWeightsFilename += WEIGHT_EXT;

if( (pfInputDatasetFilename = fopen( LPCTSTR( m_InputDatasetFilename ),"rt")) != NULL
)
    {
        // Process the data, this produces a <DataSetFilename>.TRN file
        if( process( pfInputDatasetFilename, LPCTSTR(TempName) ) )
        {
            if( (pfInputWeightsFilename = fopen( LPCTSTR( m_InputWeightsFilename ),"rt"))
!= NULL )
            {
                if ( (pfOutputWeightsFilename = fopen( LPCTSTR( m_OutputWeightsFilename ),
"wt")) != NULL )
                {
                    TempName += TRAIN_EXT;

if( (pfInputDatasetFilename = fopen( LPCTSTR( TempName ),"rt")) != NUL
L )
                    {
                        ConfigData.epsilon = m_ParamError;
                        ConfigData.limit = m_ParamIterationMax;
                        ConfigData.rho = m_ParamLearnRate;
                        ConfigData.alpha = m_ParamMomentumRate;

//AfxBeginThread( RunNN, this );

nn( &ConfigData, CONVERGE_TRAIN, pfInputWeightsFilename,
                            pfOutputWeightsFilename, pfInputDatasetFilename, 1, &m_TParamMse);

//AfxEndThread( 0 );
                    }
                }
                else
                {

}
            }
            else
            {

}
        }
        else
        {

}
    }

}

///////////////////////////////////////////////////////////////////////////////
//
```

```
static UINT RunNN(LPVOID pParam)
{
    int x;
    CString S;

NeuralNetDlg *pNNDlg = (NeuralNetDlg *)pParam ;

for(x=0; x < 100; x++)
    {
        S.Format("%d", x);
        //pNNDlg->m_TParamMse.SetWindowText(S);
        pNNDlg->SetWindowText(S);

//pParam->SetWindowText(S);

Sleep(2000);
    } return 1;

}

////////////////////////////////////////////////////////////////////////////
//
LRESULT NeuralNetDlg::OnUpdateTparaMse(WPARAM wParam, LPARAM lParam)
{
    // TODO: Add your control notification handler code here return 0;
}
```

```
/////////////////////////////////////////////////////////////////////
//  File  : apcsgen.h
//
//  Description: header file for neural net and weight initialization code
//
//  Header:
//
//  Date  : 12/22/95
//
//  Author:
/////////////////////////////////////////////////////////////////////
//                          MPM Corp.
//                          16 Forge park
//                          Franklin, Ma 02038
//                          (508) 520-6999
//
//                          Copyright (c) 1995, 1996.
/////////////////////////////////////////////////////////////////////
#ifndef APCSGEN_H
define APCSGEN_H include "nn.h"

void w_rand_wts(FILE *);
void c_rand_wts(void);
void r_wts(FILE *, node_type *, int, int);
void save_wts(FILE *, node_type *, int, int);
void wb_rand_wts(FILE *);
void cb_rand_wts(void);
void rb_wts(FILE *, node_type *, int, int);
void saveb_wts(FILE *, node_type *, int, int);
int read_binary_float(float *, FILE *);
void w_mpm_form(FILE *, mpm_pad_data);
void r_mpm_pre(FILE *, mpm_pad_data *);
void r_mpm_form(FILE *, mpm_pad_data *);
int r_mpm_h(FILE *);
void w_mpm_h(FILE *, int);
void wb_nn_d(FILE *, pad_record_type, float *, float **, int, int, int);
void wb_nn_h(FILE *, int);
void rb_nn_d(FILE *, data_set *);
int rb_nn_h(FILE *);
void w_nn_d(FILE *, pad_record_type, float *, float **, int, int, int);
void w_nn_h(FILE *, int);
void r_nn_d(FILE *, data_set *, int, int);
int r_nn_h(FILE *);
void get_path(char *, char *);

#endif
```

```
////////////////////////////////////////////////////////////////////
// File   : expand.h
//
// Description: Header file to expand.cpp
//
// Header:
//
// Date   : 12/22/95
//
// Author:
////////////////////////////////////////////////////////////////////
//                          MPM Corp.
//                          16 Forge park
//                          Franklin, Ma 02038
//                          (508) 520-6999
//
//                          Copyright (c) 1995, 1996.
////////////////////////////////////////////////////////////////////
#ifndef EXPAND_H
define EXPAND_H float expand(float , int, int, int, int);

endif
```

APPENDIX B

| | | | | | |
|---|---|---|---|---|---|
| -0.010213 | -0.009487 | -0.010190 | -0.010581 | -0.011006 | -0.011174 |
| -0.011467 | -0.010863 | -0.010771 | -0.010649 | -0.011159 | -0.010552 |
| -0.011105 | -0.011520 | -0.011517 | -0.011536 | -0.011033 | -0.009698 |
| -0.009678 | -0.010020 | -0.009320 | -0.009701 | -0.008119 | -0.003928 |
| -0.003333 | -0.003080 | -0.002951 | -0.002793 | -0.002599 | -0.002710 |
| -0.003209 | -0.002711 | -0.002906 | -0.002926 | -0.003010 | -0.002497 |
| -0.003155 | -0.007555 | -0.009493 | -0.009396 | -0.009278 | -0.009007 |
| -0.005309 | 0.002391 | 0.003189 | 0.002700 | 0.003091 | 0.002674 |
| 0.003004 | 0.002436 | 0.003032 | 0.003072 | 0.003258 | 0.003230 |
| 0.002667 | 0.002340 | 0.000918 | -0.006393 | -0.008775 | -0.009355 |
| -0.009765 | -0.009831 | -0.006200 | 0.000191 | 0.001276 | 0.002119 |
| 0.001337 | 0.001406 | 0.001882 | 0.001934 | 0.002086 | 0.002021 |
| 0.001619 | 0.001230 | 0.001803 | 0.001556 | 0.000371 | -0.006283 |
| -0.009196 | -0.009388 | -0.009506 | -0.006800 | -0.006800 | 0.000043 |
| 0.001252 | 0.001102 | 0.000855 | 0.000901 | 0.001080 | 0.001390 |
| 0.000961 | 0.001228 | 0.001169 | 0.000882 | 0.000650 | 0.001214 |
| -0.000023 | -0.007396 | -0.009463 | -0.009332 | -0.009653 | -0.009161 |
| -0.007557 | -0.000555 | 0.000302 | -0.000042 | 0.000161 | -0.000215 |
| 0.000634 | 0.000533 | 0.000035 | 0.000640 | 0.000421 | 0.000100 |
| -0.000202 | -0.000129 | -0.000397 | -0.006600 | -0.009379 | -0.009068 |
| -0.009419 | -0.009728 | -0.007417 | -0.001313 | -0.000304 | -0.000288 |
| -0.000319 | -0.000532 | -0.000843 | -0.000633 | -0.000280 | -0.001280 |
| -0.000458 | -0.000157 | -0.000701 | -0.001115 | -0.001183 | -0.006656 |
| -0.009388 | -0.009765 | -0.009796 | -0.009825 | -0.006927 | -0.001678 |
| -0.000739 | -0.001035 | -0.000167 | -0.000818 | -0.000407 | -0.000654 |
| -0.001027 | -0.000362 | -0.000269 | -0.000738 | -0.000730 | -0.000363 |
| -0.002104 | -0.006547 | -0.009200 | -0.009746 | -0.009354 | -0.009776 |
| -0.006842 | -0.001419 | -0.000350 | -0.000791 | -0.000455 | -0.001264 |
| -0.001252 | -0.000410 | -0.000850 | -0.000439 | -0.001157 | -0.001129 |
| -0.001307 | -0.000703 | -0.001477 | -0.006914 | -0.009225 | -0.009073 |
| -0.009462 | -0.009976 | -0.007989 | -0.002322 | -0.000436 | -0.000180 |
| -0.000760 | -0.000856 | -0.000442 | -0.000831 | -0.000640 | -0.000268 |
| -0.000262 | -0.000493 | -0.000489 | -0.000945 | -0.001567 | -0.007607 |
| -0.009497 | -0.009885 | -0.009228 | -0.009706 | -0.007065 | -0.001200 |
| -0.000273 | -0.000853 | -0.000406 | 0.000018 | -0.000352 | -0.000208 |
| -0.000928 | -0.000668 | -0.000772 | 0.000065 | -0.000527 | -0.000121 |
| -0.002033 | -0.006817 | -0.009738 | -0.009716 | -0.009249 | -0.010029 |
| -0.006659 | -0.001314 | -0.000430 | 0.000016 | -0.000582 | -0.000787 |
| -0.000243 | -0.000238 | -0.000403 | -0.000445 | -0.000179 | -0.000105 |
| -0.000077 | 0.000024 | -0.000964 | -0.006754 | -0.009313 | -0.009441 |
| -0.009749 | -0.009277 | -0.006822 | -0.000027 | 0.000475 | 0.000419 |
| 0.000489 | 0.000547 | 0.000517 | 0.000013 | 0.000132 | -0.000060 |
| 0.000644 | 0.000442 | 0.000172 | 0.000296 | -0.000484 | -0.007330 |
| -0.009437 | -0.009089 | -0.009200 | -0.009371 | -0.006538 | -0.000859 |
| 0.000950 | 0.001371 | 0.000704 | 0.001025 | 0.000856 | 0.000639 |
| 0.000509 | 0.001223 | 0.001243 | 0.001107 | 0.000369 | 0.000650 |
| -0.000547 | -0.007268 | -0.009336 | -0.008876 | -0.009446 | -0.009588 |
| -0.006647 | 0.000474 | 0.002086 | 0.002272 | 0.001644 | 0.001678 |
| 0.002017 | 0.001303 | 0.001857 | 0.002387 | 0.002288 | 0.002096 |
| 0.001636 | 0.002552 | 0.000806 | -0.006781 | -0.009104 | -0.009192 |
| -0.009664 | -0.009202 | -0.006541 | 0.002607 | 0.004013 | 0.003868 |
| 0.003474 | 0.003815 | 0.003503 | 0.003279 | 0.003945 | 0.003936 |
| 0.003921 | 0.003326 | 0.003833 | 0.003859 | 0.002683 | -0.005504 |
| -0.009282 | -0.009338 | -0.009456 | -0.009470 | -0.005226 | 0.004350 |
| 0.005269 | 0.005738 | 0.005489 | 0.006072 | 0.006219 | 0.005652 |
| 0.005936 | 0.005965 | 0.005560 | 0.005818 | 0.005806 | 0.005654 |
| 0.004611 | -0.005213 | -0.009605 | -0.009352 | -0.009780 | -0.009465 |
| -0.004965 | 0.005412 | 0.006712 | 0.007057 | 0.006823 | 0.007429 |
| 0.006940 | 0.007688 | 0.007828 | 0.007771 | 0.007519 | 0.007394 |
| 0.006663 | 0.006845 | 0.005729 | -0.004974 | -0.009974 | -0.010447 |

- 56 -

| | ω | | | | O |
|---|---|---|---|---|---|
| -0.009903 | -0.009217 | -0.008341 | -0.002491 | -0.001878 | 0.001771 |
| -0.001483 | -0.001413 | -0.001685 | -0.001781 | -0.001530 | -0.001118 |
| -0.001959 | -0.001526 | -0.001666 | -0.001839 | -0.002819 | -0.006982 |
| -0.009805 | -0.009435 | -0.009709 | -0.009933 | -0.009931 | -0.010900 |
| -0.010981 | -0.011270 | -0.010696 | -0.011220 | -0.010822 | -0.010529 |
| -0.010572 | -0.010762 | -0.010563 | -0.010495 | -0.010720 | -0.010517 |
| -0.011356 | -0.009956 | -0.010084 | -0.009756 | 0.002296 | -0.009639 |
| -0.010365 | -0.010429 | -0.010459 | -0.010634 | -0.010998 | -0.011019 |
| -0.010352 | -0.010863 | -0.010800 | -0.010782 | -0.010036 | -0.011143 |
| -0.011302 | -0.011140 | -0.010664 | -0.009806 | -0.009840 | -0.009750 |
| -0.009497 | -0.009730 | -0.009898 | -0.007872 | -0.004133 | -0.003869 |
| -0.004089 | -0.004350 | -0.003704 | -0.003127 | -0.003775 | -0.003981 |
| -0.003639 | -0.004000 | -0.003502 | -0.003032 | -0.003592 | -0.003915 |
| -0.008790 | -0.009385 | -0.009447 | -0.009672 | -0.009490 | -0.006756 |
| 0.000334 | 0.001627 | 0.001226 | 0.001665 | 0.001168 | 0.001514 |
| 0.001759 | 0.000996 | 0.001746 | 0.001602 | 0.001609 | 0.001620 |
| 0.001244 | 0.000187 | -0.007139 | -0.009308 | -0.009073 | -0.009719 |
| -0.010239 | -0.006425 | 0.000126 | 0.001345 | 0.000709 | 0.001003 |
| 0.001443 | 0.000697 | 0.000902 | 0.000771 | 0.001625 | 0.001155 |
| 0.000750 | 0.001371 | 0.000837 | 0.000033 | -0.007332 | -0.010077 |
| -0.009659 | -0.009870 | -0.009635 | -0.007664 | -0.000019 | 0.000779 |
| 0.000505 | 0.001133 | 0.000498 | 0.001297 | 0.001027 | 0.001012 |
| 0.000204 | 0.000566 | 0.000198 | 0.000912 | 0.000371 | -0.000374 |
| -0.007375 | -0.009441 | -0.010160 | -0.009894 | -0.010169 | -0.007641 |
| -0.001527 | -0.000006 | 0.000303 | 0.000440 | -0.000355 | 0.000132 |
| 0.000154 | 0.000201 | 0.000369 | -0.000205 | 0.000198 | 0.000000 |
| -0.000425 | -0.000849 | -0.006818 | -0.009481 | -0.009038 | -0.009989 |
| -0.009893 | -0.007460 | -0.001889 | -0.000882 | -0.001014 | -0.001298 |
| -0.000465 | -0.000988 | -0.001239 | -0.001007 | -0.000858 | -0.001178 |
| -0.000991 | -0.001297 | -0.000837 | -0.001890 | -0.007234 | -0.009492 |
| -0.009860 | -0.009822 | -0.010060 | -0.007203 | -0.001745 | -0.001295 |
| -0.000602 | -0.000555 | -0.001012 | -0.000440 | -0.001317 | -0.000597 |
| -0.000849 | -0.001002 | -0.000847 | -0.000801 | -0.001444 | -0.002066 |
| -0.007591 | -0.009744 | -0.009250 | -0.009554 | -0.009550 | -0.007065 |
| -0.002004 | -0.000960 | -0.000405 | -0.001294 | -0.001290 | -0.001068 |
| -0.001123 | -0.000734 | -0.000883 | -0.000937 | -0.000965 | -0.001582 |
| -0.001531 | -0.002315 | -0.007215 | -0.009228 | -0.009804 | -0.009573 |
| -0.010310 | -0.007348 | -0.002418 | -0.000987 | -0.000664 | -0.000858 |
| -0.000580 | -0.001143 | -0.001060 | -0.000999 | -0.001014 | -0.000933 |
| -0.001124 | -0.000598 | -0.001158 | -0.001898 | -0.008015 | -0.009821 |
| -0.009722 | -0.009889 | -0.009623 | -0.007323 | -0.001310 | -0.000556 |
| -0.001107 | -0.000591 | -0.001129 | -0.000283 | -0.000862 | -0.000333 |
| -0.000464 | -0.000602 | -0.000437 | -0.000942 | -0.001951 | |
| -0.007713 | -0.009388 | -0.010279 | -0.010382 | -0.010067 | -0.007024 |
| -0.001574 | -0.000516 | -0.000452 | -0.001149 | -0.000702 | -0.000523 |
| -0.000420 | -0.000280 | -0.000669 | -0.000612 | -0.000081 | -0.000110 |
| -0.000334 | -0.000811 | -0.007693 | -0.009656 | -0.009320 | -0.009892 |
| -0.010042 | -0.007359 | -0.001096 | 0.000647 | 0.000408 | -0.000311 |
| -0.000314 | 0.000226 | 0.000358 | 0.000093 | 0.000093 | 0.000485 |
| 0.000334 | 0.000303 | 0.000418 | -0.000817 | -0.007133 | -0.010306 |
| -0.009546 | -0.009969 | -0.009761 | -0.006931 | -0.000327 | 0.001103 |
| 0.001015 | 0.000619 | 0.000349 | 0.000718 | 0.000703 | 0.000537 |
| 0.001044 | 0.000675 | 0.001146 | 0.000296 | 0.001019 | -0.000059 |
| -0.006674 | -0.010157 | -0.009583 | -0.009337 | -0.009568 | -0.006308 |
| 0.000375 | 0.002456 | 0.002430 | 0.002349 | 0.002153 | 0.002156 |
| 0.001667 | 0.001235 | 0.001930 | 0.001586 | 0.001569 | 0.002070 |
| 0.002334 | 0.000693 | -0.006356 | -0.009724 | -0.010029 | -0.009763 |
| -0.009561 | -0.006722 | 0.001746 | 0.003616 | 0.003689 | 0.003800 |
| 0.003156 | 0.003633 | 0.003719 | 0.002798 | 0.003728 | 0.003719 |
| 0.003171 | 0.003138 | 0.003410 | 0.002466 | -0.005778 | -0.009536 |

| | | | | | |
|---|---|---|---|---|---|
| | | | | 0\_0 | D\_0 |
| -0.009636 | -0.009731 | -0.0...090 | -0.005665 | 0.003236 | 04500 |
| 0.005105 | 0.004704 | 0.004489 | 0.005165 | 0.004425 | 0.004328 |
| 0.004457 | 0.004567 | 0.004747 | 0.004646 | 0.004767 | 0.003243 |
| -0.006227 | -0.009578 | -0.009364 | -0.009905 | -0.009763 | -0.005599 |
| 0.003722 | 0.005489 | 0.005028 | 0.005479 | 0.005338 | 0.005556 |
| 0.005988 | 0.005718 | 0.005538 | 0.005656 | 0.005551 | 0.005653 |
| 0.005841 | 0.004303 | -0.005960 | -0.009600 | -0.010030 | -0.009584 |
| -0.009351 | -0.007444 | -0.002840 | -0.002252 | -0.002410 | -0.002718 |
| -0.002751 | -0.003063 | -0.002955 | -0.002441 | -0.002608 | -0.002907 |
| -0.003099 | -0.002390 | -0.002301 | -0.003816 | -0.008249 | -0.009835 |
| -0.009500 | -0.009636 | -0.010282 | -0.010422 | -0.010831 | -0.010606 |
| -0.010983 | -0.010148 | -0.010365 | -0.010745 | -0.010109 | -0.010516 |
| -0.010759 | -0.010985 | -0.010609 | -0.010437 | -0.010407 | -0.010474 |
| -0.010807 | -0.009704 | -0.010183 | 0.002438 | -0.008053 | -0.007533 |
| -0.007881 | -0.007971 | -0.007992 | -0.007632 | -0.007978 | -0.007739 |
| -0.007486 | -0.007539 | -0.006536 | -0.006914 | -0.008326 | -0.008533 |
| -0.007970 | -0.007321 | -0.007148 | -0.007134 | -0.007435 | -0.007711 |
| -0.008170 | -0.008346 | -0.005132 | 0.001413 | 0.002771 | 0.002820 |
| 0.002039 | 0.002401 | 0.002549 | 0.002672 | 0.002294 | 0.002534 |
| 0.002663 | 0.002667 | 0.002992 | 0.003033 | 0.002245 | -0.005343 |
| -0.007697 | -0.007306 | -0.008311 | -0.007291 | -0.002864 | 0.007714 |
| 0.009051 | 0.009138 | 0.009327 | 0.008388 | 0.008115 | 0.008463 |
| 0.008968 | 0.008662 | 0.008589 | 0.008139 | 0.008346 | 0.007538 |
| 0.006265 | -0.003443 | -0.007515 | -0.007769 | -0.007542 | -0.008038 |
| -0.004260 | 0.002786 | 0.003937 | 0.004251 | 0.004037 | 0.004244 |
| 0.004798 | 0.004195 | 0.004215 | 0.004391 | 0.004484 | 0.003679 |
| 0.004093 | 0.004032 | 0.002901 | -0.005476 | -0.008655 | -0.007402 |
| -0.008282 | -0.008817 | -0.005452 | 0.001366 | 0.002651 | 0.002433 |
| 0.002596 | 0.002555 | 0.002829 | 0.002565 | 0.002516 | 0.001763 |
| 0.001996 | 0.002013 | 0.002817 | 0.002599 | 0.000948 | -0.006219 |
| -0.007922 | -0.007459 | -0.008289 | -0.008389 | -0.005772 | -0.000861 |
| 0.000435 | 0.000655 | 0.000403 | 0.001017 | 0.000825 | 0.001540 |
| 0.001469 | 0.001302 | 0.001014 | 0.001052 | 0.001041 | 0.000750 |
| 0.000428 | -0.005131 | -0.006776 | -0.007200 | -0.008006 | -0.008040 |
| -0.005843 | -0.001169 | 0.000138 | -0.000140 | 0.000693 | -0.000236 |
| -0.000270 | -0.000085 | -0.000427 | -0.000936 | -0.000323 | 0.000855 |
| 0.000440 | 0.000343 | -0.001469 | -0.005903 | -0.008095 | -0.008036 |
| -0.008218 | -0.008325 | -0.005925 | -0.000986 | -0.000195 | -0.001003 |
| 0.000034 | 0.000036 | -0.000041 | -0.000696 | -0.000081 | 0.000285 |
| 0.000203 | 0.000055 | -0.000445 | 0.000099 | -0.000907 | -0.006147 |
| -0.007658 | -0.007976 | -0.007472 | -0.007706 | -0.005875 | -0.001233 |
| 0.000308 | 0.000047 | 0.000248 | -0.000118 | -0.000523 | -0.000373 |
| -0.000115 | -0.000333 | -0.001052 | -0.000580 | -0.001038 | -0.000291 |
| -0.001110 | -0.006090 | -0.007942 | -0.008012 | -0.007093 | -0.008478 |
| -0.006643 | -0.001429 | -0.000254 | -0.000294 | 0.000569 | 0.000014 |
| -0.000729 | -0.000200 | 0.000469 | -0.000130 | -0.000560 | -0.000753 |
| -0.000438 | 0.000207 | -0.001414 | -0.006056 | -0.007633 | -0.008474 |
| -0.006804 | -0.008047 | -0.005752 | -0.001350 | -0.000645 | -0.000795 |
| -0.000609 | 0.000050 | 0.000042 | -0.000160 | -0.000232 | -0.000312 |
| -0.000728 | -0.000540 | -0.000671 | -0.000748 | -0.001560 | -0.005841 |
| -0.007142 | -0.007958 | -0.008135 | -0.007720 | -0.005899 | -0.000524 |
| 0.000364 | 0.000073 | -0.000218 | -0.000333 | -0.001054 | -0.000753 |
| -0.000760 | -0.000784 | 0.000271 | 0.000044 | -0.000499 | -0.000844 |
| -0.000550 | -0.005432 | -0.007461 | -0.007115 | -0.008394 | -0.007696 |
| -0.005669 | 0.000127 | 0.001437 | 0.001413 | 0.000095 | 0.000742 |
| 0.000477 | -0.000254 | -0.000135 | 0.000138 | 0.000020 | 0.000668 |
| -0.000390 | -0.000543 | -0.000544 | -0.005232 | -0.007846 | -0.007916 |
| -0.007863 | -0.007914 | -0.005357 | -0.000340 | 0.000879 | 0.000727 |
| 0.001034 | 0.001479 | 0.001290 | 0.001076 | 0.000505 | 0.000787 |
| 0.000602 | 0.000622 | -0.000260 | 0.000397 | -0.000391 | -0.006216 |

- 58 -

| | | | | | |
|---|---|---|---|---|---|
| -0.007979 | -0.006907 | -0.0...231 | -0.007470 | -0.005856 | 00656 |
| 0.002393 | 0.002477 | 0.001734 | 0.001831 | 0.001516 | 0.001178 |
| 0.001280 | 0.001883 | 0.002513 | 0.001538 | 0.001530 | 0.002107 |
| 0.001938 | -0.005408 | -0.007700 | -0.007493 | -0.007804 | -0.008264 |
| -0.005124 | 0.001657 | 0.002513 | 0.003121 | 0.002330 | 0.002469 |
| 0.003493 | 0.002275 | 0.002890 | 0.003340 | 0.002986 | 0.001910 |
| 0.003059 | 0.003039 | 0.002936 | -0.004391 | -0.007958 | -0.007700 |
| -0.008066 | -0.007669 | -0.004555 | 0.003458 | 0.003876 | 0.004011 |
| 0.004025 | 0.004336 | 0.003815 | 0.003192 | 0.003801 | 0.004523 |
| 0.003802 | 0.003508 | 0.003490 | 0.003679 | 0.002638 | -0.004353 |
| -0.007798 | -0.007263 | -0.007949 | -0.008480 | -0.005674 | 0.004247 |
| 0.005397 | 0.004780 | 0.005197 | 0.004896 | 0.005219 | 0.005709 |
| 0.005893 | 0.004970 | 0.005045 | 0.004678 | 0.005302 | 0.005297 |
| 0.004128 | -0.004501 | -0.008269 | -0.009350 | -0.008015 | -0.007798 |
| -0.006196 | -0.003731 | -0.002823 | -0.003649 | -0.002835 | -0.002496 |
| -0.002756 | -0.003363 | -0.003163 | -0.002370 | -0.002658 | -0.003556 |
| -0.002936 | -0.002429 | -0.002884 | -0.006630 | -0.008078 | -0.008062 |
| -0.008506 | -0.008541 | -0.009876 | -0.011237 | -0.012697 | -0.012324 |
| -0.012989 | -0.012828 | -0.012427 | -0.012571 | -0.012487 | -0.012117 |
| -0.013032 | -0.012912 | -0.012369 | -0.012810 | -0.012809 | -0.009878 |
| -0.008613 | -0.007940 | 0.002084 | -0.010346 | -0.009960 | -0.010015 |
| -0.009681 | -0.010112 | -0.009867 | -0.010102 | -0.010074 | -0.010149 |
| -0.009700 | -0.010212 | -0.009676 | -0.010607 | -0.010058 | -0.010098 |
| -0.010472 | -0.009587 | -0.009668 | -0.010035 | -0.010486 | -0.010573 |
| -0.010013 | -0.007734 | -0.004218 | -0.003710 | -0.003593 | -0.002984 |
| -0.002893 | -0.002770 | -0.002988 | -0.002904 | -0.002904 | -0.002766 |
| -0.002779 | -0.003162 | -0.002962 | -0.004294 | -0.008619 | -0.010334 |
| -0.009726 | -0.009770 | -0.009682 | -0.006684 | 0.000623 | 0.001659 |
| 0.002212 | 0.001639 | 0.001385 | 0.001593 | 0.001490 | 0.001968 |
| 0.001318 | 0.002069 | 0.001269 | 0.001061 | 0.001115 | 0.000517 |
| -0.006989 | -0.009433 | -0.009455 | -0.009982 | -0.009634 | -0.006480 |
| 0.000257 | 0.001387 | 0.000518 | 0.000420 | 0.000878 | 0.001255 |
| 0.001336 | 0.000525 | 0.001354 | 0.001181 | 0.000659 | 0.000821 |
| 0.000954 | -0.000388 | -0.007341 | -0.009311 | -0.008945 | -0.009702 |
| -0.009979 | -0.007565 | -0.000982 | 0.000287 | 0.000755 | 0.000596 |
| 0.000450 | 0.000320 | 0.000500 | 0.000593 | 0.000679 | 0.000526 |
| 0.000929 | 0.000167 | 0.000527 | -0.006877 | -0.009805 | -0.009982 |
| -0.009911 | -0.009650 | -0.009830 | -0.007627 | -0.001488 | -0.000626 |
| -0.000461 | -0.000451 | 0.000213 | -0.000049 | 0.000172 | 0.000046 |
| -0.000010 | -0.000564 | -0.000136 | -0.000761 | -0.000032 | -0.000802 |
| -0.007114 | -0.009895 | -0.009531 | -0.010531 | -0.009668 | -0.007418 |
| -0.001687 | -0.000745 | -0.000858 | -0.000640 | -0.000707 | -0.000571 |
| -0.000633 | -0.000620 | -0.000917 | -0.000491 | -0.000491 | -0.001538 |
| -0.001152 | -0.002408 | -0.007408 | -0.009998 | -0.010308 | -0.010298 |
| -0.009505 | -0.007563 | -0.001729 | -0.001444 | -0.001215 | -0.000488 |
| -0.000564 | -0.001129 | -0.001295 | -0.001249 | -0.001419 | -0.000487 |
| -0.001334 | -0.001487 | -0.001312 | -0.002095 | -0.007111 | -0.009543 |
| -0.010088 | -0.010009 | -0.010175 | -0.007751 | -0.001807 | -0.001113 |
| -0.000623 | -0.001443 | -0.001186 | -0.000844 | -0.001090 | -0.001365 |
| -0.001322 | -0.000968 | -0.000816 | -0.001127 | -0.000814 | -0.002467 |
| -0.007122 | -0.009178 | -0.009556 | -0.009497 | -0.009871 | -0.007682 |
| -0.002372 | -0.000443 | -0.001003 | -0.001156 | -0.000931 | -0.000890 |
| -0.000629 | -0.000175 | -0.000681 | -0.000304 | -0.000974 | -0.000485 |
| -0.001008 | -0.002151 | -0.007487 | -0.010171 | -0.010128 | -0.009412 |
| -0.009354 | -0.007705 | -0.000968 | -0.000625 | -0.000109 | -0.000329 |
| -0.000830 | -0.000842 | -0.000849 | -0.000652 | -0.000774 | -0.000784 |
| -0.000891 | -0.000963 | -0.000488 | -0.001390 | -0.007076 | -0.009394 |
| -0.010465 | -0.010021 | -0.009825 | -0.006864 | -0.001334 | -0.000047 |
| -0.000013 | -0.000113 | -0.000066 | -0.000030 | -0.000243 | -0.000561 |
| -0.000125 | -0.000645 | -0.000213 | -0.000213 | -0.000405 | -0.000666 |

| | | | | | |
|---|---|---|---|---|---|
| -0.007632 | -0.009844 | -0.  163 | -0.009649 | -0.010124 | 007432 |
| -0.000686 | 0.000457 | 0.001094 | 0.000636 | -0.000091 | 0.000471 |
| -0.000232 | 0.000642 | -0.000021 | 0.000535 | 0.000894 | 0.000258 |
| 0.000605 | -0.000824 | -0.007287 | -0.009985 | -0.009727 | -0.009662 |
| -0.009442 | -0.007199 | -0.000703 | 0.001124 | 0.000624 | 0.001165 |
| 0.001004 | 0.001656 | 0.001210 | 0.000742 | 0.000911 | 0.000888 |
| 0.001152 | 0.001210 | 0.000526 | -0.000381 | -0.007139 | -0.010077 |
| -0.009806 | -0.009455 | -0.009525 | -0.006918 | 0.000605 | 0.002387 |
| 0.002376 | 0.002664 | 0.002005 | 0.001892 | 0.001697 | 0.001687 |
| 0.002179 | 0.002483 | 0.001925 | 0.001986 | 0.002764 | 0.001284 |
| -0.006598 | -0.009616 | -0.009352 | -0.010515 | -0.010305 | -0.006648 |
| 0.001664 | 0.003527 | 0.003841 | 0.003832 | 0.003455 | 0.003157 |
| 0.003499 | 0.003090 | 0.003545 | 0.003990 | 0.003598 | 0.004182 |
| 0.003523 | 0.002059 | -0.006080 | -0.009854 | -0.010015 | -0.009958 |
| -0.009580 | -0.006239 | 0.003950 | 0.004633 | 0.004984 | 0.004892 |
| 0.004650 | 0.004663 | 0.004710 | 0.004559 | 0.004835 | 0.004963 |
| 0.004911 | 0.004658 | 0.004751 | 0.003539 | -0.005602 | -0.010053 |
| -0.010011 | -0.009502 | -0.009620 | -0.005945 | 0.003372 | 0.005197 |
| 0.004892 | 0.005226 | 0.005050 | 0.005252 | 0.005848 | 0.005282 |
| 0.005567 | 0.005042 | 0.004978 | 0.004857 | 0.005057 | 0.003509 |
| -0.006171 | -0.010184 | -0.010673 | -0.009890 | -0.009254 | -0.007506 |
| -0.003554 | -0.002576 | -0.003485 | -0.003110 | -0.003070 | -0.002819 |
| -0.003406 | -0.002668 | -0.003090 | -0.003113 | -0.002621 | -0.002567 |
| -0.002772 | -0.003364 | -0.008443 | -0.009987 | -0.009929 | -0.009570 |
| -0.009641 | -0.010239 | -0.010671 | -0.011253 | -0.010650 | -0.011202 |
| -0.011465 | -0.010511 | -0.011493 | -0.011432 | -0.011372 | -0.010917 |
| -0.010883 | -0.010927 | -0.011459 | -0.010775 | -0.010947 | -0.010577 |
| -0.009449 | 0.002225 | -0.009750 | -0.010121 | -0.010363 | -0.010706 |
| -0.010548 | -0.010738 | -0.010629 | -0.010573 | -0.010981 | -0.010585 |
| -0.010171 | -0.010973 | -0.010449 | -0.011041 | -0.011194 | -0.011114 |
| -0.010653 | -0.009990 | -0.009877 | -0.010154 | -0.009524 | -0.009737 |
| -0.007846 | -0.004311 | -0.003359 | -0.003234 | -0.003223 | -0.003093 |
| -0.003014 | -0.003697 | -0.003900 | -0.003945 | -0.003123 | -0.003822 |
| -0.002858 | -0.003445 | -0.003636 | -0.008301 | -0.009886 | -0.009237 |
| -0.009496 | -0.009556 | -0.006270 | 0.001125 | 0.001855 | 0.002045 |
| 0.002118 | 0.002221 | 0.001955 | 0.001959 | 0.001725 | 0.002070 |
| 0.001803 | 0.001502 | 0.001465 | 0.001063 | 0.000678 | -0.006369 |
| -0.009495 | -0.009350 | -0.010197 | -0.007134 | 0.000453 | |
| 0.000980 | 0.001112 | 0.000667 | 0.001441 | 0.001323 | 0.001473 |
| 0.000892 | 0.001173 | 0.001366 | 0.000949 | 0.001138 | 0.001329 |
| -0.000425 | -0.007166 | -0.009167 | -0.009033 | -0.010085 | -0.009589 |
| -0.007666 | -0.000176 | 0.000375 | 0.000562 | 0.000436 | 0.000879 |
| 0.000888 | 0.000778 | 0.000346 | 0.000040 | 0.000388 | 0.000238 |
| 0.000563 | 0.000382 | -0.000529 | -0.006809 | -0.009824 | -0.009787 |
| -0.009032 | -0.009352 | -0.007730 | -0.001439 | 0.000042 | -0.000139 |
| -0.000241 | -0.000238 | -0.000143 | 0.000317 | 0.000055 | -0.000504 |
| 0.000116 | -0.000229 | -0.000604 | -0.000109 | -0.000558 | -0.006567 |
| -0.009279 | -0.009358 | -0.009474 | -0.009822 | -0.007582 | -0.001302 |
| -0.000662 | -0.001282 | -0.000884 | -0.001204 | -0.000952 | -0.000801 |
| -0.000653 | -0.001154 | -0.000438 | -0.000480 | -0.001050 | -0.001186 |
| -0.001951 | -0.007180 | -0.009690 | -0.009536 | -0.009860 | -0.009878 |
| -0.007147 | -0.002175 | -0.001543 | -0.001512 | -0.001452 | -0.001240 |
| -0.001230 | -0.001156 | -0.000846 | -0.001027 | -0.001362 | -0.000980 |
| -0.000705 | -0.000752 | -0.002190 | -0.006861 | -0.009700 | -0.009856 |
| -0.009540 | -0.010158 | -0.006932 | -0.001900 | -0.001014 | -0.001338 |
| -0.001426 | -0.000856 | -0.001122 | -0.001370 | -0.001500 | -0.001158 |
| -0.000820 | -0.001117 | -0.001556 | -0.001384 | -0.001677 | -0.007731 |
| -0.009603 | -0.009535 | -0.009636 | -0.009986 | -0.007584 | -0.002439 |
| -0.001295 | -0.000848 | -0.000453 | -0.000846 | -0.000961 | -0.000501 |
| -0.000645 | -0.000490 | -0.000932 | -0.000572 | -0.001234 | -0.000680 |

| | | | | | |
|---|---|---|---|---|---|
| -0.002163 | -0.007768 | -0.010260 | -0.010253 | -0.009269 | -0.009369 |
| -0.007392 | -0.001551 | -0.000517 | -0.000855 | -0.000563 | -0.001147 |
| -0.000496 | -0.001033 | -0.000498 | -0.000737 | -0.000236 | -0.000791 |
| -0.000529 | -0.000758 | -0.002009 | -0.006878 | -0.009215 | -0.010280 |
| -0.009614 | -0.009921 | -0.007521 | -0.001012 | -0.000118 | -0.000739 |
| -0.000675 | -0.001063 | -0.000997 | -0.000345 | -0.000698 | -0.000868 |
| -0.000861 | -0.000449 | -0.000900 | -0.000709 | -0.001605 | -0.007014 |
| -0.009400 | -0.009383 | -0.009506 | -0.010171 | -0.007260 | -0.000203 |
| 0.000320 | 0.000288 | -0.000220 | -0.000003 | -0.000003 | 0.000394 |
| -0.000361 | -0.000107 | 0.000337 | 0.000427 | -0.000002 | -0.000260 |
| -0.000729 | -0.007334 | -0.009537 | -0.010202 | -0.009626 | -0.009606 |
| -0.007337 | -0.000233 | 0.000612 | 0.000824 | 0.001082 | 0.000880 |
| 0.000898 | 0.000341 | 0.000915 | 0.000767 | 0.000605 | 0.000815 |
| 0.000869 | 0.000256 | -0.000720 | -0.006976 | -0.009478 | -0.009687 |
| -0.009340 | -0.009391 | -0.006487 | 0.000447 | 0.002076 | 0.002032 |
| 0.001471 | 0.001657 | 0.001316 | 0.001624 | 0.001137 | 0.001970 |
| 0.001955 | 0.002010 | 0.002175 | 0.002278 | 0.001106 | -0.006728 |
| -0.009965 | -0.009699 | -0.009734 | -0.009343 | -0.006281 | 0.001712 |
| 0.003886 | 0.003869 | 0.003466 | 0.003518 | 0.003929 | 0.003135 |
| 0.003757 | 0.003374 | 0.003707 | 0.003261 | 0.004110 | 0.004110 |
| 0.002347 | -0.005862 | -0.009903 | -0.009219 | -0.009673 | -0.010117 |
| -0.005504 | 0.003495 | 0.004806 | 0.005113 | 0.005701 | 0.005516 |
| 0.005568 | 0.005088 | 0.005440 | 0.005605 | 0.005105 | 0.005082 |
| 0.005308 | 0.004777 | 0.003835 | -0.005994 | -0.009580 | -0.009323 |
| -0.009410 | -0.009486 | -0.005380 | 0.003775 | 0.005880 | 0.006156 |
| 0.006086 | 0.006114 | 0.006475 | 0.006301 | 0.006170 | 0.006630 |
| 0.006018 | 0.006144 | 0.005518 | 0.005642 | 0.004964 | -0.005984 |
| -0.009966 | -0.010497 | -0.009801 | -0.009614 | -0.007719 | -0.002886 |
| -0.002562 | -0.002711 | -0.002221 | -0.001908 | -0.001900 | -0.002485 |
| -0.002475 | -0.002401 | -0.001726 | -0.001983 | -0.002312 | -0.001963 |
| -0.002915 | -0.007539 | -0.009201 | -0.009383 | -0.010107 | -0.010215 |
| -0.009964 | -0.010187 | -0.010448 | -0.011075 | -0.010679 | -0.010601 |
| -0.009885 | -0.010219 | -0.010540 | -0.011014 | -0.010964 | -0.010644 |
| -0.010397 | -0.010522 | -0.011298 | -0.010440 | -0.010344 | -0.009212 |
| 0.002530 | 0.035988 | 0.019351 | -0.005081 | -0.041731 | -0.058341 |
| -0.063973 | -0.052447 | -0.048567 | -0.047551 | -0.021696 | -0.023395 |
| -0.054109 | -0.061127 | -0.049706 | -0.055946 | -0.056610 | -0.056610 |
| 0.003909 | 0.006444 | -0.034378 | -0.018449 | 0.028889 | 0.049028 |
| 0.029766 | 0.015432 | 0.008666 | 0.019999 | 0.018177 | 0.008422 |
| -0.000167 | -0.004853 | -0.003524 | 0.009300 | 0.016974 | 0.010931 |
| 0.007754 | 0.008312 | 0.020948 | 0.007858 | -0.023070 | -0.025547 |
| -0.000388 | -0.016171 | -0.089444 | -0.118176 | -0.131896 | -0.125834 |
| -0.133290 | -0.144019 | -0.117372 | -0.111415 | -0.126185 | -0.103459 |
| -0.093036 | -0.112790 | -0.137667 | -0.139364 | -0.019162 | 0.044660 |
| 0.069227 | 0.053386 | 0.034094 | 0.009921 | -0.021301 | -0.046265 |
| -0.059626 | -0.039706 | -0.035202 | -0.037423 | -0.029327 | -0.020357 |
| -0.009086 | -0.004548 | -0.012309 | -0.040836 | -0.055828 | -0.050691 |
| 0.027944 | 0.042733 | 0.011326 | 0.019811 | -0.036374 | -0.059914 |
| -0.037155 | -0.053871 | -0.065362 | -0.038795 | -0.041571 | -0.056854 |
| -0.033921 | -0.028901 | -0.040821 | -0.013149 | -0.003187 | -0.035639 |
| -0.032240 | -0.014338 | 0.013153 | 0.030281 | 0.041745 | 0.012404 |
| -0.008886 | -0.017272 | -0.007177 | -0.017751 | -0.030783 | -0.040309 |
| -0.044593 | -0.044700 | -0.023784 | -0.029031 | -0.059164 | -0.032201 |
| -0.017005 | -0.038558 | -0.041624 | -0.033918 | -0.004386 | 0.024843 |
| 0.053827 | 0.009869 | 0.008398 | 0.016110 | 0.036606 | 0.031711 |
| 0.020626 | 0.007161 | 0.009308 | 0.018327 | 0.019760 | 0.024991 |
| 0.034405 | 0.018498 | 0.013770 | 0.034618 | 0.027852 | 0.017022 |
| 0.034365 | 0.026174 | 0.000450 | 0.001206 | 0.000568 | 0.029159 |
| 0.099956 | 0.075917 | 0.053835 | 0.090073 | 0.089396 | 0.070950 |
| 0.078990 | 0.082139 | 0.080919 | 0.078313 | 0.079781 | 0.089573 |

| | | | | | |
|---|---|---|---|---|---|
| 0.099069 | 0.096290 | 0.032847 | 0.011727 | 0.019671 | 0.081676 |
| 0.044997 | 0.076171 | 0.201370 | 0.205970 | 0.192587 | 0.197514 |
| 0.202083 | 0.205991 | 0.189459 | 0.185094 | 0.190638 | 0.159022 |
| 0.148644 | 0.184758 | 0.205653 | 0.191438 | 0.031447 | -0.009720 |
| 0.033721 | -0.010062 | -0.006834 | 0.047623 | 0.172202 | 0.196725 |
| 0.200550 | 0.203815 | 0.196984 | 0.187553 | 0.191770 | 0.192201 |
| 0.189046 | 0.209482 | 0.221118 | 0.210676 | 0.186026 | 0.143782 |
| 0.042073 | -0.000107 | 0.000709 | 0.019742 | 0.022237 | 0.062477 |
| 0.153907 | 0.178142 | 0.192626 | 0.212760 | 0.229102 | 0.239726 |
| 0.210342 | 0.197595 | 0.200878 | 0.203042 | 0.189859 | 0.145085 |
| 0.175673 | 0.200984 | 0.071248 | 0.008869 | -0.005927 | -0.003021 |
| 0.009189 | 0.066401 | 0.185798 | 0.173204 | 0.155781 | 0.200534 |
| 0.208117 | 0.200335 | 0.205644 | 0.190673 | 0.157251 | 0.186396 |
| 0.202994 | 0.185181 | 0.186226 | 0.175367 | 0.063545 | 0.009639 |
| -0.003195 | 0.025799 | 0.025186 | 0.050465 | 0.109024 | 0.094085 |
| 0.074995 | 0.084376 | 0.106029 | 0.131549 | 0.147085 | 0.129384 |
| 0.078836 | 0.088547 | 0.095166 | 0.085751 | 0.071207 | 0.056097 |
| 0.045571 | 0.022688 | -0.009663 | 0.002882 | 0.036132 | 0.059620 |
| 0.067616 | 0.031824 | 0.002118 | 0.018354 | 0.030757 | 0.041477 |
| 0.067299 | 0.060583 | 0.022610 | 0.046953 | 0.056157 | 0.028119 |
| 0.026646 | 0.034843 | 0.039730 | 0.030813 | 0.011313 | -0.021160 |
| 0.016485 | 0.035436 | 0.029982 | 0.006759 | -0.014430 | -0.018076 |
| -0.019789 | -0.020589 | -0.017468 | -0.019986 | -0.028379 | -0.020189 |
| -0.011303 | -0.003870 | 0.001072 | 0.008356 | 0.033483 | 0.047710 |
| 0.054550 | 0.036761 | -0.000504 | -0.004442 | 0.040373 | 0.011390 |
| -0.016307 | -0.002469 | -0.002126 | -0.009819 | -0.019940 | -0.013277 |
| 0.011076 | -0.019792 | -0.035340 | 0.002149 | 0.006808 | 0.016493 |
| 0.038792 | 0.029919 | -0.001359 | 0.051804 | 0.006808 | -0.011367 |
| 0.007816 | 0.003518 | -0.002057 | 0.000706 | -0.003529 | -0.010051 |
| 0.001156 | 0.012580 | 0.024675 | 0.020468 | 0.015950 | 0.015448 |
| 0.027356 | 0.041146 | 0.040849 | 0.046546 | 0.057221 | -0.021580 |
| -0.042908 | -0.070431 | -0.109100 | -0.093754 | -0.070172 | -0.054244 |
| -0.058529 | -0.070327 | -0.050620 | -0.050957 | -0.070404 | -0.104959 |
| -0.122761 | -0.102261 | -0.089759 | -0.064599 | 0.031875 | 0.045073 |
| -0.000219 | -0.006618 | 0.006391 | 0.026618 | 0.057154 | 0.045818 |
| 0.037020 | 0.060365 | 0.053508 | 0.032563 | 0.036988 | 0.039643 |
| 0.040568 | 0.049835 | 0.047635 | 0.022584 | 0.033139 | 0.050633 |
| 0.040321 | 0.024675 | 0.003721 | 0.018893 | -0.005442 | -0.008395 |
| 0.018356 | -0.023911 | -0.060533 | -0.040863 | -0.033231 | -0.032112 |
| -0.030538 | -0.034725 | -0.043224 | -0.029318 | -0.018646 | -0.018701 |
| -0.007161 | 0.004757 | -0.003745 | -0.005430 | -0.001885 | -0.001880 |
| -0.010424 | -0.009850 | -0.009918 | -0.010358 | -0.010315 | -0.010610 |
| -0.010778 | -0.011075 | -0.010694 | -0.010493 | -0.009939 | -0.010109 |
| -0.011209 | -0.011276 | -0.011119 | -0.010627 | -0.010442 | -0.009365 |
| -0.009405 | -0.009921 | -0.010113 | -0.010074 | -0.007850 | -0.004374 |
| -0.004218 | -0.003544 | -0.003993 | -0.003546 | -0.003158 | -0.003999 |
| -0.004245 | -0.003828 | -0.004187 | -0.003903 | -0.003717 | -0.003160 |
| -0.004849 | -0.007901 | -0.009585 | -0.009333 | -0.009742 | -0.009367 |
| -0.006328 | 0.000083 | 0.001223 | 0.001703 | 0.001864 | 0.001145 |
| 0.001075 | 0.001567 | 0.001190 | 0.001208 | 0.001373 | 0.001753 |
| 0.001704 | 0.001576 | 0.000299 | -0.006756 | -0.009111 | -0.009149 |
| -0.010231 | -0.009323 | -0.006893 | 0.000385 | 0.001208 | 0.001082 |
| 0.000587 | 0.001186 | 0.000650 | 0.000914 | 0.001095 | 0.000831 |
| 0.000528 | 0.000592 | 0.000953 | 0.000733 | 0.000151 | -0.007022 |
| -0.009920 | -0.009948 | -0.010307 | -0.010287 | -0.007237 | -0.000943 |
| 0.001079 | 0.000478 | 0.001246 | 0.001109 | 0.000506 | 0.000611 |
| 0.000572 | 0.000763 | 0.000974 | 0.001096 | 0.000686 | 0.000882 |
| -0.000548 | -0.007078 | -0.009812 | -0.009509 | -0.009248 | -0.009830 |
| -0.007742 | -0.001337 | 0.000233 | 0.000198 | 0.000237 | 0.000386 |
| 0.000155 | -0.000389 | -0.000346 | -0.000526 | 0.000281 | -0.000279 |

| | | | | | |
|---|---|---|---|---|---|
| -0.000464 | 0.000057 | -0.001289 | -0.007068 | -0.009186 | -0.009371 |
| -0.009607 | -0.010359 | -0.007367 | -0.001966 | -0.000846 | -0.001277 |
| -0.000931 | -0.000495 | -0.000406 | -0.000467 | -0.000689 | -0.001011 |
| -0.000733 | -0.000541 | -0.001358 | -0.001179 | -0.002146 | -0.007600 |
| -0.009592 | -0.010273 | -0.009554 | -0.010155 | -0.007064 | -0.001814 |
| -0.001439 | -0.000978 | -0.001019 | -0.001262 | -0.001025 | -0.001342 |
| -0.001193 | -0.001196 | -0.001392 | -0.001208 | -0.000905 | -0.000625 |
| -0.002006 | -0.007287 | -0.009270 | -0.009440 | -0.010267 | -0.009529 |
| -0.007340 | -0.002317 | -0.001256 | -0.000785 | -0.000994 | -0.001236 |
| -0.001621 | -0.000805 | -0.000487 | -0.001203 | -0.001586 | -0.001351 |
| -0.000893 | -0.001615 | -0.001695 | -0.007330 | -0.009464 | -0.010020 |
| -0.009518 | -0.010411 | -0.007961 | -0.002060 | -0.000884 | -0.000692 |
| -0.000468 | -0.000728 | -0.000587 | -0.000573 | -0.000123 | -0.000724 |
| -0.001244 | -0.000761 | -0.001093 | -0.000507 | -0.001461 | -0.007863 |
| -0.009644 | -0.009996 | -0.009576 | -0.009600 | -0.007941 | -0.001243 |
| -0.000644 | -0.000908 | -0.000712 | -0.000524 | -0.001167 | -0.000401 |
| -0.001285 | -0.000977 | -0.000378 | -0.000577 | -0.000864 | -0.001318 |
| -0.001430 | -0.007093 | -0.009966 | -0.009715 | -0.010424 | -0.010203 |
| -0.007593 | -0.001249 | -0.000822 | -0.000808 | -0.000611 | -0.000757 |
| -0.000580 | -0.000187 | -0.001032 | -0.000662 | -0.000812 | -0.000188 |
| -0.000688 | -0.000578 | -0.001653 | -0.007404 | -0.009763 | -0.009905 |
| -0.009947 | -0.009825 | -0.006964 | -0.000683 | 0.000387 | 0.000201 |
| 0.000644 | -0.000206 | 0.000124 | -0.000052 | -0.000326 | 0.000497 |
| 0.000637 | 0.000416 | -0.000073 | 0.000242 | -0.001123 | -0.007282 |
| -0.010242 | -0.009910 | -0.010152 | -0.009966 | -0.007514 | -0.000450 |
| 0.000584 | 0.000666 | 0.000273 | 0.000869 | 0.001269 | 0.001116 |
| 0.000919 | 0.000806 | 0.000955 | 0.001240 | 0.000641 | 0.001207 |
| -0.000013 | -0.006940 | -0.009631 | -0.009266 | -0.009719 | -0.009978 |
| -0.006912 | 0.000946 | 0.001712 | 0.001858 | 0.001426 | 0.001653 |
| 0.001567 | 0.001448 | 0.001091 | 0.001732 | 0.001778 | 0.001357 |
| 0.002086 | 0.001658 | 0.001133 | -0.006284 | -0.009820 | -0.009933 |
| -0.009742 | -0.009686 | -0.006556 | 0.001444 | 0.003010 | 0.003340 |
| 0.003469 | 0.003292 | 0.003398 | 0.003140 | 0.003621 | 0.003416 |
| 0.003156 | 0.003473 | 0.003878 | 0.003587 | 0.002314 | -0.006461 |
| -0.009496 | -0.009591 | -0.009741 | -0.010048 | -0.005786 | 0.003411 |
| 0.004846 | 0.004976 | 0.004422 | 0.004627 | 0.004295 | 0.004158 |
| 0.004557 | 0.004449 | 0.004274 | 0.004606 | 0.004199 | 0.005135 |
| 0.003486 | -0.005500 | -0.009794 | -0.009599 | -0.009719 | -0.010044 |
| -0.005731 | 0.003227 | 0.005002 | 0.005363 | 0.005195 | 0.005634 |
| 0.005428 | 0.005734 | 0.005548 | 0.005350 | 0.005453 | 0.005613 |
| 0.005166 | 0.005459 | 0.003542 | -0.006054 | -0.009713 | -0.009704 |
| -0.009944 | -0.009999 | -0.008060 | -0.002927 | -0.002756 | -0.002721 |
| -0.003280 | -0.002920 | -0.003066 | -0.002302 | -0.002314 | -0.002574 |
| -0.002291 | -0.003091 | -0.002567 | -0.002279 | -0.003246 | -0.007979 |
| -0.009672 | -0.009518 | -0.009785 | -0.010178 | -0.009716 | -0.010258 |
| -0.010515 | -0.010342 | -0.010245 | -0.010452 | -0.010662 | -0.010854 |
| -0.010810 | -0.010553 | -0.010083 | -0.010507 | -0.010397 | -0.010413 |
| -0.011231 | -0.010632 | -0.010014 | -0.009459 | 0.002622 | 0.014070 |
| -0.012899 | -0.028940 | -0.028907 | -0.012571 | 0.005922 | 0.021360 |
| 0.004157 | -0.025525 | -0.012577 | 0.005896 | 0.027824 | 0.025333 |
| 0.018988 | 0.008824 | -0.001036 | -0.007649 | 0.000568 | 0.000910 |
| -0.005660 | -0.008386 | -0.013482 | -0.003508 | 0.025581 | 0.013244 |
| -0.002617 | -0.001586 | -0.001241 | -0.002673 | -0.018205 | -0.022198 |
| -0.014175 | 0.003039 | 0.010824 | -0.000240 | 0.008472 | 0.020882 |
| 0.013908 | 0.000310 | -0.016783 | -0.011372 | -0.000346 | 0.013087 |
| 0.027764 | 0.010343 | -0.008871 | -0.014748 | -0.019644 | -0.019795 |
| 0.022773 | 0.025219 | -0.014347 | 0.000087 | 0.006222 | -0.011232 |
| -0.001047 | 0.012795 | -0.000486 | -0.004163 | -0.000602 | -0.003392 |
| 0.004853 | 0.004727 | -0.005202 | -0.007335 | -0.010004 | -0.021717 |
| -0.013174 | 0.004361 | 0.002744 | 0.007875 | 0.020380 | 0.004275 |

| | | 0014 | | | 0.0 |
|---|---|---|---|---|---|
| -0.006707 | -0.003462 | 0.00..97 | 0.006544 | 0.015330 | 12231 |
| 0.000820 | 0.012224 | -0.012877 | -0.018556 | 0.002944 | 0.001691 |
| -0.004348 | -0.012543 | 0.008190 | 0.037418 | 0.014020 | 0.000310 |
| -0.004527 | -0.004423 | -0.001086 | 0.011654 | 0.004460 | -0.002901 |
| 0.025338 | 0.022207 | -0.002721 | 0.012032 | -0.017674 | -0.022650 |
| 0.005841 | 0.012191 | 0.007440 | -0.012738 | -0.007296 | 0.008976 |
| -0.000634 | -0.012614 | -0.029008 | -0.018932 | -0.007204 | 0.001528 |
| -0.001008 | -0.007995 | -0.011617 | -0.003728 | 0.010438 | 0.017680 |
| 0.013762 | 0.006923 | -0.005517 | 0.006386 | 0.015738 | 0.001879 |
| -0.020255 | -0.040052 | 0.009511 | 0.024415 | 0.002714 | 0.008196 |
| 0.013624 | 0.009500 | 0.014195 | 0.018136 | 0.014437 | 0.000214 |
| -0.022268 | -0.018468 | -0.011947 | -0.005654 | -0.000291 | -0.011204 |
| -0.018057 | -0.001616 | -0.003134 | -0.011820 | 0.002852 | 0.003884 |
| -0.008985 | -0.004093 | -0.002944 | -0.014762 | -0.009396 | 0.000609 |
| -0.003288 | -0.002200 | 0.001580 | 0.029102 | 0.002480 | -0.004259 |
| 0.016023 | -0.004543 | -0.020950 | 0.002384 | 0.000826 | -0.010025 |
| 0.011212 | 0.018167 | 0.011095 | -0.002547 | -0.008276 | 0.004576 |
| 0.010168 | 0.007615 | -0.021132 | -0.019099 | 0.003370 | -0.016251 |
| -0.009768 | 0.002161 | 0.021992 | 0.001881 | -0.011763 | 0.018182 |
| 0.010007 | -0.015116 | -0.017070 | -0.002270 | -0.000111 |  |
| 0.002601 | 0.008665 | 0.003204 | -0.003407 | 0.003795 | 0.002386 |
| -0.003452 | -0.000144 | 0.009752 | 0.008742 | -0.006937 | -0.003709 |
| 0.002643 | 0.010443 | 0.011055 | 0.009089 | 0.005323 | 0.005076 |
| 0.006841 | 0.004299 | 0.002951 | 0.005517 | 0.006267 | 0.006037 |
| 0.005681 | -0.008849 | -0.033533 | 0.001135 | -0.003084 | 0.000351 |
| 0.014870 | -0.004252 | -0.022727 | -0.017798 | -0.017926 |  |
| -0.026498 | -0.023856 | -0.009610 | 0.011232 | 0.022368 | 0.011367 |
| 0.012235 | 0.011090 | -0.012553 | -0.010554 | 0.011394 | -0.006924 |
| 0.013661 | 0.022523 | 0.015722 | 0.010671 | 0.007739 | 0.015939 |
| 0.010066 | 0.001769 | 0.026779 | 0.022422 | -0.010785 | -0.012939 |
| -0.014425 | -0.020621 | -0.011758 | 0.003680 | 0.022490 | 0.021335 |
| 0.005175 | 0.012225 | 0.014885 | 0.009504 | -0.006986 | -0.017745 |
| -0.018958 | 0.009267 | -0.000044 | -0.025165 | -0.017608 | -0.000888 |
| 0.024692 | -0.000042 | -0.016323 | -0.007671 | -0.000956 | 0.004281 |
| 0.006998 | 0.001632 | -0.008230 | 0.004739 | -0.001047 | -0.001911 |
| 0.006741 | 0.005417 | 0.003908 | 0.004746 | -0.001658 | -0.009703 |
| -0.008437 | -0.002966 | 0.005501 | 0.008891 | 0.011697 | 0.011004 |
| 0.010119 | 0.005785 | -0.017119 | -0.011414 | 0.015544 | 0.013854 |
| -0.002416 | -0.007525 | 0.002054 | 0.007281 | 0.004171 | -0.015848 |
| -0.002945 | 0.022778 | -0.000944 | -0.011380 | -0.008833 | -0.013701 |
| -0.013800 | -0.004458 | 0.007269 | 0.014408 | 0.001636 | -0.013403 |
| -0.032251 | 0.007975 | -0.006824 | -0.006751 | 0.012886 | 0.013707 |
| 0.009912 | 0.002903 | 0.002368 | 0.005492 | -0.003185 | -0.013372 |
| -0.023803 | -0.009016 | 0.004542 | 0.009403 | 0.011051 | 0.008458 |
| -0.009583 | -0.014053 | -0.005903 | -0.013832 | -0.013648 | -0.009208 |
| 0.001022 | 0.009899 | 0.008778 | -0.020766 | -0.025105 | -0.014743 |
| 0.012162 | 0.008335 | -0.025139 | -0.007731 | 0.008718 | 0.012626 |
| 0.009127 | 0.006390 | 0.013347 | 0.001565 | -0.025093 | -0.002500 |
| -0.000009 | -0.000961 | -0.007888 | -0.003141 | 0.006452 | 0.018493 |
| 0.018482 | 0.013735 | 0.012697 | 0.010951 | 0.008672 | 0.009208 |
| 0.010598 | 0.012866 | 0.016587 | 0.021274 | 0.020563 | 0.016001 |
| 0.008554 | -0.002786 | 0.006772 | 0.005530 | -0.012668 | -0.018727 |
| -0.021196 | -0.020671 | -0.017795 | -0.013025 | 0.006098 | 0.009181 |
| -0.004221 | -0.012683 | -0.009319 | 0.015738 | 0.022191 | 0.020914 |
| 0.014156 | 0.004520 | -0.007656 | 0.000913 | -0.003934 | 0.007570 |
| -0.018352 | -0.095739 | -0.128383 | -0.140664 | -0.119131 | -0.102937 |
| -0.092364 | -0.129674 | -0.140062 | -0.122355 | -0.103134 | -0.101018 |
| -0.134911 | -0.150399 | -0.142149 | -0.048908 | -0.002326 | 0.009723 |
| 0.054903 | 0.033099 | -0.024044 | -0.133774 | -0.141405 | -0.131682 |
| -0.135576 | -0.139298 | -0.143540 | -0.137248 | -0.143585 | -0.163177 |

- 64 -

| | | | | | |
|---|---|---|---|---|---|
| -0.154337 | -0.150943 | -0.141205 | -0.159921 | -0.136540 | 0.017397 |
| 0.028012 | 0.021131 | 0.043173 | 0.017042 | -0.017760 | -0.065526 |
| -0.052383 | -0.042632 | -0.073791 | -0.053868 | -0.014147 | -0.042520 |
| -0.047377 | -0.030753 | -0.011470 | -0.005372 | -0.025551 | -0.050210 |
| -0.063264 | -0.009564 | 0.011541 | 0.008813 | 0.019968 | 0.023359 |
| 0.020145 | 0.005600 | 0.013824 | 0.020887 | 0.012564 | 0.018388 |
| 0.028283 | 0.006495 | -0.005742 | -0.009017 | 0.016840 | 0.028994 |
| 0.011021 | 0.000405 | -0.004482 | 0.012475 | 0.013772 | 0.003452 |
| 0.040185 | 0.026767 | 0.016685 | 0.010142 | 0.021488 | 0.032424 |
| 0.026709 | 0.021300 | 0.018113 | 0.026252 | 0.041340 | 0.063536 |
| 0.077233 | 0.072382 | 0.034797 | 0.042151 | 0.053855 | 0.013215 |
| 0.014609 | 0.043990 | 0.014224 | 0.043154 | 0.056554 | 0.048778 |
| 0.036295 | 0.027098 | 0.031961 | 0.024237 | 0.010967 | 0.012369 |
| 0.013911 | 0.016773 | 0.034337 | 0.043367 | 0.033596 | 0.045211 |
| 0.054501 | 0.024976 | 0.010810 | 0.008111 | 0.003649 | 0.020741 |
| 0.030306 | 0.026324 | 0.008537 | 0.003014 | 0.044870 | 0.052194 |
| 0.040673 | 0.024554 | 0.022430 | 0.035700 | 0.025701 | 0.029004 |
| 0.063067 | 0.059425 | 0.045980 | 0.047382 | 0.050171 | 0.053782 |
| 0.048899 | 0.044066 | 0.029107 | 0.001137 | 0.009631 | 0.021189 |
| 0.021653 | 0.024532 | 0.030781 | 0.050142 | 0.056316 | 0.048865 |
| 0.032623 | 0.030799 | 0.056823 | 0.059045 | 0.048457 | 0.011935 |
| 0.009250 | 0.029867 | -0.002737 | 0.010669 | 0.011683 | -0.003547 |
| -0.006806 | 0.000664 | 0.029988 | 0.035873 | 0.027936 | 0.009128 |
| 0.012813 | 0.040725 | 0.043578 | 0.041242 | 0.036006 | 0.019594 |
| 0.006603 | 0.035126 | 0.046183 | 0.044635 | 0.016723 | 0.021164 |
| 0.031169 | 0.050708 | 0.040290 | 0.021520 | -0.004565 | -0.002086 |
| 0.011991 | -0.003048 | 0.001144 | 0.025573 | 0.023818 | 0.020235 |
| 0.016051 | 0.003690 | -0.005779 | 0.022340 | 0.045356 | 0.065712 |
| 0.001922 | 0.018443 | 0.028525 | 0.028426 | 0.011448 | -0.002800 |
| 0.005425 | 0.005193 | 0.002791 | 0.020918 | 0.022113 | 0.006947 |
| 0.019901 | 0.026988 | 0.016192 | 0.014655 | 0.015863 | 0.007339 |
| 0.019584 | 0.048445 | 0.058941 | 0.032369 | 0.014386 | 0.010507 |
| -0.009512 | -0.020761 | 0.002294 | 0.009934 | 0.005990 | -0.015131 |
| -0.015073 | 0.005535 | 0.007299 | 0.009429 | 0.012652 | -0.004729 |
| -0.020029 | 0.015166 | 0.019510 | 0.001944 | 0.023176 | 0.025664 |
| 0.007125 | -0.041003 | -0.041662 | -0.032823 | -0.023821 | -0.029764 |
| -0.041711 | -0.026865 | -0.021543 | -0.023154 | -0.020320 | |
| -0.018726 | -0.013926 | -0.007985 | -0.004356 | 0.016948 | 0.050012 |
| 0.031498 | 0.023350 | 0.011823 | -0.004019 | -0.015505 | -0.029407 |
| -0.049926 | -0.050288 | -0.041714 | -0.029279 | -0.028481 | -0.038754 |
| -0.046721 | -0.045638 | -0.029820 | -0.017000 | -0.002504 | 0.028052 |
| 0.023467 | -0.004860 | 0.037075 | 0.026131 | -0.008749 | -0.075770 |
| -0.084880 | -0.085705 | -0.093681 | -0.077367 | -0.050204 | -0.034785 |
| -0.043071 | -0.074992 | -0.066314 | -0.056303 | -0.049986 | -0.055667 |
| -0.053536 | 0.006072 | 0.023710 | 0.010858 | 0.050670 | 0.039993 |
| 0.007946 | -0.053193 | -0.054681 | -0.048840 | -0.058341 | -0.053555 |
| -0.040990 | -0.029600 | -0.032441 | -0.048096 | -0.059019 | -0.051744 |
| -0.008650 | -0.027006 | -0.051618 | 0.000328 | 0.028027 | 0.037439 |
| 0.019468 | 0.031245 | 0.011899 | -0.047272 | -0.033116 | -0.014126 |
| -0.027605 | -0.025163 | -0.015528 | -0.000774 | -0.008213 | -0.036411 |
| -0.034951 | -0.029240 | -0.025339 | -0.025746 | -0.024151 | 0.000089 |
| 0.020284 | 0.038128 | 0.017390 | 0.035870 | 0.012325 | -0.069957 |
| -0.099109 | -0.106390 | -0.077508 | -0.071012 | -0.076196 | -0.100569 |
| -0.098832 | -0.070281 | -0.075062 | -0.085743 | -0.102661 | -0.118624 |
| -0.112195 | 0.006135 | 0.058022 | 0.060832 | 0.042772 | 0.022156 |
| -0.012601 | -0.065634 | -0.048543 | -0.024547 | -0.019434 | -0.031047 |
| -0.048909 | -0.034176 | -0.034937 | -0.051189 | -0.046655 | -0.045339 |
| -0.053257 | -0.059554 | -0.057559 | -0.019037 | 0.004766 | 0.018787 |
| 0.053955 | 0.026378 | 0.056855 | 0.168528 | 0.210932 | 0.227536 |
| 0.205496 | 0.177663 | 0.151774 | 0.177509 | 0.183705 | 0.168425 |

| | | | | | |
|---|---|---|---|---|---|
| 0.175369 | 0.177802 | 0.16_83 | 0.179085 | 0.177642 | .5565 |
| 0.046453 | -0.000849 | -0.004783 | -0.004942 | 0.010203 | 0.043731 |
| 0.103234 | 0.037905 | -0.037424 | -0.065431 | -0.038195 | 0.010430 |
| -0.014507 | -0.035319 | -0.051938 | -0.032680 | -0.019032 | -0.024466 |
| 0.037620 | 0.089627 | -0.021648 | 0.006591 | 0.135323 | 0.108048 |
| -0.004479 | -0.066952 | -0.062639 | -0.030744 | 0.002748 | 0.022098 |
| 0.044430 | 0.066892 | 0.073367 | 0.067701 | 0.050165 | 0.006607 |
| -0.028830 | -0.043167 | -0.046929 | -0.037973 | 0.013357 | 0.071009 |
| 0.132980 | 0.120064 | 0.006470 | 0.005134 | 0.160208 | 0.261744 |
| 0.337988 | 0.368566 | 0.407948 | 0.438670 | 0.354586 | 0.364200 |
| 0.468300 | 0.392083 | 0.350017 | 0.407768 | 0.375187 | 0.290544 |
| 0.086980 | -0.029727 | -0.086233 | 0.011148 | 0.022683 | 0.062286 |
| 0.141038 | 0.170420 | 0.186662 | 0.192803 | 0.192221 | 0.185059 |
| 0.148425 | 0.102748 | 0.048143 | 0.088382 | 0.137498 | 0.187598 |
| 0.206398 | 0.185530 | 0.016568 | -0.037871 | -0.008497 | 0.051323 |
| 0.116150 | 0.126357 | 0.060061 | 0.165247 | 0.254078 | 0.188327 |
| 0.175599 | 0.184020 | 0.126653 | 0.148141 | 0.248548 | 0.178452 |
| 0.121178 | 0.123011 | 0.150265 | 0.154439 | 0.000324 | -0.057485 |
| -0.046449 | 0.110609 | 0.103710 | 0.113551 | 0.146106 | 0.131203 |
| 0.132624 | 0.213445 | 0.229493 | 0.209121 | 0.148851 | 0.154728 |
| 0.227324 | 0.161643 | 0.124741 | 0.169950 | 0.184808 | 0.169699 |
| 0.048799 | -0.000654 | 0.000152 | 0.014839 | 0.020709 | 0.070722 |
| 0.182766 | 0.101514 | 0.035610 | 0.128897 | 0.191600 | 0.230854 |
| 0.203184 | 0.174561 | 0.143477 | 0.126769 | 0.133043 | 0.186565 |
| 0.149784 | 0.074262 | -0.046541 | -0.027350 | 0.092317 | 0.069742 |
| 0.069418 | 0.081890 | 0.114032 | 0.163976 | 0.191419 | 0.143027 |
| 0.145100 | 0.168811 | 0.163572 | 0.162160 | 0.161976 | 0.150709 |
| 0.142237 | 0.143480 | 0.120120 | 0.087189 | 0.041148 | 0.014030 |
| -0.001345 | -0.158814 | -0.039736 | 0.018875 | -0.008192 | 0.012351 |
| 0.039557 | 0.058107 | 0.084588 | 0.107892 | 0.060392 | 0.079439 |
| 0.163859 | 0.160338 | 0.140692 | 0.104290 | 0.061100 | 0.036119 |
| 0.110388 | 0.083843 | -0.015882 | -0.020671 | 0.026357 | 0.082721 |
| 0.153806 | 0.113492 | 0.057734 | 0.028092 | 0.032825 | 0.055666 |
| 0.084444 | 0.106523 | 0.120428 | 0.055917 | 0.011418 | 0.019790 |
| 0.065908 | 0.107115 | 0.055958 | 0.028031 | 0.016944 | 0.053060 |
| 0.054735 | 0.070305 | 0.102343 | 0.056595 | 0.007975 | -0.003007 |
| -0.005211 | -0.000150 | 0.058923 | 0.070374 | 0.035685 | 0.023643 |
| 0.048047 | 0.143400 | 0.106972 | 0.033285 | -0.008574 | 0.004772 |
| 0.057431 | 0.086434 | 0.060519 | 0.039106 | 0.026433 | 0.086440 |
| 0.127714 | 0.067271 | 0.027071 | 0.004218 | 0.059342 | 0.094773 |
| 0.109740 | 0.066024 | 0.035443 | 0.025658 | 0.012365 | |
| 0.027066 | 0.018592 | -0.007128 | 0.049456 | -0.012975 | -0.060310 |
| -0.089510 | -0.016773 | 0.050879 | 0.046073 | -0.003783 | -0.072438 |
| -0.082829 | -0.022793 | 0.108074 | 0.023812 | -0.033108 | 0.003402 |
| 0.042820 | 0.062260 | -0.023211 | -0.011213 | 0.071913 | 0.048326 |
| -0.042273 | -0.082762 | -0.052047 | 0.010085 | 0.054956 | 0.027967 |
| 0.009171 | -0.009773 | -0.067268 | -0.053989 | 0.027498 | 0.009695 |
| 0.008037 | 0.055178 | 0.058608 | 0.041273 | -0.013926 | 0.010544 |
| 0.090131 | -0.005502 | -0.044534 | -0.099922 | -0.176701 | -0.122752 |
| -0.067278 | -0.085089 | -0.047122 | 0.012141 | 0.016292 | 0.021385 |
| 0.027202 | 0.004199 | -0.012824 | -0.014296 | -0.055999 | -0.088700 |
| -0.011839 | -0.000528 | -0.037602 | 0.108069 | 0.059950 | -0.022247 |
| -0.149068 | -0.117048 | -0.057477 | -0.012542 | -0.025040 | -0.061734 |
| -0.031974 | -0.055079 | -0.131190 | -0.090720 | -0.065456 | -0.092600 |
| -0.142362 | -0.175999 | -0.090143 | -0.024294 | 0.025919 | -0.057130 |
| 0.045954 | 0.038740 | -0.122000 | -0.104766 | -0.076378 | -0.116905 |
| -0.101760 | -0.063141 | -0.081108 | -0.084709 | -0.074252 | -0.070836 |
| -0.087667 | -0.146636 | -0.155579 | -0.129653 | -0.014020 | 0.007081 |
| -0.038899 | 0.093932 | 0.108331 | 0.116939 | 0.120758 | 0.048004 |
| -0.024754 | -0.046795 | -0.027157 | 0.008778 | -0.018380 | -0.012230 |

| | | | | | |
|---|---|---|---|---|---|
| 0.027459 | 0.085742 | 0.112777 | 0.070205 | 0.036156 | 0.002125 |
| -0.048278 | 0.015934 | 0.160138 | 0.016101 | 0.045435 | -0.033412 |
| -0.263658 | -0.255835 | -0.211747 | -0.200685 | -0.203172 | -0.212359 |
| -0.227094 | -0.235533 | -0.236349 | -0.198241 | -0.177818 | -0.199570 |
| -0.223332 | -0.220859 | -0.081235 | -0.016623 | -0.007254 | 0.115340 |
| 0.076414 | 0.031869 | -0.020068 | 0.022968 | 0.065849 | 0.054880 |
| -0.001100 | -0.077839 | -0.113849 | -0.107393 | -0.058892 | -0.047059 |
| -0.055294 | -0.095053 | -0.114262 | -0.102448 | 0.032477 | 0.058560 |
| 0.006542 | -0.003822 | -0.009671 | -0.009808 | -0.010215 | -0.010208 |
| -0.010108 | -0.010601 | -0.010187 | -0.010394 | -0.010651 | -0.010053 |
| -0.009783 | -0.009865 | -0.010019 | -0.010809 | -0.010212 | -0.010038 |
| -0.009818 | -0.009403 | -0.009661 | -0.009766 | -0.010367 | -0.010066 |
| -0.007763 | -0.003296 | -0.002695 | -0.002580 | -0.002444 | -0.002865 |
| -0.001905 | -0.002005 | -0.002703 | -0.002460 | -0.002001 | -0.001863 |
| -0.002593 | -0.002327 | -0.002814 | -0.008369 | -0.009788 | -0.009361 |
| -0.009523 | -0.009649 | -0.005959 | 0.001981 | 0.003066 | 0.002631 |
| 0.002955 | 0.002185 | 0.002161 | 0.002071 | 0.002791 | 0.002780 |
| 0.002103 | 0.002209 | 0.001865 | 0.001987 | 0.001111 | -0.006742 |
| -0.009427 | -0.008926 | -0.010036 | -0.009869 | -0.006272 | 0.000352 |
| 0.000485 | 0.001375 | 0.001219 | 0.001082 | 0.000741 | 0.000672 |
| 0.001039 | 0.000535 | 0.000562 | 0.001164 | 0.000453 | 0.000985 |
| -0.000091 | -0.007217 | -0.009332 | -0.008961 | -0.010151 | -0.009569 |
| -0.007185 | -0.000842 | 0.000171 | -0.000042 | -0.000040 | 0.000357 |
| 0.000732 | 0.000083 | 0.000033 | -0.000455 | -0.000242 | -0.000211 |
| 0.000724 | 0.000332 | -0.001060 | -0.007743 | -0.009666 | -0.009518 |
| -0.009450 | -0.010053 | -0.007668 | -0.001891 | -0.000781 | -0.000013 |
| 0.000043 | -0.000731 | -0.000280 | -0.000224 | -0.000569 | -0.000075 |
| -0.000306 | -0.000381 | -0.000153 | -0.000328 | -0.000984 | -0.006879 |
| -0.009704 | -0.009249 | -0.009694 | -0.010319 | -0.007407 | -0.001982 |
| -0.000848 | -0.000782 | -0.001140 | -0.000873 | -0.000591 | -0.000792 |
| -0.001591 | -0.001702 | -0.000925 | -0.000897 | -0.001193 | -0.001684 |
| -0.001807 | -0.006934 | -0.010181 | -0.009686 | -0.009901 | -0.009651 |
| -0.007956 | -0.002340 | -0.001282 | -0.001085 | -0.000908 | -0.001130 |
| -0.000802 | -0.000665 | -0.000837 | -0.000575 | -0.000740 | -0.001112 |
| -0.001098 | -0.001524 | -0.001971 | -0.007255 | -0.009144 | -0.009408 |
| -0.009874 | -0.009699 | -0.007454 | -0.001711 | -0.000386 | -0.000780 |
| -0.001418 | -0.000932 | -0.001185 | -0.000645 | -0.000691 | -0.000835 |
| -0.000857 | -0.001132 | -0.001359 | -0.001460 | -0.002511 | -0.007237 |
| -0.010075 | -0.009251 | -0.009029 | -0.009613 | -0.007312 | -0.002287 |
| -0.000594 | -0.001171 | -0.000901 | -0.000984 | -0.000442 | -0.000623 |
| -0.000365 | -0.000266 | -0.000807 | -0.001361 | -0.000717 | -0.000236 |
| -0.001576 | -0.007526 | -0.009620 | -0.009575 | -0.009454 | -0.010179 |
| -0.007741 | -0.001151 | -0.000064 | -0.000569 | -0.000545 | -0.001015 |
| -0.000465 | -0.000250 | -0.000196 | -0.000734 | -0.000545 | -0.000070 |
| -0.000273 | -0.000962 | -0.001827 | -0.007022 | -0.009260 | -0.009814 |
| -0.010294 | -0.010010 | -0.006951 | -0.000961 | 0.000150 | 0.000131 |
| -0.000403 | -0.000768 | 0.000076 | -0.000443 | -0.000388 | -0.000026 |
| -0.000204 | -0.000211 | -0.000650 | -0.000358 | -0.001338 | -0.006963 |
| -0.009388 | -0.009514 | -0.009744 | -0.009613 | -0.007091 | -0.000241 |
| 0.000936 | 0.000351 | 0.000909 | 0.000039 | 0.000679 | 0.000660 |
| -0.000088 | 0.000688 | 0.000078 | 0.000284 | 0.000151 | -0.000078 |
| -0.000660 | -0.006948 | -0.009296 | -0.009672 | -0.010295 | -0.009907 |
| -0.007073 | -0.000658 | 0.000802 | 0.001604 | 0.000622 | 0.001243 |
| 0.001441 | 0.001183 | 0.001088 | 0.001231 | 0.001569 | 0.001569 |
| 0.000508 | 0.001051 | 0.000211 | -0.007417 | -0.009792 | -0.009931 |
| -0.009955 | -0.009630 | -0.006946 | 0.000726 | 0.002558 | 0.002589 |
| 0.002617 | 0.002499 | 0.002181 | 0.001427 | 0.002298 | 0.002545 |
| 0.002368 | 0.002023 | 0.001899 | 0.002306 | 0.001655 | -0.006697 |
| -0.009919 | -0.009120 | -0.009582 | -0.010339 | -0.006708 | 0.001817 |
| 0.004077 | 0.004553 | 0.004000 | 0.003659 | 0.003506 | 0.003750 |

| | | 4(?) | | | 5,0 |
|---|---|---|---|---|---|
| 0.003833 | 0.004388 | 0.00__6 | 0.004092 | 0.004050 | ₊3563 |
| 0.002568 | -0.005513 | -0.009468 | -0.009138 | -0.009976 | -0.009317 |
| -0.005553 | 0.004057 | 0.004858 | 0.005117 | 0.005101 | 0.005590 |
| 0.005507 | 0.004737 | 0.005216 | 0.005329 | 0.004883 | 0.005071 |
| 0.005071 | 0.005312 | 0.003237 | -0.005174 | -0.009429 | -0.009347 |
| -0.010092 | -0.010325 | -0.005737 | 0.004237 | 0.006101 | 0.005677 |
| 0.005853 | 0.006010 | 0.006611 | 0.006636 | 0.006584 | 0.006151 |
| 0.005895 | 0.006249 | 0.006422 | 0.005816 | 0.004418 | -0.005908 |
| -0.010390 | -0.010088 | -0.009586 | -0.009599 | -0.007409 | -0.003108 |
| -0.002500 | -0.002761 | -0.002631 | -0.002445 | -0.002542 | -0.003201 |
| -0.002827 | -0.002913 | -0.002175 | -0.002326 | -0.002648 | -0.002741 |
| -0.003695 | -0.007795 | -0.009550 | -0.009395 | -0.010427 | -0.010121 |
| -0.010047 | -0.011312 | -0.011231 | -0.011503 | -0.012273 | -0.012014 |
| -0.011471 | -0.011743 | -0.011807 | -0.011770 | -0.011232 | -0.011628 |
| -0.011672 | -0.011193 | -0.011614 | -0.010688 | -0.009844 | -0.010188 |
| 0.002095 | 0.000745 | -0.082530 | -0.047809 | 0.151617 | 0.190743 |
| 0.149413 | -0.042328 | -0.011475 | 0.111916 | 0.008265 | -0.070774 |
| -0.128199 | -0.082431 | -0.071740 | -0.149707 | -0.002726 | 0.149303 |
| -0.042737 | 0.017980 | 0.258461 | 0.115317 | -0.007841 | -0.013411 |
| 0.147534 | 0.179885 | 0.175584 | 0.136734 | 0.268187 | 0.453042 |
| 0.301785 | 0.262314 | 0.335017 | 0.214538 | 0.115604 | 0.093611 |
| 0.023892 | -0.039755 | 0.001371 | 0.095978 | 0.228843 | -0.089048 |
| 0.017796 | 0.001958 | -0.187056 | 0.009741 | 0.228930 | 0.276047 |
| 0.227745 | 0.130017 | 0.001713 | 0.017430 | 0.175390 | 0.035685 |
| -0.008734 | 0.193542 | 0.234301 | 0.191826 | -0.005322 | -0.051221 |
| 0.012005 | -0.095812 | -0.146826 | -0.175000 | -0.170979 | -0.079913 |
| 0.007037 | 0.029078 | -0.018930 | -0.091877 | -0.052871 | -0.098600 |
| -0.227292 | -0.076603 | 0.009253 | -0.084462 | -0.157588 | -0.205275 |
| -0.165437 | -0.063264 | 0.082930 | -0.044091 | 0.025095 | 0.036795 |
| -0.030934 | 0.009497 | 0.058078 | 0.066476 | 0.047690 | 0.014088 |
| -0.050748 | -0.055315 | 0.002532 | -0.191575 | -0.263446 | -0.045698 |
| 0.011018 | -0.009364 | -0.149452 | -0.268536 | -0.373280 | 0.186621 |
| 0.115051 | 0.051262 | -0.000213 | 0.070148 | 0.161508 | 0.243153 |
| 0.255842 | 0.226406 | 0.084896 | 0.082927 | 0.219138 | -0.054494 |
| -0.231814 | -0.144772 | -0.126204 | -0.119833 | -0.054326 | -0.010456 |
| 0.016144 | -0.130629 | -0.224126 | -0.144757 | 0.174980 | 0.002621 |
| -0.189761 | -0.144037 | 0.104239 | 0.399396 | 0.094620 | 0.020490 |
| 0.177223 | 0.027057 | -0.066616 | 0.010606 | -0.042386 | -0.149203 |
| -0.308196 | -0.166211 | 0.189889 | 0.028087 | -0.009954 | -0.053638 |
| -0.104158 | -0.004569 | 0.086957 | 0.067802 | 0.075554 | 0.092441 |
| 0.050519 | 0.014824 | -0.015209 | -0.041654 | -0.021658 | 0.090462 |
| -0.026500 | -0.193197 | -0.216884 | -0.093207 | 0.135607 | -0.387117 |
| -0.091857 | 0.037664 | -0.064245 | 0.017443 | 0.106661 | 0.112399 |
| 0.041657 | -0.046251 | 0.089128 | 0.151576 | 0.139167 | 0.145196 |
| 0.110631 | -0.007033 | 0.002865 | 0.047427 | 0.047338 | -0.078683 |
| -0.294038 | -0.009594 | 0.057417 | 0.025572 | -0.142154 | -0.216641 |
| -0.226888 | -0.107072 | -0.018789 | 0.046116 | 0.032397 | -0.000707 |
| -0.052965 | -0.138646 | -0.174903 | -0.107024 | 0.013549 | 0.125515 |
| 0.114877 | 0.003619 | -0.178878 | -0.195974 | -0.121998 | -0.037540 |
| 0.059823 | -0.008435 | -0.056374 | 0.058801 | 0.038952 | -0.029017 |
| 0.121987 | 0.137833 | 0.018557 | -0.065028 | -0.091067 | -0.011873 |
| -0.087910 | -0.189119 | -0.164516 | -0.083230 | 0.039736 | -0.257305 |
| -0.150337 | -0.029607 | 0.110922 | 0.167222 | 0.167927 | 0.049793 |
| -0.056351 | -0.133339 | 0.036031 | 0.156783 | 0.232030 | 0.031148 |
| -0.137083 | -0.192763 | -0.103391 | -0.001566 | -0.073284 | -0.098350 |
| -0.089556 | 0.106401 | 0.012220 | -0.037477 | -0.025343 | 0.026376 |
| 0.041913 | -0.080875 | -0.081286 | -0.030456 | -0.087339 | -0.083118 |
| -0.017081 | 0.077516 | 0.104655 | -0.007967 | 0.012721 | 0.034305 |
| -0.162921 | -0.267600 | -0.308953 | -0.097147 | -0.161788 | -0.155488 |
| -0.050351 | 0.041898 | 0.091511 | 0.024248 | 0.010830 | 0.011636 |

- 68 -

| | | | | | |
|---|---|---|---|---|---|
| -0.115482 | -0.160268 | -0.124436 | 0.017552 | 0.061975 | -0.103835 |
| -0.123974 | -0.120787 | -0.251343 | -0.107103 | 0.233550 | -0.040095 |
| -0.242776 | -0.257211 | -0.005272 | 0.038243 | 0.040304 | 0.042249 |
| 0.058808 | 0.070262 | -0.063509 | -0.082350 | 0.013192 | -0.049643 |
| -0.086092 | -0.038239 | -0.023085 | -0.005834 | 0.079139 | 0.005721 |
| -0.180801 | 0.055434 | 0.029892 | -0.065219 | -0.259436 | -0.177585 |
| -0.028174 | 0.161953 | 0.088158 | -0.086779 | 0.054948 | 0.075570 |
| -0.025254 | 0.019971 | -0.031227 | -0.303287 | -0.296251 | -0.194099 |
| -0.075389 | -0.062336 | -0.123515 | -0.085939 | -0.087796 | -0.040208 |
| 0.075867 | 0.037273 | 0.005297 | 0.090455 | 0.077084 | 0.021224 |
| 0.046054 | 0.077194 | 0.113814 | 0.113956 | 0.091742 | 0.031041 |
| 0.055399 | 0.106115 | 0.150915 | 0.057660 | -0.133303 | 0.217255 |
| 0.218838 | 0.257996 | 0.352047 | 0.266536 | 0.176124 | 0.183040 |
| 0.188539 | 0.195011 | 0.213369 | 0.273359 | 0.374648 | 0.411175 |
| 0.390920 | 0.266950 | 0.266602 | 0.220805 | -0.265061 | -0.269433 |
| 0.068093 | -0.020778 | 0.033275 | 0.195819 | 0.515036 | 0.559268 |
| 0.531687 | 0.453179 | 0.473390 | 0.537472 | 0.523465 | 0.525302 |
| 0.544057 | 0.511580 | 0.490804 | 0.505954 | 0.508003 | 0.462882 |
| 0.218744 | 0.051565 | -0.061998 | 0.229377 | 0.142470 | 0.023541 |
| -0.139038 | 0.011716 | 0.174240 | 0.180941 | 0.147998 | 0.079287 |
| -0.167956 | -0.169045 | 0.074766 | -0.091693 | -0.232872 | -0.243702 |
| -0.154429 | -0.065478 | -0.141021 | -0.140749 | -0.087299 | 0.009778 |
| -0.009491 | -0.009926 | -0.009413 | -0.009949 | -0.010228 | -0.010537 |
| -0.010456 | -0.010840 | -0.010349 | -0.010154 | -0.010211 | -0.010868 |
| -0.011224 | -0.011261 | -0.010296 | -0.010905 | -0.010380 | -0.009169 |
| -0.009816 | -0.010313 | -0.010422 | -0.010171 | -0.007501 | -0.003721 |
| -0.002871 | -0.002758 | -0.002493 | -0.003062 | -0.002404 | -0.002352 |
| -0.003251 | -0.002988 | -0.003210 | -0.002380 | -0.002065 | -0.002772 |
| -0.003347 | -0.008117 | -0.009775 | -0.009552 | -0.010207 | -0.009680 |
| -0.005996 | 0.001860 | 0.003083 | 0.002462 | 0.002179 | 0.002562 |
| 0.002439 | 0.002385 | 0.001821 | 0.002446 | 0.002680 | 0.002289 |
| 0.001772 | 0.002137 | 0.001194 | -0.006663 | -0.009728 | -0.008649 |
| -0.009769 | -0.009242 | -0.006222 | 0.000514 | 0.001405 | 0.001545 |
| 0.000972 | 0.001060 | 0.000866 | 0.001270 | 0.001352 | 0.000751 |
| 0.001343 | 0.000687 | 0.000617 | 0.000671 | 0.000005 | -0.007161 |
| -0.009412 | -0.008937 | -0.010019 | -0.009788 | -0.007706 | -0.000353 |
| 0.001210 | 0.000520 | 0.000436 | 0.000838 | 0.001068 | 0.000224 |
| 0.000443 | -0.000118 | 0.000225 | 0.000221 | 0.000147 | 0.001094 |
| -0.000696 | -0.007265 | -0.009354 | -0.009537 | -0.009047 | -0.010197 |
| -0.007786 | -0.000974 | -0.000145 | 0.000096 | -0.000506 | -0.000202 |
| -0.000539 | 0.000179 | -0.000444 | -0.000343 | -0.000148 | -0.000376 |
| -0.000065 | -0.000129 | -0.001145 | -0.006388 | -0.008867 | -0.009245 |
| -0.010295 | -0.010091 | -0.007451 | -0.001439 | -0.001038 | -0.000451 |
| -0.000822 | -0.000481 | -0.001198 | -0.000649 | -0.001329 | -0.000726 |
| -0.000415 | -0.000628 | -0.001376 | -0.001367 | -0.001814 | -0.007450 |
| -0.009605 | -0.009303 | -0.010294 | -0.009456 | -0.007111 | -0.001307 |
| -0.000832 | -0.000588 | -0.000734 | -0.000673 | -0.000587 | -0.001283 |
| -0.000656 | -0.000501 | -0.000856 | -0.001027 | -0.000689 | -0.001206 |
| -0.002132 | -0.006895 | -0.009205 | -0.009285 | -0.009799 | -0.010086 |
| -0.007340 | -0.001835 | -0.001064 | -0.000795 | -0.000981 | -0.001038 |
| -0.000924 | -0.000666 | -0.000745 | -0.001050 | -0.000995 | -0.001348 |
| -0.000990 | -0.001004 | -0.001560 | -0.007633 | -0.009310 | -0.009269 |
| -0.009856 | -0.009995 | -0.007915 | -0.002420 | -0.000370 | -0.000885 |
| -0.001011 | -0.000291 | -0.000632 | -0.000593 | -0.000593 | -0.000787 |
| -0.000899 | -0.000845 | -0.000953 | -0.000389 | -0.001706 | -0.007215 |
| -0.009493 | -0.009950 | -0.009478 | -0.009546 | -0.007286 | -0.001477 |
| 0.000013 | -0.000192 | -0.000470 | -0.000805 | -0.000909 | -0.000523 |
| -0.000211 | -0.000940 | -0.000356 | -0.000504 | -0.000917 | -0.000438 |
| -0.001977 | -0.007562 | -0.009741 | -0.009526 | -0.009855 | -0.010168 |
| -0.006833 | -0.001318 | 0.000267 | 0.000128 | -0.000802 | -0.000022 |

| | | | | | |
|---|---|---|---|---|---|
| 0.000003 | -0.000027 | -0.000280 | -0.000542 | -0.000128 | -0.000209 |
| 0.000022 | -0.000541 | -0.000639 | -0.007228 | -0.009918 | -0.009466 |
| -0.009250 | -0.010194 | -0.007087 | -0.000207 | 0.000539 | 0.000779 |
| 0.000889 | 0.000193 | 0.000803 | -0.000137 | 0.000144 | 0.000333 |
| 0.000452 | -0.000043 | -0.000137 | 0.000449 | -0.000985 | -0.006956 |
| -0.009543 | -0.009631 | -0.009434 | -0.010009 | -0.007035 | 0.000133 |
| 0.001335 | 0.001434 | 0.000867 | 0.001197 | 0.001554 | 0.001162 |
| 0.000675 | 0.001159 | 0.001059 | 0.000844 | 0.000854 | 0.000819 |
| -0.000394 | -0.007354 | -0.010123 | -0.009525 | -0.009922 | -0.010047 |
| -0.006373 | 0.000585 | 0.002478 | 0.002418 | 0.002201 | 0.002495 |
| 0.001629 | 0.001619 | 0.001326 | 0.002373 | 0.002016 | 0.002107 |
| 0.002404 | 0.002409 | 0.001422 | -0.006379 | -0.009434 | -0.009616 |
| -0.010205 | -0.009607 | -0.006250 | 0.002239 | 0.003699 | 0.004285 |
| 0.003928 | 0.003748 | 0.004032 | 0.003715 | 0.003274 | 0.003969 |
| 0.003342 | 0.003433 | 0.003967 | 0.003791 | 0.003104 | -0.006119 |
| -0.009156 | -0.009485 | -0.009940 | -0.010072 | -0.005157 | 0.003698 |
| 0.005570 | 0.004783 | 0.005190 | 0.005136 | 0.005096 | 0.005325 |
| 0.005405 | 0.005707 | 0.004942 | 0.004643 | 0.005782 | 0.004957 |
| 0.003907 | -0.005157 | -0.009637 | -0.009535 | -0.009647 | -0.009707 |
| -0.006219 | 0.004494 | 0.006185 | 0.006129 | 0.006405 | 0.006334 |
| 0.006514 | 0.006027 | 0.006642 | 0.006842 | 0.006561 | 0.006501 |
| 0.006610 | 0.006753 | 0.004840 | -0.005673 | -0.009883 | -0.010460 |
| -0.009274 | -0.009583 | -0.007407 | -0.002606 | -0.002764 | -0.002600 |
| -0.002985 | -0.002478 | -0.002390 | -0.002444 | -0.002576 | -0.001812 |
| -0.002520 | -0.002025 | -0.002083 | -0.002784 | -0.002801 | -0.007951 |
| -0.009768 | -0.009206 | -0.010174 | -0.010277 | -0.010611 | -0.011404 |
| -0.011006 | -0.011451 | -0.010911 | -0.010812 | -0.011268 | -0.010940 |
| -0.010838 | -0.011513 | -0.011568 | -0.010744 | -0.010733 | -0.011641 |
| -0.010971 | -0.010216 | -0.009827 | -0.009529 | 0.001852 | -0.101844 |
| 0.066112 | 0.113442 | -0.006506 | -0.087530 | -0.154932 | -0.204120 |
| -0.175942 | -0.109949 | -0.068695 | -0.084371 | -0.155401 | -0.174954 |
| -0.191783 | -0.212204 | -0.151133 | -0.064041 | 0.017199 | 0.037650 |
| 0.016783 | -0.032557 | -0.004489 | 0.014278 | 0.022634 | 0.048983 |
| 0.056570 | -0.003764 | -0.024557 | -0.026758 | -0.034869 | -0.039301 |
| -0.040931 | -0.004268 | 0.016819 | -0.000990 | 0.010294 | 0.023064 |
| -0.001127 | 0.021742 | 0.080198 | 0.076013 | 0.083802 | 0.027915 |
| -0.117413 | -0.178492 | -0.197378 | -0.144529 | -0.179239 | -0.243943 |
| -0.162496 | -0.165890 | -0.252945 | -0.214228 | -0.204254 | -0.275555 |
| -0.312445 | -0.283864 | 0.024417 | 0.128573 | 0.085736 | 0.062914 |
| 0.036657 | -0.022164 | -0.129215 | -0.176436 | -0.208940 | -0.233844 |
| -0.181515 | -0.103556 | -0.141960 | -0.187181 | -0.237941 | -0.207006 |
| -0.189350 | -0.210783 | -0.219967 | -0.205934 | -0.099608 | -0.005698 |
| 0.078559 | -0.018461 | -0.009954 | -0.043048 | -0.133201 | -0.158675 |
| -0.160231 | -0.128077 | -0.111195 | -0.102705 | -0.092661 | -0.113173 |
| -0.162008 | -0.102314 | -0.074585 | -0.130076 | -0.117175 | -0.091165 |
| -0.110088 | -0.068095 | 0.018959 | 0.075045 | 0.041891 | 0.005554 |
| -0.035148 | -0.051769 | -0.052301 | -0.017530 | -0.012953 | -0.021445 |
| -0.005304 | 0.028507 | 0.082090 | 0.007811 | -0.039237 | -0.010362 |
| -0.021361 | -0.032753 | 0.030148 | 0.028127 | -0.020302 | 0.027189 |
| 0.053028 | 0.063240 | 0.050523 | 0.019493 | 0.001166 | 0.033464 |
| 0.043699 | 0.039384 | -0.011478 | -0.014206 | 0.030488 | 0.091277 |
| 0.109988 | 0.042387 | 0.009925 | -0.008801 | -0.008461 | -0.051358 |
| -0.122913 | 0.036278 | 0.019239 | 0.046733 | 0.137937 | 0.066163 |
| -0.003098 | 0.030430 | 0.037774 | 0.034477 | 0.052839 | 0.058828 |
| 0.050415 | 0.098406 | 0.120391 | 0.081329 | 0.091219 | 0.111837 |
| 0.114608 | 0.076858 | 0.010275 | 0.010544 | -0.042506 | -0.011613 |
| 0.137417 | 0.150319 | 0.139673 | 0.139851 | 0.125382 | 0.104510 |
| 0.100186 | 0.106934 | 0.121833 | 0.077948 | 0.055042 | 0.089733 |
| 0.083765 | 0.068700 | 0.072071 | 0.046481 | 0.001029 | 0.048415 |
| -0.021991 | -0.026038 | 0.062773 | 0.122897 | 0.162144 | 0.153452 |

| | | | | | |
|---|---|---|---|---|---|
| 0.101497 | 0.041031 | 0.128299 | 0.182037 | 0.204761 | 0.138894 |
| 0.095531 | 0.114179 | 0.147561 | 0.159911 | 0.042881 | -0.007029 |
| -0.007048 | 0.141391 | 0.090756 | 0.107541 | 0.219089 | 0.175169 |
| 0.120129 | 0.129117 | 0.121849 | 0.104594 | 0.075126 | 0.074047 |
| 0.102756 | 0.143509 | 0.165819 | 0.150084 | 0.130245 | 0.107199 |
| 0.076808 | 0.040047 | -0.002507 | 0.002510 | 0.004420 | 0.065613 |
| 0.210334 | 0.222691 | 0.194336 | 0.123984 | 0.106891 | 0.119974 |
| 0.161921 | 0.158184 | 0.107876 | 0.102482 | 0.096621 | 0.083275 |
| 0.120757 | 0.150740 | 0.059339 | 0.034057 | 0.057305 | -0.019029 |
| -0.002603 | 0.049781 | 0.155176 | 0.189688 | 0.200085 | 0.176591 |
| 0.160238 | 0.143077 | 0.090635 | 0.141833 | 0.295999 | 0.193634 |
| 0.101911 | 0.079891 | 0.107845 | 0.139407 | 0.102735 | 0.060577 |
| 0.013622 | 0.020497 | 0.028482 | 0.049301 | 0.090178 | 0.100907 |
| 0.119093 | 0.182438 | 0.248718 | 0.307016 | 0.256737 | 0.212558 |
| 0.176628 | 0.215903 | 0.224043 | 0.153041 | 0.159261 | 0.164071 |
| 0.038129 | 0.039033 | 0.130900 | -0.051088 | 0.016524 | 0.059787 |
| 0.069941 | 0.148563 | 0.210755 | 0.182701 | 0.159234 | 0.138685 |
| 0.139297 | 0.171776 | 0.237234 | 0.215697 | 0.191616 | 0.178249 |
| 0.209406 | 0.220605 | 0.056797 | -0.032276 | -0.070261 | 0.080397 |
| -0.031087 | -0.041867 | 0.087603 | 0.178331 | 0.235598 | 0.222520 |
| 0.217976 | 0.215317 | 0.170446 | 0.168982 | 0.211069 | 0.143346 |
| 0.111036 | 0.169725 | 0.202789 | 0.201237 | 0.072344 | 0.034274 |
| 0.060442 | 0.014531 | -0.022714 | 0.028591 | 0.207918 | 0.197831 |
| 0.162148 | 0.160011 | 0.187348 | 0.226227 | 0.212240 | 0.245012 |
| 0.326387 | 0.234612 | 0.166394 | 0.175798 | 0.168139 | 0.143236 |
| 0.059865 | 0.040809 | 0.066903 | 0.067179 | -0.046027 | -0.009097 |
| 0.238142 | 0.361477 | 0.411171 | 0.317970 | 0.278645 | 0.271302 |
| 0.329860 | 0.355759 | 0.348796 | 0.306601 | 0.271438 | 0.253807 |
| 0.250071 | 0.212415 | -0.010166 | -0.089434 | -0.065628 | -0.095627 |
| -0.002615 | 0.039558 | 0.011911 | 0.036463 | 0.061387 | 0.051655 |
| 0.055334 | 0.062904 | 0.027720 | 0.025146 | 0.055898 | 0.046881 |
| 0.057835 | 0.119835 | 0.141129 | 0.133376 | 0.042473 | 0.015582 |
| 0.035266 | -0.096291 | -0.098924 | -0.066454 | 0.016403 | 0.044493 |
| 0.027454 | -0.091252 | -0.083126 | -0.019393 | -0.040143 | -0.061856 |
| -0.085949 | -0.014630 | 0.024280 | -0.015353 | -0.063700 | -0.100469 |
| -0.066954 | -0.034538 | -0.002715 | -0.001212 | -0.010028 | -0.010142 |
| -0.010293 | -0.010029 | -0.010328 | -0.010264 | -0.010624 | -0.010896 |
| -0.010769 | -0.010096 | -0.010208 | -0.010460 | -0.010126 | -0.010609 |
| -0.011037 | -0.010615 | -0.010368 | -0.010005 | -0.009325 | -0.009952 |
| -0.010071 | -0.009424 | -0.008450 | -0.003618 | -0.003371 | -0.003777 |
| -0.003604 | -0.003311 | -0.003527 | -0.003397 | -0.003673 | -0.003273 |
| -0.003312 | -0.002987 | -0.002653 | -0.002626 | -0.003871 | -0.008198 |
| -0.009634 | -0.009201 | -0.010274 | -0.009275 | -0.006385 | 0.000953 |
| 0.002331 | 0.001584 | 0.002513 | 0.001948 | 0.001945 | 0.001813 |
| 0.001443 | 0.001634 | 0.001263 | 0.001656 | 0.001282 | 0.001094 |
| 0.000192 | -0.006709 | -0.009745 | -0.009401 | -0.009682 | -0.009445 |
| -0.006279 | 0.000058 | 0.001352 | 0.001290 | 0.001004 | 0.001190 |
| 0.000885 | 0.000923 | 0.001304 | 0.001032 | 0.001318 | 0.001005 |
| 0.000737 | 0.000661 | 0.000092 | -0.007424 | -0.010173 | -0.008830 |
| -0.009903 | -0.010249 | -0.006993 | -0.000835 | 0.000971 | 0.000599 |
| 0.000475 | 0.000876 | 0.000496 | 0.000573 | 0.000340 | -0.000233 |
| -0.000003 | 0.000504 | 0.000208 | 0.000188 | -0.000008 | -0.007100 |
| -0.010160 | -0.009273 | -0.009957 | -0.009534 | -0.007186 | -0.001319 |
| -0.000576 | -0.000188 | 0.000276 | 0.000131 | -0.000035 | -0.000293 |
| 0.000056 | -0.000716 | -0.000475 | -0.000066 | -0.000125 | -0.000559 |
| -0.001496 | -0.006468 | -0.009680 | -0.009879 | -0.009903 | -0.009847 |
| -0.007365 | -0.001992 | -0.000860 | -0.000728 | -0.000592 | -0.001262 |
| -0.000989 | -0.000566 | -0.001121 | -0.001444 | -0.000979 | -0.000650 |
| -0.000650 | -0.001337 | -0.002445 | -0.006953 | -0.009357 | -0.010043 |
| -0.009722 | -0.010048 | -0.007565 | -0.001849 | -0.001317 | -0.001618 |

|  |  |  |  |  |  |
|---|---|---|---|---|---|
| -0.000742 | -0.001139 | -0.001549 | -0.001396 | -0.001484 | 001111 |
| -0.001117 | -0.001267 | -0.000900 | -0.001098 | -0.002311 | -0.007234 |
| -0.009219 | -0.009773 | -0.009518 | -0.009256 | -0.007101 | -0.001606 |
| -0.000744 | -0.000926 | -0.001604 | -0.001185 | -0.001322 | -0.000901 |
| -0.001563 | -0.001652 | -0.001204 | -0.001080 | -0.001124 | -0.000972 |
| -0.001766 | -0.007008 | -0.009908 | -0.009426 | -0.009938 | -0.009683 |
| -0.007368 | -0.001738 | -0.000805 | -0.001235 | -0.001221 | -0.000400 |
| -0.000683 | -0.001022 | -0.000214 | -0.000827 | -0.000638 | -0.000928 |
| -0.001171 | -0.000785 | -0.001520 | -0.007734 | -0.009972 | -0.010052 |
| -0.009414 | -0.009827 | -0.007732 | -0.001858 | -0.000253 | -0.001059 |
| -0.000499 | -0.000927 | -0.001210 | -0.000534 | -0.001072 | -0.000585 |
| -0.000529 | -0.000662 | -0.000572 | -0.000656 | -0.002077 | -0.006893 |
| -0.009574 | -0.009987 | -0.010165 | -0.009720 | -0.007013 | -0.001539 |
| -0.000359 | -0.000843 | -0.000406 | -0.000299 | -0.000550 | -0.000429 |
| -0.000650 | -0.000221 | -0.000092 | -0.000806 | -0.000297 |  |
| -0.000988 | -0.007313 | -0.009623 | -0.009508 | -0.009326 | -0.010201 |
| -0.007443 | -0.000289 | 0.000795 | 0.000087 | 0.000468 | -0.000226 |
| 0.000767 | 0.000249 | -0.000373 | 0.000455 | -0.000105 | -0.000065 |
| -0.000422 | 0.000123 | -0.001302 | -0.007279 | -0.010104 | -0.010203 |
| -0.010351 | -0.009641 | -0.007319 | -0.000132 | 0.001225 | 0.001275 |
| 0.001024 | 0.001261 | 0.000716 | 0.000478 | 0.000729 | 0.001117 |
| 0.000903 | 0.000585 | 0.000322 | 0.000615 | 0.000259 | -0.006917 |
| -0.009882 | -0.009190 | -0.009262 | -0.009542 | -0.006722 | 0.000709 |
| 0.002500 | 0.001838 | 0.001878 | 0.002330 | 0.002139 | 0.001970 |
| 0.001669 | 0.001726 | 0.001814 | 0.002240 | 0.002278 | 0.002435 |
| 0.000953 | -0.006638 | -0.009943 | -0.009429 | -0.009981 | -0.009420 |
| -0.006627 | 0.001752 | 0.003527 | 0.003767 | 0.004047 | 0.003196 |
| 0.003507 | 0.003477 | 0.003489 | 0.004076 | 0.003586 | 0.003408 |
| 0.003760 | 0.004050 | 0.002698 | -0.005930 | -0.009932 | -0.009713 |
| -0.010409 | -0.009820 | -0.005979 | 0.003538 | 0.004568 | 0.004753 |
| 0.005068 | 0.004747 | 0.005487 | 0.004793 | 0.005333 | 0.005172 |
| 0.004348 | 0.005075 | 0.005232 | 0.003848 | -0.005807 |  |
| -0.009365 | -0.009938 | -0.009749 | -0.009818 | -0.006006 | 0.003959 |
| 0.006043 | 0.005522 | 0.006042 | 0.006241 | 0.006217 | 0.005374 |
| 0.005996 | 0.006346 | 0.005741 | 0.005593 | 0.005244 | 0.005177 |
| 0.004243 | -0.005980 | -0.010314 | -0.010420 | -0.009399 | -0.009863 |
| -0.007600 | -0.003379 | -0.002764 | -0.002746 | -0.003159 | -0.002997 |
| -0.002341 | -0.002918 | -0.003254 | -0.002748 | -0.002306 |  |
| -0.002350 | -0.002589 | -0.003841 | -0.007938 | -0.009154 | -0.009354 |
| -0.009556 | -0.009655 | -0.010598 | -0.010360 | -0.010517 | -0.011101 |
| -0.010859 | -0.010732 | -0.010433 | -0.011076 | -0.011033 | -0.010772 |
| -0.011109 | -0.010555 | -0.010161 | -0.011393 | -0.011405 | -0.010912 |
| -0.009771 | -0.009481 | 0.002763 | -0.010458 | -0.009493 | -0.010229 |
| -0.010525 | -0.010198 | -0.010795 | -0.010896 | -0.010796 | -0.010687 |
| -0.010613 | -0.009997 | -0.009982 | -0.011174 | -0.010704 | -0.010800 |
| -0.010039 | -0.010633 | -0.009969 | -0.009740 | -0.009478 | -0.010236 |
| -0.010032 | -0.007870 | -0.004092 | -0.002981 | -0.003238 | -0.003170 |
| -0.003333 | -0.002674 | -0.003435 | -0.003248 | -0.003503 | -0.002922 |
| -0.003067 | -0.002577 | -0.002938 | -0.003827 | -0.009963 |  |
| -0.009990 | -0.009510 | -0.009749 | -0.006111 | 0.000545 | 0.001949 |
| 0.002099 | 0.002085 | 0.002370 | 0.002136 | 0.001320 | 0.001684 |
| 0.001974 | 0.002096 | 0.001725 | 0.001438 | 0.001715 | 0.000495 |
| -0.006725 | -0.009591 | -0.009655 | -0.010029 | -0.009838 | -0.007030 |
| 0.000461 | 0.001141 | 0.000764 | 0.001079 | 0.001034 | 0.001005 |
| 0.000640 | 0.001462 | 0.001566 | 0.000629 | 0.000452 | 0.000806 |
| 0.001369 | -0.000586 | -0.006964 | -0.009797 | -0.009803 | -0.009778 |
| -0.009821 | -0.007343 | -0.000198 | 0.000570 | 0.000662 | 0.000359 |
| 0.001122 | 0.000776 | 0.000633 | 0.000468 | 0.000291 | 0.000301 |
| 0.000446 | 0.000839 | 0.000460 | -0.000500 | -0.007125 | -0.010371 |
| -0.009756 | -0.010069 | -0.009955 | -0.007316 | -0.001427 | -0.000168 |

| | | | | | |
|---|---|---|---|---|---|
| 0.000294 | -0.000505 | 0.000119 | 0.000072 | 0.000196 | 0.000331 |
| 0.000038 | -0.000671 | 0.000143 | 0.000245 | 0.000127 | -0.001087 |
| -0.006886 | -0.008913 | -0.009149 | -0.010210 | -0.010026 | -0.007615 |
| -0.001572 | -0.000721 | -0.000808 | -0.000885 | -0.000547 | -0.000864 |
| -0.000876 | -0.000872 | -0.001478 | -0.000534 | -0.000886 | -0.001017 |
| -0.000930 | -0.002055 | -0.006971 | -0.009711 | -0.009878 | -0.009685 |
| -0.009714 | -0.007380 | -0.002055 | -0.001436 | -0.001403 | -0.000975 |
| -0.000512 | -0.000596 | -0.001281 | -0.000619 | -0.001187 | -0.001186 |
| -0.001181 | -0.001214 | -0.001159 | -0.002143 | -0.007613 | -0.009242 |
| -0.009210 | -0.009385 | -0.009412 | -0.007484 | -0.001345 | -0.001168 |
| -0.001095 | -0.000786 | -0.001403 | -0.001437 | -0.000441 | -0.001286 |
| -0.001083 | -0.000878 | -0.001415 | -0.001676 | -0.001128 | -0.001842 |
| -0.007852 | -0.009164 | -0.009180 | -0.009963 | -0.009500 | -0.007898 |
| -0.002164 | -0.001011 | -0.000750 | -0.001016 | -0.001133 | -0.000862 |
| -0.000580 | -0.000211 | -0.000457 | -0.001261 | -0.000529 | |
| -0.000751 | -0.001377 | -0.007898 | -0.009490 | -0.009482 | -0.009760 |
| -0.009346 | -0.007495 | -0.001589 | -0.000842 | -0.000182 | -0.000634 |
| -0.000680 | -0.000431 | -0.000644 | -0.000862 | -0.000608 | -0.000157 |
| -0.000371 | -0.000177 | -0.000679 | -0.001956 | -0.006785 | -0.009341 |
| -0.009594 | -0.009560 | -0.009983 | -0.007455 | -0.001165 | -0.000084 |
| -0.000733 | -0.000914 | -0.000722 | -0.000318 | -0.000502 | -0.000033 |
| -0.000402 | -0.000515 | -0.000026 | -0.000586 | -0.000217 | -0.001062 |
| -0.007438 | -0.009571 | -0.009326 | -0.009834 | -0.009812 | -0.007154 |
| -0.000264 | 0.000172 | 0.000809 | 0.000449 | -0.000128 | 0.000751 |
| 0.000390 | 0.000189 | 0.000138 | -0.000066 | 0.000717 | 0.000437 |
| -0.000347 | -0.000825 | -0.007611 | -0.009961 | -0.010225 | -0.010210 |
| -0.010241 | -0.006796 | -0.000703 | 0.001072 | 0.000466 | 0.000411 |
| 0.000580 | 0.001325 | 0.001083 | 0.001029 | 0.001278 | 0.000908 |
| 0.001000 | 0.000867 | 0.000873 | -0.000438 | -0.006629 | -0.009562 |
| -0.009452 | -0.009594 | -0.009567 | -0.006294 | 0.000276 | 0.002648 |
| 0.002627 | 0.001619 | 0.001672 | 0.002185 | 0.001694 | 0.001864 |
| 0.002320 | 0.001745 | 0.001469 | 0.002360 | 0.000740 | |
| -0.006572 | -0.009193 | -0.009147 | -0.010364 | -0.010081 | -0.006058 |
| 0.001574 | 0.003426 | 0.003573 | 0.003267 | 0.003294 | 0.003126 |
| 0.003070 | 0.003515 | 0.003935 | 0.003793 | 0.003910 | 0.003931 |
| 0.004028 | 0.002677 | -0.006491 | -0.009063 | -0.009373 | -0.009766 |
| -0.009574 | -0.005873 | 0.003717 | 0.005199 | 0.004450 | 0.004939 |
| 0.005267 | 0.005411 | 0.004720 | 0.005111 | 0.005466 | 0.004955 |
| 0.004858 | 0.005082 | 0.005171 | 0.003584 | -0.006053 | -0.010040 |
| -0.009917 | -0.009506 | -0.009833 | -0.006221 | 0.003952 | 0.005762 |
| 0.005847 | 0.005383 | 0.005805 | 0.006012 | 0.005552 | 0.006253 |
| 0.006311 | 0.006108 | 0.005989 | 0.005327 | 0.005772 | 0.004050 |
| -0.005854 | -0.009551 | -0.010286 | -0.009830 | -0.007714 | |
| -0.003118 | -0.002417 | -0.002669 | -0.003086 | -0.002715 | -0.002235 |
| -0.002729 | -0.003047 | -0.002006 | -0.002257 | -0.002450 | -0.002542 |
| -0.002083 | -0.003292 | -0.007462 | -0.009695 | -0.009833 | -0.009629 |
| -0.009685 | -0.009762 | -0.010221 | -0.011168 | -0.010362 | -0.010534 |
| -0.011331 | -0.011120 | -0.011310 | -0.011109 | -0.010926 | -0.010809 |
| -0.010663 | -0.010933 | -0.011402 | -0.011379 | -0.010618 | -0.010230 |
| -0.010256 | 0.002746 | -0.009605 | -0.010170 | -0.010120 | -0.010619 |
| -0.009913 | -0.010136 | -0.010968 | -0.010960 | -0.010033 | -0.010314 |
| -0.010233 | -0.010123 | -0.010785 | -0.011030 | -0.010477 | -0.010325 |
| -0.010229 | -0.009902 | -0.009222 | -0.009737 | -0.010420 | -0.009925 |
| -0.008236 | -0.002991 | -0.002657 | -0.002310 | -0.003032 | -0.002154 |
| -0.002176 | -0.002313 | -0.002529 | -0.002779 | -0.002954 | -0.002820 |
| -0.001832 | -0.002073 | -0.003628 | -0.007661 | -0.009701 | -0.009350 |
| -0.010053 | -0.008979 | -0.006202 | 0.001196 | 0.002393 | 0.002975 |
| 0.002631 | 0.002987 | 0.002030 | 0.002681 | 0.001999 | 0.002748 |
| 0.002560 | 0.002340 | 0.002328 | 0.002563 | 0.001174 | -0.005954 |
| -0.009243 | -0.008858 | -0.009733 | -0.010048 | -0.006195 | 0.000160 |

| | | | | | |
|---|---|---|---|---|---|
| 0.001135 | 0.001074 | 0.000285 | 0.000899 | 0.001071 | .00742 |
| 0.000919 | 0.000989 | 0.000676 | 0.000309 | 0.000505 | 0.001157 |
| -0.000139 | -0.007544 | -0.009425 | -0.009295 | -0.010067 | -0.010046 |
| -0.007398 | -0.001189 | 0.000448 | -0.000004 | 0.000391 | 0.000131 |
| 0.000155 | 0.000706 | -0.000148 | -0.000299 | 0.000422 | -0.000035 |
| 0.000332 | -0.000165 | -0.000916 | -0.007380 | -0.009498 | -0.009458 |
| -0.009232 | -0.009572 | -0.007143 | -0.001842 | -0.000710 | -0.000320 |
| -0.000518 | -0.000787 | -0.000894 | -0.000319 | -0.000115 | -0.000100 |
| -0.000620 | -0.000764 | -0.000911 | -0.001004 | -0.001096 | -0.007222 |
| -0.008883 | -0.008748 | -0.010176 | -0.009558 | -0.007110 | -0.002010 |
| -0.000733 | -0.001053 | -0.000896 | -0.000656 | -0.001401 | -0.001584 |
| -0.001406 | -0.001278 | -0.000828 | -0.001212 | -0.001505 | -0.001250 |
| -0.002373 | -0.007597 | -0.009718 | -0.009800 | -0.009893 | -0.010179 |
| -0.007102 | -0.002245 | -0.001783 | -0.001240 | -0.001798 | -0.001012 |
| -0.001123 | -0.001408 | -0.000889 | -0.001468 | -0.001020 | -0.001255 |
| -0.001638 | -0.001526 | -0.002197 | -0.007038 | -0.009751 | -0.009698 |
| -0.009236 | -0.009786 | -0.007404 | -0.001704 | -0.000597 | -0.000475 |
| -0.001796 | -0.000995 | -0.001370 | -0.001580 | -0.001444 | -0.001094 |
| -0.001143 | -0.001803 | -0.001937 | -0.001942 | -0.002713 | -0.007432 |
| -0.009216 | -0.009746 | -0.009603 | -0.009351 | -0.007697 | -0.002153 |
| -0.001247 | -0.000576 | -0.001315 | -0.000752 | -0.000435 | -0.000754 |
| -0.000738 | -0.000346 | -0.001160 | -0.001314 | -0.000906 | -0.001151 |
| -0.002197 | -0.007267 | -0.009368 | -0.009337 | -0.009055 | -0.009807 |
| -0.007826 | -0.001073 | -0.001202 | -0.001264 | -0.000397 | -0.000423 |
| -0.001094 | -0.000587 | -0.001190 | -0.000705 | -0.000629 | -0.000586 |
| -0.001017 | -0.001094 | -0.002108 | -0.007198 | -0.009453 | -0.009764 |
| -0.009504 | -0.009291 | -0.007273 | -0.001394 | -0.000886 | -0.000831 |
| -0.000648 | -0.001173 | -0.000543 | -0.000267 | -0.000655 | -0.000991 |
| -0.000985 | -0.000161 | -0.000715 | -0.000630 | -0.001783 | -0.006994 |
| -0.009697 | -0.009738 | -0.009268 | -0.010124 | -0.006559 | -0.001032 |
| 0.000820 | 0.000290 | -0.000205 | 0.000652 | 0.000445 | -0.000204 |
| 0.000153 | 0.000520 | 0.000075 | 0.000291 | -0.000276 | -0.000371 |
| -0.000677 | -0.006832 | -0.009790 | -0.009833 | -0.010270 | -0.009212 |
| -0.006390 | -0.000458 | 0.001290 | 0.000724 | 0.001042 | 0.000994 |
| 0.000991 | 0.001276 | 0.000842 | 0.001225 | 0.000588 | 0.001031 |
| 0.001019 | 0.000870 | -0.000266 | -0.007191 | -0.009190 | -0.009189 |
| -0.010006 | -0.009525 | -0.006283 | 0.000959 | 0.002273 | 0.002762 |
| 0.001679 | 0.002139 | 0.002018 | 0.001744 | 0.001341 | 0.001676 |
| 0.001729 | 0.002380 | 0.001603 | 0.001856 | 0.001192 | -0.006733 |
| -0.009397 | -0.008875 | -0.009459 | -0.010229 | -0.006042 | 0.002166 |
| 0.003529 | 0.003598 | 0.003867 | 0.003584 | 0.003370 | 0.003745 |
| 0.002973 | 0.003410 | 0.004036 | 0.003434 | 0.003856 | 0.003380 |
| 0.002784 | -0.006296 | -0.009622 | -0.009488 | -0.009946 | -0.009843 |
| -0.005923 | 0.004191 | 0.005608 | 0.005373 | 0.005470 | 0.005130 |
| 0.005520 | 0.005232 | 0.005412 | 0.005075 | 0.004742 | 0.005342 |
| 0.004978 | 0.005703 | 0.003595 | -0.005107 | -0.009300 | -0.009072 |
| -0.009957 | -0.009964 | -0.005529 | 0.004347 | 0.006021 | 0.006465 |
| 0.006161 | 0.006772 | 0.006580 | 0.006157 | 0.006231 | 0.006845 |
| 0.006775 | 0.006395 | 0.006404 | 0.006050 | 0.004862 | -0.005550 |
| -0.009838 | -0.010236 | -0.009413 | -0.009214 | -0.007512 | -0.002539 |
| -0.002503 | -0.002939 | -0.002087 | -0.002223 | -0.002667 | -0.003106 |
| -0.002285 | -0.001920 | -0.002450 | -0.002713 | -0.002432 | -0.002102 |
| -0.002868 | -0.007528 | -0.009672 | -0.009290 | -0.009781 | -0.009275 |
| -0.009942 | -0.011516 | -0.010919 | -0.011506 | -0.011303 | -0.011611 |
| -0.011456 | -0.011829 | -0.011377 | -0.011607 | -0.011336 | -0.011419 |
| -0.011175 | -0.011297 | -0.011909 | -0.010803 | -0.010065 | -0.009202 |
| 0.001840 | 0.007845 | -0.005023 | -0.072296 | -0.215654 | -0.238825 |
| -0.238175 | -0.241786 | -0.238455 | -0.233179 | -0.245459 | -0.246533 |
| -0.237194 | -0.237375 | -0.242245 | -0.258086 | -0.255451 | -0.225548 |
| -0.082721 | -0.011557 | 0.008639 | 0.006972 | -0.004775 | -0.035295 |

| | | | | | |
|---|---|---|---|---|---|
| -0.091510 | -0.101216 | -0.103242 | -0.108470 | -0.106440 | -0.103044 |
| -0.109177 | -0.117165 | -0.125992 | -0.130354 | -0.133853 | -0.135652 |
| -0.136544 | -0.121329 | -0.032574 | 0.002267 | -0.000096 | -0.013765 |
| -0.010831 | 0.007645 | 0.047710 | 0.057465 | 0.057164 | 0.045697 |
| 0.051648 | 0.065390 | 0.049986 | 0.046116 | 0.051638 | 0.059240 |
| 0.067348 | 0.076390 | 0.064722 | 0.041742 | -0.008923 | -0.025577 |
| -0.020138 | 0.000759 | -0.003669 | 0.006626 | 0.037693 | 0.053867 |
| 0.063312 | 0.060397 | 0.068632 | 0.079788 | 0.063830 | 0.057012 |
| 0.057660 | 0.073517 | 0.076712 | 0.052504 | 0.048357 | 0.043517 |
| 0.002535 | -0.009110 | 0.002133 | 0.009647 | -0.004269 | 0.002077 |
| 0.039481 | 0.061342 | 0.071346 | 0.056408 | 0.052959 | 0.056072 |
| 0.055148 | 0.057599 | 0.061465 | 0.055174 | 0.051521 | 0.052346 |
| 0.056401 | 0.053477 | 0.009397 | -0.006532 | -0.000910 | 0.005113 |
| 0.002193 | 0.010449 | 0.033744 | 0.039585 | 0.039956 | 0.033042 |
| 0.034414 | 0.038327 | 0.028303 | 0.025729 | 0.029956 | 0.026075 |
| 0.024319 | 0.024556 | 0.037718 | 0.044549 | 0.006353 | -0.000778 |
| 0.012588 | 0.000851 | 0.000860 | 0.007951 | 0.023478 | 0.018534 |
| 0.014107 | 0.020282 | 0.020662 | 0.018196 | 0.016005 | 0.023515 |
| 0.039238 | 0.021063 | 0.014437 | 0.037639 | 0.041323 | 0.035052 |
| 0.008608 | 0.007974 | 0.026453 | 0.001988 | 0.000321 | 0.000133 |
| 0.001545 | 0.002768 | 0.004025 | -0.000510 | 0.002062 | 0.009045 |
| 0.015561 | 0.015780 | 0.009128 | 0.007508 | 0.008361 | 0.013965 |
| 0.017307 | 0.018203 | 0.007127 | 0.000605 | -0.001951 | -0.014583 |
| -0.004977 | -0.005537 | -0.019356 | -0.017176 | -0.011030 | -0.002127 |
| -0.003557 | -0.011166 | -0.019967 | -0.011199 | 0.014054 | 0.013701 |
| 0.008402 | -0.001905 | -0.003807 | -0.004216 | -0.006359 | -0.006291 |
| -0.003955 | -0.007535 | -0.004114 | -0.000885 | 0.001746 | -0.013619 |
| -0.027151 | -0.026920 | -0.028230 | -0.030894 | -0.030039 | -0.021139 |
| -0.002903 | -0.006976 | -0.011556 | -0.012463 | -0.011695 | -0.008659 |
| 0.000216 | 0.004171 | 0.003189 | -0.021294 | -0.006780 | -0.003776 |
| -0.017391 | -0.020757 | -0.020539 | -0.016745 | -0.014992 | -0.013505 |
| -0.006634 | -0.009801 | -0.023146 | -0.023673 | -0.022881 | -0.021319 |
| -0.022423 | -0.022281 | -0.019560 | -0.006127 | 0.013663 | 0.018310 |
| 0.001072 | -0.011665 | -0.021259 | -0.031652 | -0.038347 | -0.029341 |
| -0.027167 | -0.028402 | -0.041060 | -0.036174 | -0.014987 | -0.016291 |
| -0.017498 | -0.017572 | -0.022772 | -0.025577 | -0.000277 | 0.001084 |
| -0.014374 | 0.005891 | 0.003446 | -0.010874 | -0.042036 | -0.045423 |
| -0.043833 | -0.042274 | -0.046539 | -0.051827 | -0.043525 | -0.043561 |
| -0.052234 | -0.047467 | -0.040291 | -0.033619 | -0.034391 | -0.035419 |
| -0.017579 | -0.006082 | 0.001230 | 0.016262 | -0.002778 | -0.024216 |
| -0.047335 | -0.046191 | -0.043056 | -0.045384 | -0.054728 | -0.064350 |
| -0.055091 | -0.049721 | -0.045928 | -0.044976 | -0.044830 | -0.047190 |
| -0.049127 | -0.046064 | -0.014069 | -0.008400 | -0.023010 | 0.006579 |
| -0.001033 | -0.020882 | -0.057523 | -0.061971 | -0.057776 | -0.052480 |
| -0.051723 | -0.052470 | -0.047301 | -0.050958 | -0.066047 | -0.063518 |
| -0.057543 | -0.048583 | -0.054989 | -0.056600 | -0.013061 | -0.000132 |
| -0.009357 | 0.000875 | -0.000751 | -0.010316 | -0.027831 | -0.030133 |
| -0.027097 | -0.019705 | -0.014850 | -0.010414 | -0.016872 | -0.028315 |
| -0.044219 | -0.034174 | -0.022858 | -0.018321 | -0.024717 | -0.024717 |
| -0.001877 | 0.000482 | -0.011195 | -0.010395 | -0.008167 | -0.000064 |
| 0.019294 | 0.029241 | 0.033054 | 0.027632 | 0.029626 | 0.035079 |
| 0.046912 | 0.043568 | 0.025642 | 0.036489 | 0.047246 | 0.047439 |
| 0.036387 | 0.021535 | 0.006681 | 0.000042 | -0.001564 | -0.007831 |
| 0.004495 | 0.028187 | 0.066572 | 0.054560 | 0.038692 | 0.043128 |
| 0.050102 | 0.056771 | 0.048613 | 0.045004 | 0.046934 | 0.051176 |
| 0.053377 | 0.053568 | 0.040212 | 0.024743 | 0.012200 | 0.007351 |
| 0.010178 | 0.014294 | -0.002647 | 0.013061 | 0.076362 | 0.088996 |
| 0.096197 | 0.113982 | 0.117456 | 0.115317 | 0.115081 | 0.114165 |
| 0.109948 | 0.107957 | 0.105951 | 0.104949 | 0.100331 | 0.086483 |
| 0.033781 | 0.008685 | 0.005333 | 0.014098 | 0.006708 | 0.023490 |

- 75 -

| | | | | | |
|---|---|---|---|---|---|
| 0.073138 | 0.096392 | 0.107097 | 0.093039 | 0.089241 | 0.090654 |
| 0.093277 | 0.091197 | 0.083530 | 0.079942 | 0.077092 | 0.075676 |
| 0.093275 | 0.102644 | 0.044974 | 0.010410 | -0.008154 | 0.000369 |
| -0.010420 | -0.009789 | -0.009796 | -0.010919 | -0.011266 | -0.010694 |
| -0.011400 | -0.011346 | -0.010883 | -0.011043 | -0.010658 | -0.010390 |
| -0.010539 | -0.011106 | -0.011184 | -0.010619 | -0.010782 | -0.010330 |
| -0.009626 | -0.010073 | -0.010022 | -0.009551 | -0.008665 | -0.004232 |
| -0.004209 | -0.003365 | -0.003873 | -0.004117 | -0.003647 | -0.003968 |
| -0.003675 | -0.003536 | -0.004160 | -0.003800 | -0.003449 | -0.003517 |
| -0.004276 | -0.008376 | -0.009911 | -0.009806 | -0.009866 | -0.009745 |
| -0.006887 | 0.001055 | 0.002218 | 0.002257 | 0.002014 | 0.001789 |
| 0.001866 | 0.001345 | 0.001189 | 0.001345 | 0.001954 | 0.001148 |
| 0.001390 | 0.001328 | 0.000542 | -0.006500 | -0.009767 | -0.009765 |
| -0.009976 | -0.009766 | -0.006368 | 0.000317 | 0.001697 | 0.001618 |
| 0.000863 | 0.001264 | 0.001068 | 0.001260 | 0.001504 | 0.001403 |
| 0.001749 | 0.001564 | 0.000870 | 0.001434 | -0.000297 | -0.006620 |
| -0.009831 | -0.009704 | -0.010372 | -0.010394 | -0.007612 | -0.000654 |
| 0.000855 | 0.001110 | 0.001584 | 0.000850 | 0.001337 | 0.000907 |
| 0.001049 | 0.000599 | 0.001301 | 0.001071 | 0.001047 | 0.000726 |
| -0.000310 | -0.007025 | -0.009661 | -0.009624 | -0.009556 | -0.010299 |
| -0.007577 | -0.001321 | 0.000579 | 0.000446 | 0.000579 | 0.000082 |
| -0.000033 | 0.000028 | 0.000384 | 0.000023 | -0.000329 | 0.000191 |
| 0.000419 | -0.000043 | -0.001139 | -0.006426 | -0.009326 | -0.009244 |
| -0.009625 | -0.010008 | -0.007055 | -0.001603 | -0.000021 | -0.000334 |
| -0.000951 | -0.000115 | 0.000041 | -0.000230 | -0.000666 | -0.000815 |
| -0.000304 | -0.000157 | -0.000597 | -0.001031 | -0.001597 | -0.007628 |
| -0.009630 | -0.009823 | -0.009935 | -0.009617 | -0.007124 | -0.001395 |
| -0.000581 | -0.000933 | -0.000199 | -0.000538 | -0.000485 | -0.000267 |
| -0.000481 | -0.000664 | -0.000859 | -0.000344 | -0.000945 | -0.000830 |
| -0.001132 | -0.007253 | -0.009370 | -0.009836 | -0.009428 | -0.009486 |
| -0.007282 | -0.001729 | -0.000042 | -0.000340 | -0.000575 | -0.000946 |
| -0.000978 | -0.000753 | -0.000710 | -0.000621 | -0.000585 | -0.000805 |
| -0.000474 | -0.001075 | -0.002155 | -0.006863 | -0.010025 | -0.009457 |
| -0.009916 | -0.010421 | -0.007529 | -0.001880 | -0.001026 | -0.000114 |
| -0.000197 | -0.000446 | -0.000220 | -0.000133 | -0.000530 | 0.000047 |
| 0.000052 | -0.000226 | -0.000619 | -0.000153 | -0.001263 | -0.007898 |
| -0.009822 | -0.009953 | -0.009395 | -0.009850 | -0.007236 | -0.001599 |
| -0.000554 | -0.000626 | -0.000390 | 0.000113 | -0.000100 | -0.000326 |
| -0.000608 | -0.000684 | -0.000201 | 0.000126 | -0.000086 | -0.000173 |
| -0.001225 | -0.007192 | -0.009739 | -0.009635 | -0.009642 | -0.009562 |
| -0.007104 | -0.001028 | 0.000145 | -0.000053 | -0.000739 | -0.000802 |
| -0.000598 | 0.000051 | 0.000188 | -0.000733 | 0.000163 | 0.000232 |
| 0.000090 | 0.000018 | -0.001516 | -0.006984 | -0.009525 | -0.010115 |
| -0.009801 | -0.010218 | -0.007569 | -0.000602 | 0.000820 | 0.000647 |
| 0.000379 | 0.000326 | 0.000151 | 0.000341 | 0.000173 | 0.000801 |
| 0.000452 | 0.000528 | -0.000077 | -0.000156 | -0.001077 | -0.006726 |
| -0.009911 | -0.009689 | -0.009932 | -0.009543 | -0.006539 | -0.000669 |
| 0.000640 | 0.001221 | 0.000863 | 0.001041 | 0.000783 | 0.000696 |
| 0.000991 | 0.000505 | 0.001039 | 0.000843 | 0.001056 | 0.001370 |
| 0.000418 | -0.006625 | -0.009775 | -0.009325 | -0.009721 | -0.009587 |
| -0.006878 | 0.000548 | 0.002220 | 0.002535 | 0.001649 | 0.001961 |
| 0.001412 | 0.002093 | 0.002079 | 0.002052 | 0.001819 | 0.001410 |
| 0.002363 | 0.002255 | 0.000760 | -0.006655 | -0.009574 | -0.009155 |
| -0.009810 | -0.010193 | -0.006082 | 0.002288 | 0.003236 | 0.003589 |
| 0.003827 | 0.003025 | 0.003892 | 0.003268 | 0.003307 | 0.003522 |
| 0.003327 | 0.003036 | 0.003249 | 0.003288 | 0.002297 | -0.006607 |
| -0.009826 | -0.009114 | -0.009621 | -0.009811 | -0.005480 | 0.003273 |
| 0.004875 | 0.004781 | 0.004890 | 0.005062 | 0.005239 | 0.004688 |
| 0.005133 | 0.005239 | 0.004583 | 0.004550 | 0.004505 | 0.004668 |
| 0.003881 | -0.005392 | -0.009711 | -0.009140 | -0.009562 | -0.009888 |

| | | | | | |
|---|---|---|---|---|---|
| -0.005669 | 0.003692 | 0.005137 | 0.005285 | 0.005536 | 0.005841 |
| 0.005823 | 0.005614 | 0.006301 | 0.006594 | 0.006016 | 0.005688 |
| 0.005483 | 0.005837 | 0.004124 | -0.006055 | -0.010392 | -0.010607 |
| -0.009933 | -0.009480 | -0.007395 | -0.003092 | -0.002052 | -0.003091 |
| -0.002875 | -0.002211 | -0.002594 | -0.002946 | -0.003076 | -0.002511 |
| -0.002234 | -0.002645 | -0.002228 | -0.002495 | -0.003512 | -0.007413 |
| -0.009786 | -0.009946 | -0.010182 | -0.010372 | -0.010246 | -0.010846 |
| -0.010656 | -0.010689 | -0.010396 | -0.010118 | -0.010318 | -0.010738 |
| -0.010708 | -0.010337 | -0.010378 | -0.010701 | -0.009980 | -0.010348 |
| -0.010564 | -0.009954 | -0.010093 | -0.010244 | 0.002489 | -0.010354 |
| -0.009749 | -0.010322 | -0.010451 | -0.010345 | -0.010345 | -0.010608 |
| -0.011079 | -0.010535 | -0.010757 | -0.010757 | -0.010311 | -0.010531 |
| -0.010456 | -0.010559 | -0.010853 | -0.009968 | -0.010169 | -0.009238 |
| -0.009848 | -0.009865 | -0.010260 | -0.007782 | -0.004471 | -0.003147 |
| -0.003384 | -0.003461 | -0.003989 | -0.003310 | -0.003415 | -0.003822 |
| -0.003741 | -0.004012 | -0.003743 | -0.003360 | -0.003232 | -0.004275 |
| -0.008157 | -0.010164 | -0.009761 | -0.009519 | -0.009761 | -0.006874 |
| 0.000307 | 0.001657 | 0.001858 | 0.001794 | 0.002112 | 0.001623 |
| 0.001158 | 0.001070 | 0.001064 | 0.001764 | 0.001321 | 0.000921 |
| 0.001596 | 0.000234 | -0.006735 | -0.009578 | -0.009513 | -0.009842 |
| -0.009563 | -0.007117 | 0.000293 | 0.001426 | 0.001463 | 0.001179 |
| 0.000649 | 0.001113 | 0.001403 | 0.001039 | 0.000842 | 0.000911 |
| 0.000499 | 0.000945 | 0.000488 | -0.000178 | -0.007060 | -0.009485 |
| -0.009106 | -0.009747 | -0.010396 | -0.006838 | -0.000588 | 0.000683 |
| 0.000875 | 0.000266 | 0.000917 | 0.001027 | 0.000872 | 0.000774 |
| 0.000144 | 0.000885 | 0.000319 | 0.000694 | 0.000433 | -0.000199 |
| -0.007398 | -0.009575 | -0.010048 | -0.009368 | -0.010219 | -0.007319 |
| -0.001639 | 0.000196 | 0.000329 | -0.000175 | -0.000037 | 0.000123 |
| 0.000222 | 0.000404 | 0.000247 | -0.000176 | -0.000173 | -0.000334 |
| -0.000486 | -0.001444 | -0.006742 | -0.009712 | -0.009318 | -0.009714 |
| -0.009486 | -0.007970 | -0.001903 | -0.000608 | -0.001338 | -0.001303 |
| -0.001099 | -0.000556 | -0.001120 | -0.000778 | -0.000900 | -0.000491 |
| -0.000645 | -0.001184 | -0.000994 | -0.002344 | -0.007600 | -0.009710 |
| -0.009311 | -0.010047 | -0.010437 | -0.007592 | -0.002137 | -0.000858 |
| -0.001231 | -0.000862 | -0.001324 | -0.000710 | -0.001504 | -0.000701 |
| -0.001124 | -0.001169 | -0.000587 | -0.000661 | -0.000690 | -0.002183 |
| -0.007233 | -0.009238 | -0.010022 | -0.010115 | -0.009895 | -0.007386 |
| -0.001444 | -0.000467 | -0.000548 | -0.001290 | -0.000719 | -0.001661 |
| -0.000571 | -0.001422 | -0.000872 | -0.001585 | -0.001512 | -0.001241 |
| -0.001199 | -0.002411 | -0.006936 | -0.010105 | -0.009954 | -0.009163 |
| -0.009961 | -0.007278 | -0.001687 | -0.000589 | -0.001348 | -0.001051 |
| -0.000781 | -0.000408 | -0.000589 | -0.000943 | -0.000137 | -0.001079 |
| -0.001205 | -0.001197 | -0.000586 | -0.001491 | -0.007438 | -0.010486 |
| -0.009990 | -0.009197 | -0.009405 | -0.007231 | -0.001314 | -0.000963 |
| -0.000348 | -0.001072 | -0.000986 | -0.000418 | -0.000418 | -0.000949 |
| -0.000728 | -0.000547 | -0.001093 | -0.000798 | -0.000945 | -0.002069 |
| -0.007228 | -0.009896 | -0.009456 | -0.009804 | -0.010355 | -0.007142 |
| -0.001466 | -0.000575 | -0.000608 | -0.000959 | -0.000635 | -0.000194 |
| -0.000495 | -0.000528 | -0.000431 | -0.000175 | -0.000925 | -0.000882 |
| -0.000557 | -0.001490 | -0.007016 | -0.009305 | -0.010042 | -0.009769 |
| -0.009690 | -0.006992 | -0.000946 | 0.000413 | 0.000388 | 0.000352 |
| -0.000204 | 0.000772 | 0.000315 | -0.000097 | -0.000119 | -0.000037 |
| 0.000278 | -0.000383 | 0.000172 | -0.000900 | -0.006741 | -0.009443 |
| -0.010214 | -0.009636 | -0.010151 | -0.006690 | 0.000044 | 0.001232 |
| 0.001298 | 0.000882 | 0.001356 | 0.001427 | 0.000457 | 0.000851 |
| 0.001287 | 0.001197 | 0.000791 | 0.000340 | 0.000965 | -0.000370 |
| -0.007202 | -0.010195 | -0.009728 | -0.009462 | -0.009361 | -0.006881 |
| 0.000348 | 0.002177 | 0.001731 | 0.002354 | 0.002154 | 0.001566 |
| 0.001545 | 0.001857 | 0.001919 | 0.001424 | 0.002183 | 0.002052 |
| 0.001902 | 0.001057 | -0.006732 | -0.009910 | -0.009547 | -0.009623 |

| | | | | | |
|---|---|---|---|---|---|
| -0.009886 | -0.006599 | 0.006741 | 0.003876 | 0.003845 | 0.003502 |
| 0.003470 | 0.002976 | 0.003184 | 0.003754 | 0.003115 | 0.003437 |
| 0.003188 | 0.003293 | 0.003232 | 0.002279 | -0.005683 | -0.009816 |
| -0.009495 | -0.009600 | -0.009318 | -0.005892 | 0.003892 | 0.004803 |
| 0.005100 | 0.005023 | 0.004923 | 0.005125 | 0.004975 | 0.005254 |
| 0.004832 | 0.004901 | 0.004270 | 0.004470 | 0.004743 | 0.003554 |
| -0.006085 | -0.009750 | -0.009713 | -0.009488 | -0.010067 | -0.006468 |
| 0.003637 | 0.005414 | 0.005259 | 0.005153 | 0.005384 | 0.006088 |
| 0.005994 | 0.005387 | 0.005430 | 0.005920 | 0.005441 | 0.005699 |
| 0.005402 | 0.004018 | -0.005617 | -0.009541 | -0.009967 | -0.009404 |
| -0.009652 | -0.007658 | -0.002858 | -0.003113 | -0.002944 | -0.003125 |
| -0.002740 | -0.002244 | -0.003052 | -0.003260 | -0.002980 | -0.003033 |
| -0.002871 | -0.003065 | -0.002191 | -0.003914 | -0.008038 | -0.009362 |
| -0.009741 | -0.009590 | -0.010317 | -0.010204 | -0.010739 | -0.010574 |
| -0.010757 | -0.010884 | -0.010503 | -0.010695 | -0.010938 | -0.010563 |
| -0.011264 | -0.010765 | -0.010859 | -0.010675 | -0.010460 | -0.010695 |
| -0.010655 | -0.009599 | -0.009598 | 0.001867 | -0.000900 | 0.009970 |
| -0.023636 | 0.008539 | 0.008328 | -0.999826 | 0.009635 | -0.229648 |
| 0.772955 | 0.887268 | 0.003796 | 0.787629 | 0.003588 | 0.114447 |
| 0.009122 | 0.007103 | 0.005532 | -0.763321 | 0.005465 | 0.009928 |
| 0.038183 | 0.007523 | -0.000604 | 0.003726 | 0.000074 | 0.001370 |
| 1.000859 | -0.002568 | -0.015636 | 0.001705 | 0.001714 | 0.003808 |
| 0.002492 | 0.004785 | -0.002019 | 0.001058 | 0.001015 | 0.002266 |
| -0.000929 | 0.001991 | -0.000481 | -0.017739 | -0.004619 | 0.005629 |
| -0.015998 | 0.004847 | 0.005173 | 0.006506 | 0.007108 | -0.069515 |
| -0.099086 | -0.123650 | 0.001476 | 0.909751 | 0.000693 | -0.882815 |
| 0.005117 | 0.004573 | 0.004939 | 0.102150 | 0.002708 | 0.005567 |
| 0.001493 | -0.064087 | -0.072002 | -0.065799 | -0.076037 | -0.070088 |
| -0.000230 | -0.072440 | 0.042364 | 0.888296 | 1.038963 | -0.074770 |
| -0.113126 | -0.071458 | -1.038748 | -0.073047 | -0.072567 | -0.072826 |
| 1.109745 | -0.070066 | -0.072852 | -0.090868 | | |

What is claimed is:

1. A system for automatically monitoring pads of material deposited on a surface of a workpiece comprising
an inspection system that senses a deposited pad of material and determines pad height values at a plurality of locations across said pad, and
a shape classifier that receives said pad height values as inputs and outputs a plurality of three-dimensional shape attributes related to pad deposit conditions.

2. The system of claim 1 wherein said shape classifier implements a neural network with input nodes that receive said pad height values and output nodes that output said three-dimensional shape attributes.

3. The system of claim 1 wherein said plurality of locations across said pad are grid points of an X–Y matrix on the surface of said workpiece.

4. The system of claim 1 wherein one of said plurality of three-dimensional shape attributes is scoop.

5. The system of claim 1 wherein one of said plurality of three-dimensional shape attributes is slope.

6. The system of claim 1 wherein one of said plurality of three-dimensional shape attributes is dog ears.

7. The system of claim 1 wherein one of said plurality of three-dimensional shape attributes is pump.

8. The system of claim 1 wherein said three-dimensional shape attributes include at least two of the following attributes: scoop, slope, dog ears, and pump.

9. The system of claim 1 wherein said three-dimensional shape attributes include at least three of the following attributes: scoop, slope, dog ears, and pump.

10. The system of claim 1 wherein said three-dimensional shape attributes include scoop, slope, dog ears, and pump.

11. The system of claim 1 wherein said three-dimensional shape attributes are characterized as numerical values that each indicate the extent to which the shape of said pad exhibits a said attribute.

12. The system of claim 1 further comprising a print condition processor that receives said three-dimensional shape attributes from said shape classifier and generates process control signals to change conditions of depositing solder pads based upon said three-dimensional shape attributes.

13. The system of claim 12 wherein said print condition processor is implemented by an inference engine.

14. The system of claim 12 wherein said inspection system further provides pad scan information to said print condition processor, and said print condition processor generates process control signals to change conditions of depositing pads based upon said pad scan information.

15. The system of claim 14 wherein said pad scan information comprises at least one of pad coverage, bridging, alignment and volume.

16. Apparatus for depositing pads of material in a desired pattern on the surface of a workpiece comprising
a workpiece carrier that moves a workpiece into and out of a pad deposition position,
a pad depositor that deposits said pattern of pads on said workpiece when said workpiece is in said pad deposition position,
an inspection system that determines pad height values at a plurality of locations across a pad that has been deposited on said workpiece, and
a shape classifier that receives said pad height values as inputs and outputs a plurality of three-dimensional shape attributes related to pad deposit conditions.

17. The apparatus of claim 16 further comprising a print condition processor that receives said three-dimensional shape attributes from said shape classifier and generates process control signals to change conditions of depositing pads by said pad depositor based upon said three-dimensional shape attributes.

18. The apparatus of claim 17 wherein said pad depositor includes
a stencil or screen having openings in said desired pattern,
a support structure supporting said stencil or screen, and
a squeegee and squeegee driver mounted on said support structure for movement across the upper surface of said stencil or screen.

19. The apparatus of claim 18 wherein said shape classifier implements a neural network with input nodes that receive said pad height values and output nodes that output said three-dimensional shape attributes.

20. The apparatus of claim 16 wherein said plurality of locations across said pad are grid points of an X–Y matrix on the surface of said workpiece.

21. The apparatus of claim 18 wherein one of said plurality of three-dimensional shape attributes is scoop.

22. The apparatus of claim 18 wherein one of said plurality of three-dimensional shape attributes is slope.

23. The apparatus of claim 18 wherein one of said plurality of three-dimensional shape attributes is dog ears.

24. The apparatus of claim 18 wherein one of said plurality of three-dimensional shape attributes is pump.

25. The apparatus of claim 18 wherein said three-dimensional shape attributes include at least two of the following attributes: scoop, slope, dog ears, and pump.

26. The apparatus of claim 18 wherein said three-dimensional shape attributes include at least three of the following attributes: scoop, slope, dog ears, and pump.

27. The apparatus of claim 18 wherein said three-dimensional shape attributes include scoop, slope, dog ears, and pump.

28. The apparatus of claim 18 wherein said three-dimensional shape attributes are characterized as numerical values that each indicate the extent to which the shape of said pad exhibits a said attribute.

29. The apparatus of claim 18 wherein said print condition processor is implemented by an inference engine.

30. The apparatus of claim 17 wherein said inspection system further provides pad scan information to said print condition processor, and said print condition processor generates process control signals to change conditions of depositing pads by said pad depositor based upon said pad scan information.

31. The apparatus of claim 30 wherein said pad scan information comprises at least one of pad coverage, bridging, alignment and volume.

32. The apparatus of claim 14 wherein said pad has a target volume value, and said pad scan information includes a sensed volume value for said pad.

33. The apparatus of claim 32 wherein, if said sensed volume value is high, and said print condition processor receives a shape attribute of mostly dog-ear, then said print condition processor generates a process control signal of increase squeegee pressure.

34. The apparatus of claim 32 wherein, if said sensed volume value is high, and said print condition processor receives a shape attribute of mostly pump, then said print condition processor generates a process control signal of increase viscosity.

35. The apparatus of claim 32 wherein, if said sensed volume value is low, and said print condition processor receives a shape attribute of mostly slope, then said print condition processor generates a process control signal of increase paste deposit and decrease viscosity.

36. The apparatus of claim 32 wherein, if said sensed volume value is low, and said print condition processor receives a shape attribute of mostly scoop, then said print condition processor generates a process control signal of decrease squeegee pressure.

37. A method for automatically monitoring pads of material deposited on a surface of a workpiece comprising inspecting a deposited pad of material, determining pad height values at a plurality of locations across said pad, and classifying said pad by a three-dimensional shape attribute related to pad deposit conditions.

38. A method for depositing pads of material in a desired pattern on the surface of a workpiece comprising moving a workpiece into and out of a pad deposition position, depositing said pattern of pads on said workpiece when said workpiece is in said pad deposition position, inspecting a pad that has been deposited on said workpiece, determining pad height values at a plurality of locations across said pad, and classifying said pad by a three-dimensional shape attribute related to pad deposit conditions.

\* \* \* \* \*